United States Patent [19]
Suzuki et al.

[11] Patent Number: 5,301,142
[45] Date of Patent: Apr. 5, 1994

[54] SEMICONDUCTOR MEMORY

[75] Inventors: Yukihide Suzuki; Masaya Muranaka, both of Akishima; Hiromi Matsuura, Tokorozawa; Yoshinobu Nakagome, Hamura; Hitoshi Tanaka, Tachikawa; Eiji Yamasaki, Fussa; Toshiyuki Sakuta, Ohme, all of Japan

[73] Assignees: Hitachi, Ltd., Tokyo; Hitachi VLSI Engineering Corp., Kodaira, both of Japan

[21] Appl. No.: 895,598

[22] Filed: Jun. 8, 1992

[30] Foreign Application Priority Data

Jun. 8, 1991 [JP] Japan ................. 3-163509

[51] Int. Cl.$^5$ .................................. G11C 13/00
[52] U.S. Cl. ............................ 365/51; 365/63; 365/201; 365/227
[58] Field of Search ............. 365/51, 189.01, 63, 365/227, 201, 230.01, 230.03

[56] References Cited
U.S. PATENT DOCUMENTS
4,658,377 4/1987 McElroy ............... 365/189.01

Primary Examiner—Terrell W. Fears
Attorney, Agent, or Firm—Antonelli, Terry, Stout & Kraus

[57] ABSTRACT

Each of a plurality of memory arrays is divided into a plurality of memory mats MAT00L-MAT07L to MAT10R-MAT17R in directions in which word lines and bit lines extend. First common data lines, that is, sub-IO lines, are provided which correspond to these memory mats and which are disposed in parallel to the word lines. Bit lines designating the corresponding memory mats are selectively connected to the first common data lines. Second common data lines, that is, main IO line groups MIOG0-MIOG7, are also provided and are disposed in parallel to the bit lines. Designated sub-IO lines are selectively connected to the second common data lines. Moreover, a plurality of main amplifiers forming a main amplifier unit MAU0 are orderly arranged in the direction in which the bit lines extend. These include a first main amplifier comprising a static current mirror amplifier which requires a relatively large operating current and a second main amplifier comprising a dynamic CMOS latch amplifier which requires only a relatively small operating current. These main amplifiers are put to proper use in conformity with the operating mode involved. By virtue of these arrangements, the number of parallel bits in a multibit parallel test mode of a dynamic RAM becomes expandable without being restricted by the number of the sub-IO lines correspondingly provided for each memory mat.

23 Claims, 36 Drawing Sheets

X128-BIT PARALLEL TEST MODE

X32/128-BIT PARALLEL TEST MODE SET CYCLE

SEMICONDUCTOR MEMORY

BACKGROUND OF THE INVENTION

The present invention relates to a semiconductor memory such as a large capacity dynamic RAM (Random Access Memory) provided with a multibit parallel test mode and to a technique especially effective in testing the function thereof.

With rapid progress in the use of large capacity dynamic RAMs, so-called multibit parallel testing (multibit testing) for use in simultaneously writing, reading, comparing and collating stored multibit data by gaining an access to a memory once has become defined by the JEDEC (Joint Electron Device Engineering Council) as means for increasing the efficiency of function testing. In such a dynamic RAM, a multibit parallel test mode is established when a WCBR (WE·CAS BEFORE RAS) cycle, for instance, is executed and the multibit parallel test mode is released when a CBR (CAS BEFORE RAS) or RAS only refresh cycle is executed. The WCBR cycle has already been referred to in U.S. Pat. No. 4,811,299.

The multibit parallel test mode, and the setting and resetting of that mode of the dynamic RAM or the like have also been described in the "Nikkei Micro Device," pp 53~62, for May, 1987, published by Nikkei MacGraw-Hill Co.

The number of parallel bits of stored data that can simultaneously be read, compared and collated in the above-mentioned conventional multibit parallel test mode is 8 for a 4 mega (1 mega means raising 2 to the 20th power) dynamic RAM and 16 for a 16 mega dynamic RAM, for instance. This signifies that while the storage capacity of the dynamic RAM is quadrupled, the number of parallel bits in the multibit parallel test mode is only doubled. This results in increasing the time required to test the functions of the larger dynamic RAM and the like.

SUMMARY OF THE INVENTION

If it is attempted to increase the number of parallel bits in the multibit test mode so as to deal with the foregoing problems, the number of common data lines (common IO lines) corresponding to respective memory mats will have to be increased because the number of memory mats activatable at a time is limited. In the case of a large capacity dynamic RAM in which a division of bit lines has been effected noticeably, an increase in the number of common data lines would simply increase the chip area of the dynamic RAM and impair any venture in cost reduction. In addition, there still arises a problem in that an increase in the number of sense amplifiers to be simultaneously activated raises the peak operating current value, thus increasing power consumption. The present inventors have clarified these problems under review.

A first object of the present invention is to provide a semiconductor memory such as a dynamic RAM wherein the number of parallel bits in a multibit parallel test mode is expandable without being restricted by the number of common data lines to be correspondingly provided for memory mats.

A second object of the present invention is to expand the number of parallel bits in the multibit parallel test mode of a dynamic RAM while restraining an increase in not only a chip area but also power consumption.

A third object of the present invention is to curtail the number of manhours for testing dynamic RAMs and the like while planning to increase operating speed, and to reduce cost and power consumption.

A fourth object of the present invention is to provide a memory structure fit for use in the multibit parallel test mode of a dynamic RAM or the like and a method of laying out the structure.

Of the inventions disclosed in the present application, what is representative will briefly be described first. A memory array is divided into a plurality of memory mats in directions in which word lines and bit lines are extended. Moreover, there are provided first and second common data lines. The bit lines disposed in parallel to the word lines and used to designate the memory mats are selectively connected to the first common data lines, and the first common data lines disposed and designated in parallel to the bit lines in common with the plurality of memory mats are selectively connected to the second common data lines. Further, there are provided a first main amplifier which is formed with a static current mirror amplifier and which needs a relatively large operating current, and a second main amplifier which is formed with a dynamic CMOS latch amplifier and which only needs a relatively small operating current, the selective use of these main amplifiers being dependent on the operating mode.

With the above-mentioned means, the number of parallel bits in the multibit parallel test mode can be set without being restricted by the number of first common data lines, that is, without increasing the number of first common data lines. Therefore, while an increase in not only a chip area but also power consumption is restrained, the number of parallel bits in the multibit parallel test mode of such as a dynamic RAM is expandable. As a result, it is possible to curtail the number of manhours for testing dynamic RAMs and the like while attempts are made to increase operating speed, and to reduce cost and power consumption.

DESCRIPTION OF THE PREFERRED EMBODIMENTS

Figure 1:
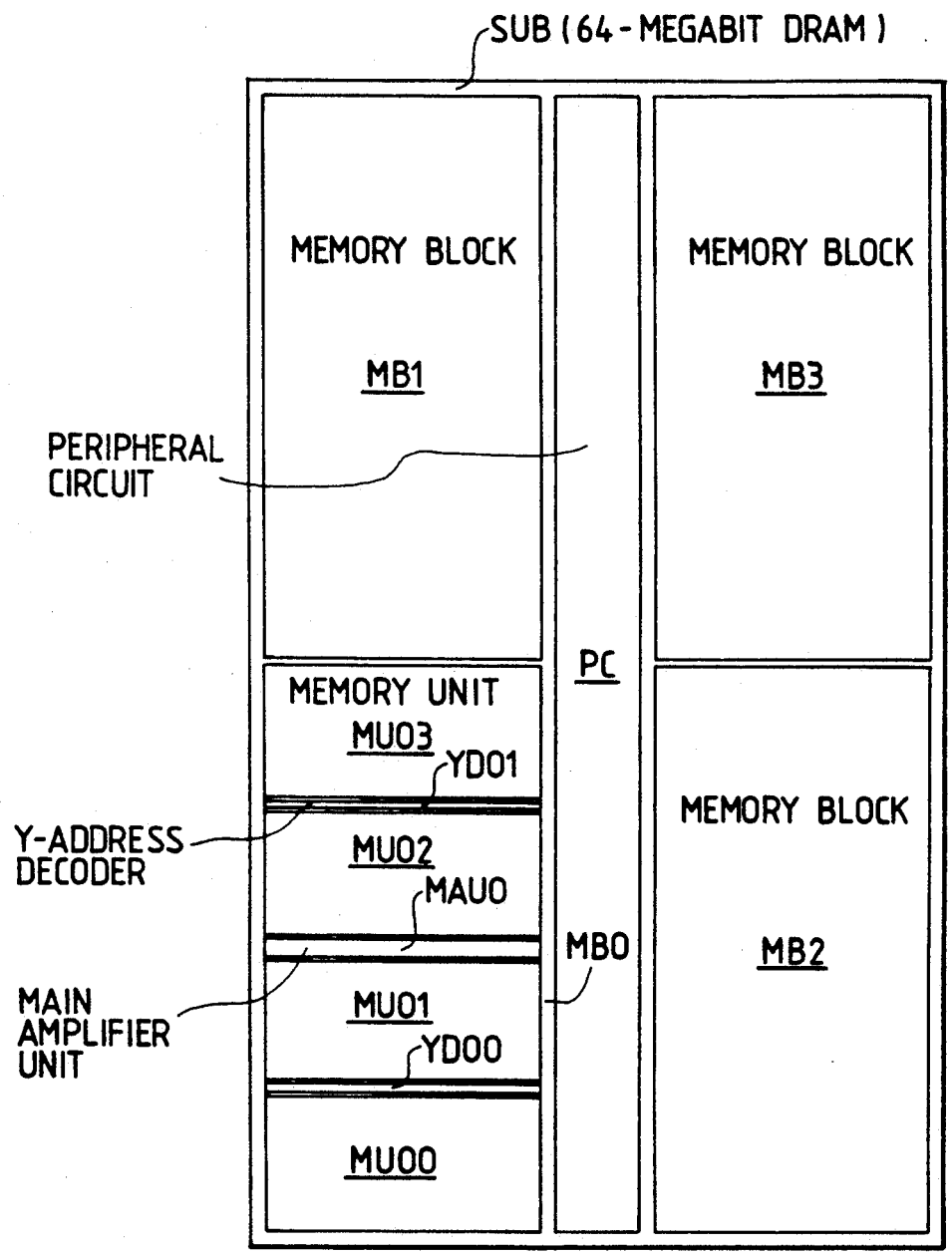
FIG. 1 is a layout drawing of a substrate of a 64 megabit dynamic RAM embodying the present invention.
Figure 2:
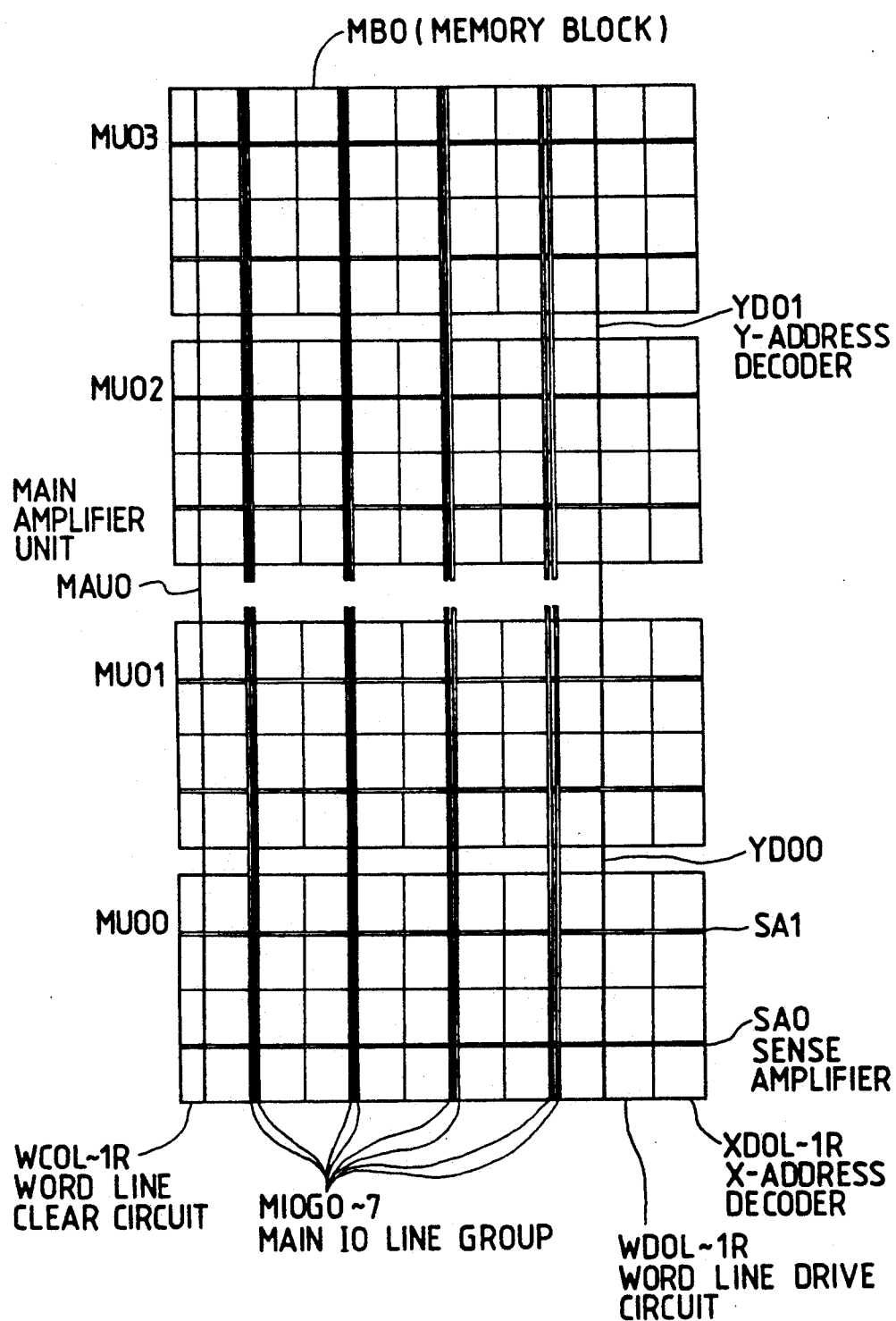
FIG. 2 is a layout drawing of a memory block in the dynamic RAM of FIG. 1.
Figure 3:
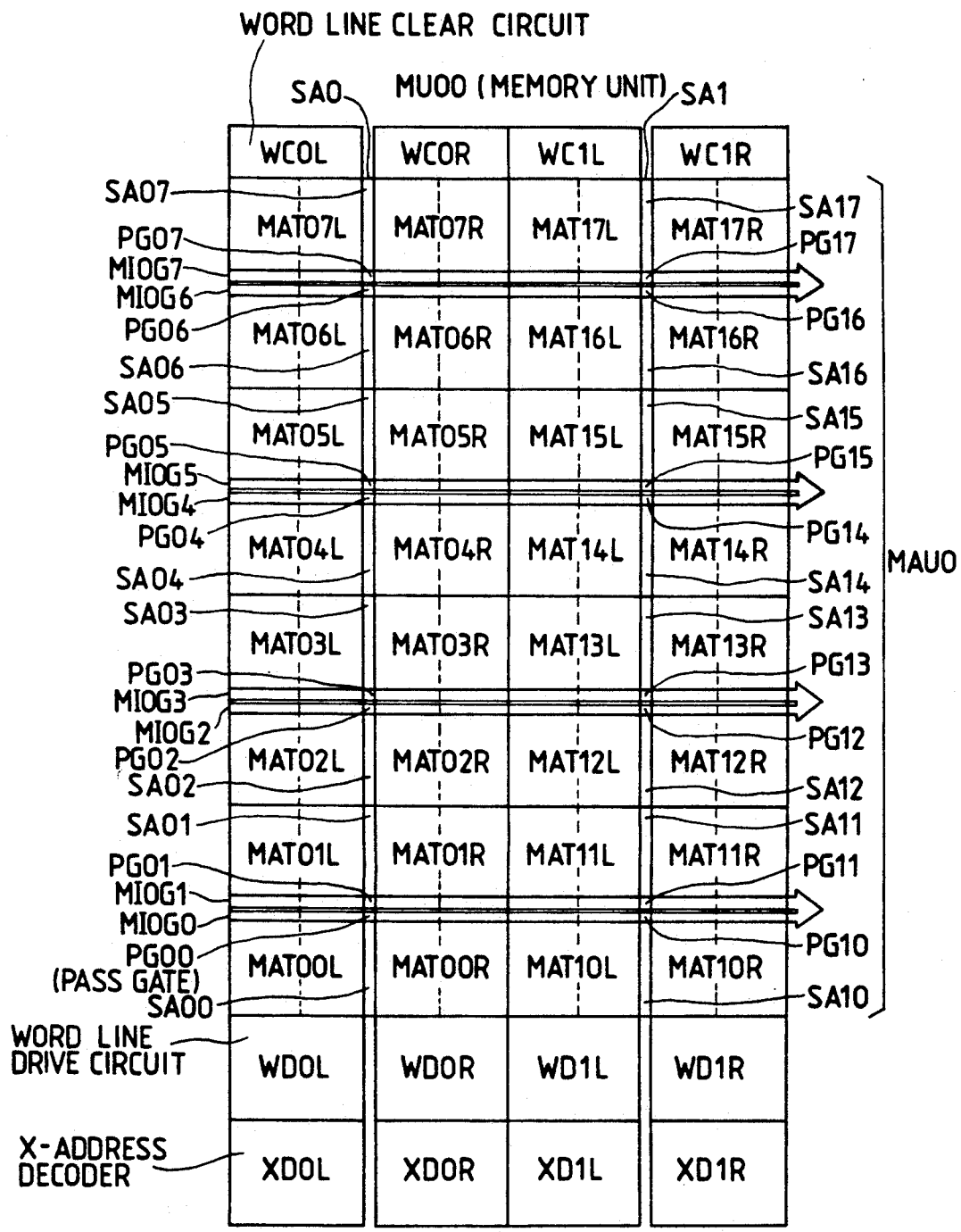
FIG. 3 is a layout drawing of a memory unit in the memory block of FIG. 2.
Figure 4:
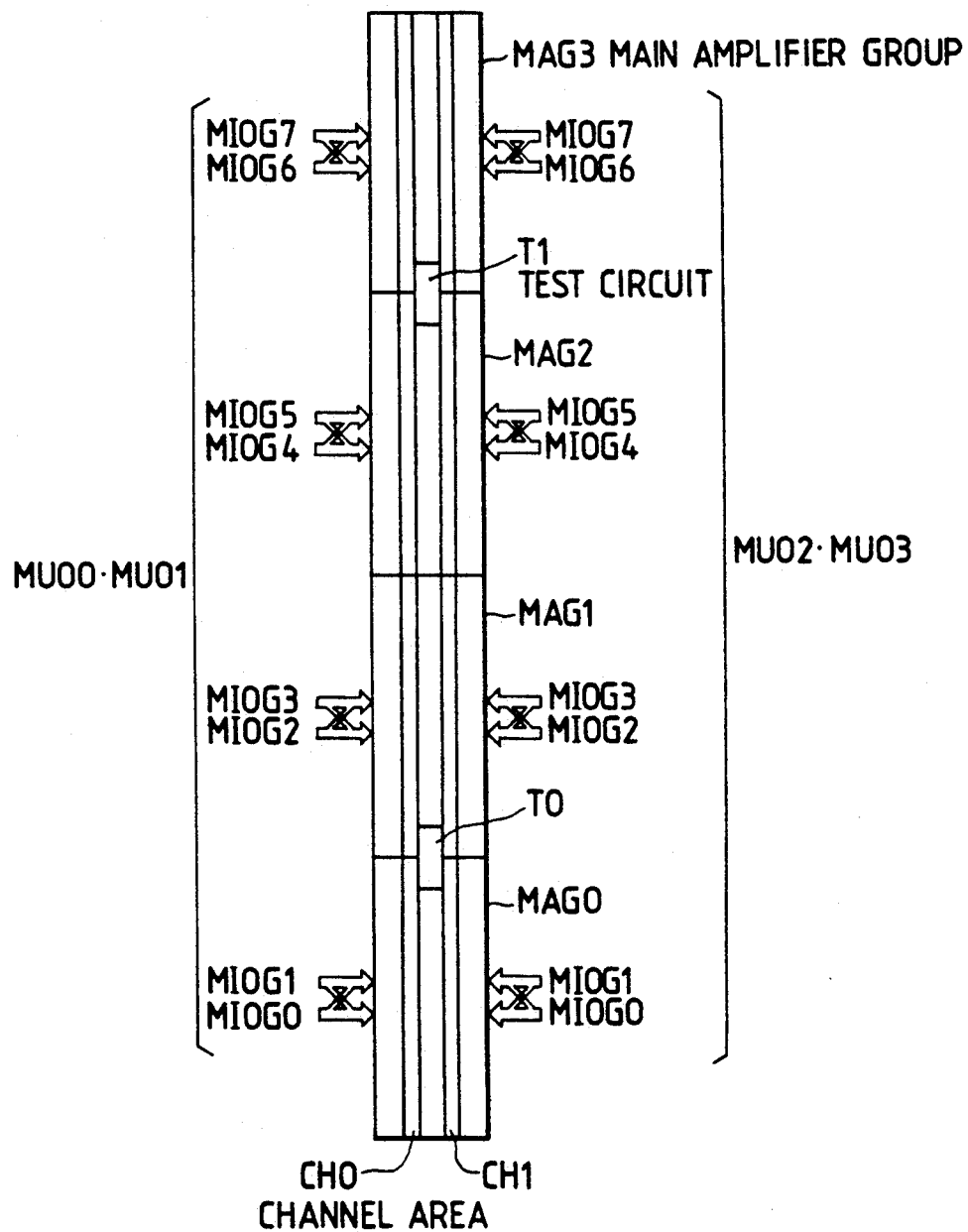
FIG. 4 is a layout drawing of a main amplifier unit in the memory block of FIG. 2.
Figure 5:
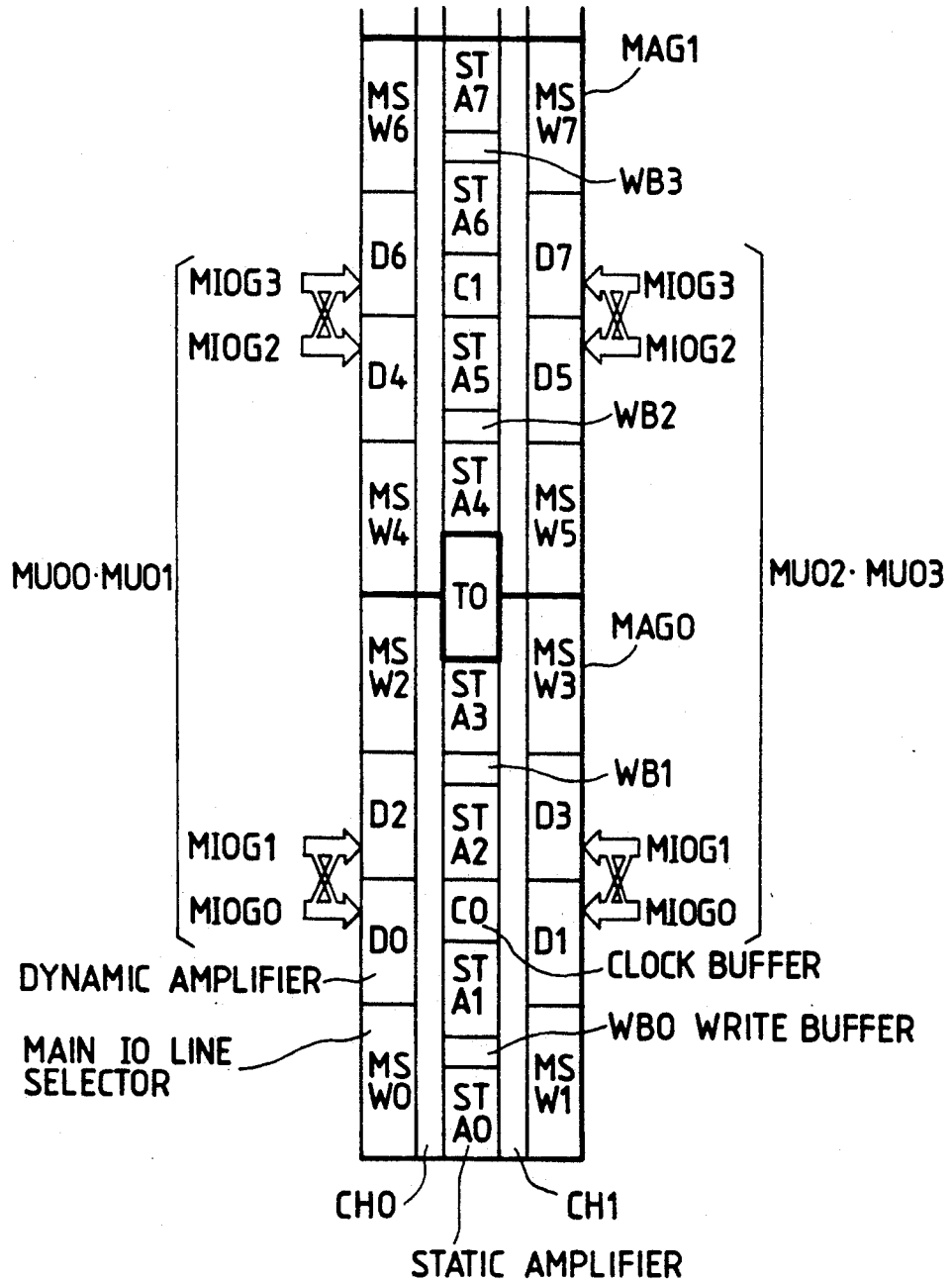
FIG. 5 is a partial enlarged layout drawing of the main amplifier unit of FIG. 4.
Figure 6:
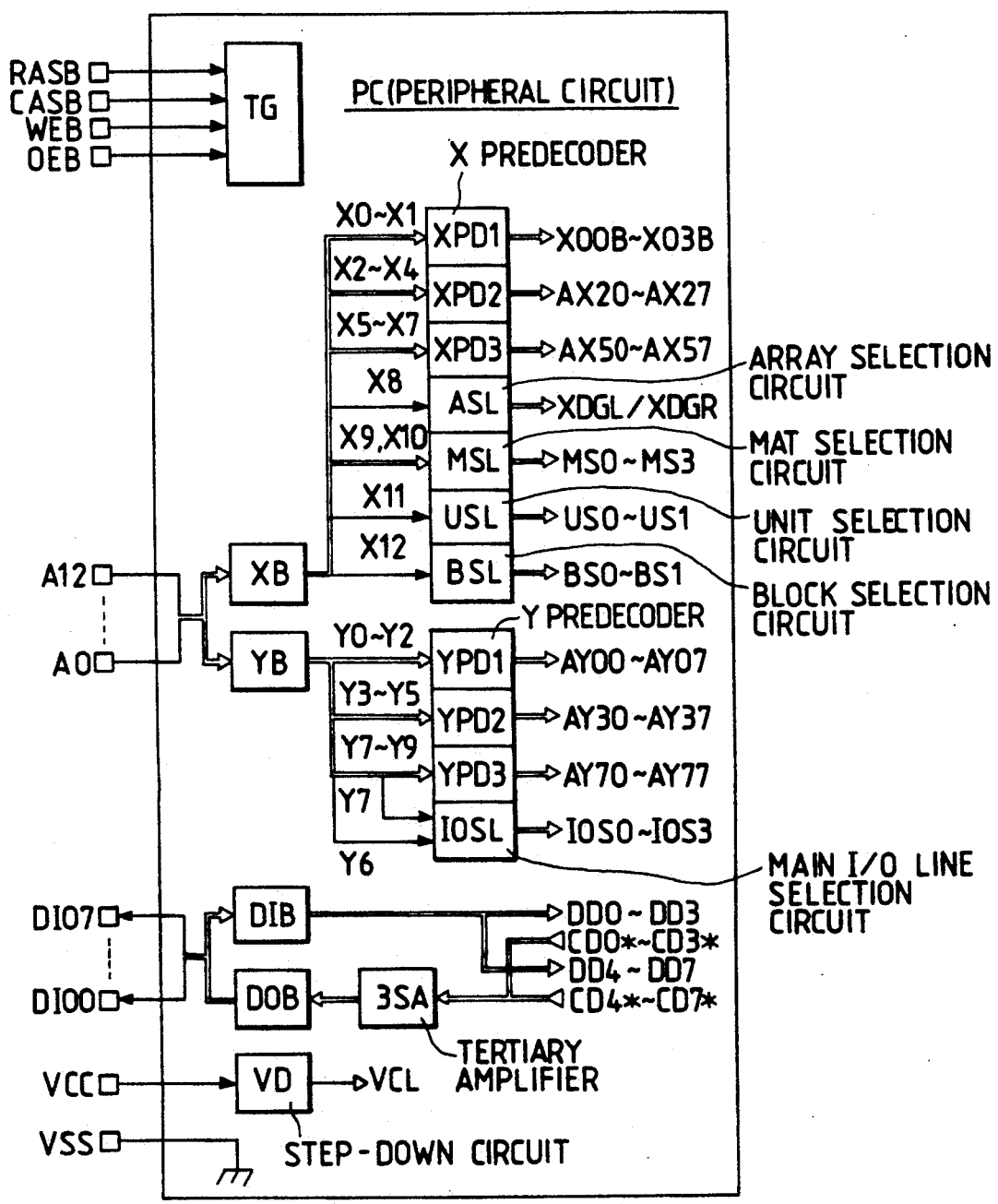
FIG. 6 is a block diagram of a peripheral circuit of the dynamic RAM of FIG. 1.

1. General description of dynamic RAM 1.1. Block configuration of dynamic RAM and layout of substrate FIG. 1 is a layout drawing of a substrate for a 64 mega dynamic RAM (DRAM) embodying the present invention. FIG. 2 is a layout drawing of a memory block MB0 in the dynamic RAM of FIG. 1. FIG. 3 is a layout drawing of a memory unit MU00 in the memory block MB0 of FIG. 2. FIG. 4 is a layout drawing of a main amplifier unit MAU0 in the dynamic RAM of FIG. 1. FIG. 5 is an enlarged layout drawing. In addition, FIG. 6 is a block diagram of a peripheral circuit PC in the dynamic RAM of FIG. 1. Referring to these drawings, a general description will subsequently be given of the block configuration of the dynamic RAM and the layout of a substrate and their features. In this layout drawing, any given positional relation on the surface of the semiconductor substrate where the dynamic RAM is formed corresponds to what represents positions intact with respect to top to bottom and left and right.

As shown in FIG. 1, the dynamic RAM of this embodiment is provided with four memory blocks (memory arrays) MB0-MB3 disposed in the form of □ on a p-type semiconductor substrate SUB of monocrystalline silicon with a peripheral circuit PC therebetween. Each of the memory blocks includes, as represented by a memory block MB0 of FIG. 2, four memory units MU00-MU03 or MU30-MU33, one main amplifier unit MAU0 or MAU3 disposed between the memory units MU01, MU02, and two Y-address decoders YD00-YD01 or YD30-YD31 respectively disposed between the memory units MD00 and MU01, and MU02, MU03.

Each of the four memory units constituting each memory block is, as represented by a memory unit MU00 of FIG. 3, provided with 16 memory mats MAT00L, MAT00R to MAT07L, MAT07R with a sense amplifier SA0 held therebetween and with 16 memory mats MAT10L, MAT10R to MAT17L, MAT17R with a sense amplifier SA1 held therebetween. In other words, each of the memory arrays, that is, each of the memory blocks MB0-MB3 in the dynamic RAM of this embodiment, is divided into 8 partitions in the direction in which word lines extend and 16 partitions in the direction in which bit lines extends, so that 128 memory mats in total are formed.

Each of the memory mats MAT00L-MAT07L and MAT10R-MAT17R constituting the memory units MU00-MU03 includes 512 parallel word lines in the perpendicular direction of FIG. 3 and 256 pairs of parallel complementary bit lines in the horizontal direction as will be described later. In other words, each of the memory mats includes substantially 512×256, that is, 131,072 dynamic memory cells disposed at the intersection points of word and complementary bit lines in the form of a grid. Therefore, each memory mat has a storage capacity of so-called 128K bits, each memory unit 4M bits and each memory block 16M bits, respectively. As a result, the dynamic RAM of this embodiment has a storage capacity of 64M bits. The number of memory cells to be connected to one word line in each memory unit is obviously 8 times 256, that is, 2,048.

The 512 word lines forming each memory mat are disposed in such a way as to skew, or pass through the corresponding 8 memory mats MAT00L-MAT07L, MAT00R-MAT07R, MAT10L-MAT17L, and MAT10R-MAT17R and are commonly possessed by these memory mats. At one end, the word lines are coupled to the ground potential of the circuit via word line clear MOSFETs corresponding to respective word line clear circuits WC0L, WC0R, WC1L and WC1R, whereas at the other end, they are coupled to unit circuits corresponding to respective word line drive circuits WD0L, WD0R, WD1L and WD1R. Predetermined word signal selection signals are supplied from corresponding X-address decoders XD0L, XD0R, XD1L or XD1R to these word drive circuits.

On the other hand, the sense amplifier SA0 includes 8 unit sense amplifiers SA00-SA07 correspondingly provided for the pair of memory mats MAT00L, MAT00R and MAT07L, MAT07R. The sense amplifier SA1 includes 8 unit sense amplifiers SA10-SA17 corresponding to the pair of memory mats MAT10L, MAT10R and MAT17L, MAT17R. Each of these unit sense amplifiers includes substantially 256 unit amplifier circuits correspondingly provided for each complementary bit line corresponding to the pair of memory mats and further includes four sets of sub-IO lines (first common data lines) SIO0*-SIO3* (in this case, a non-inverted sub-IO line SIO0 and an inverted sub-IO line SIO0B are, for instance, collectively represented by the sub-IO line SIO0* and the same will apply hereinafter) to which the four sets of unit amplifier circuits thus designated of a complementary input/output node, that is, the complementary bit lines are selectively connected.

The four sets of sub-IO lines SIO0*-SIO3* correspondingly provided for each unit sense amplifier of the amplifiers SA0 and SA1 are selectively connected to four sets of main IO lines (second common data lines) MIO0*-MIO3* constituting the corresponding main IO line groups MIOG0-MIOG7 via path gates PG00-PG07 or PG10-PG17 and selectively connected further to the main amplifiers corresponding to the main amplifier units MAU0-MAU3 via these respective main IO lines. In this embodiment, the main IO line groups MIOG0-MIOG7 are commonly possessed by the 8 memory mats constituting the two memory units MU00, MU01 or MU02, MU03, the two memory units being disposed on the right- or left-hand side of each main amplifier unit. The path gates corresponding to these main IO line groups are, for reasons described later, laid out on the side biased to the two memory mats adjacent to the direction in which the word lines extend.

Each of the main amplifier units MAU0-MAU3 is, as represented by the main amplifier unit MAU0 of FIG. 4, provided with four main amplifier groups MAG0-MAG3 correspondingly provided for the main IO line groups MIOG0, MIOG1 and MIOG6, MIOG7. Each of these main amplifier groups, as represented by the main amplifier group MAG0 of FIG. 5, includes four main IO line selectors MSW0-MSW3, four static amplifiers (a first amplifier circuit) STA0-STA3, four dynamic amplifiers D0-D3, two write buffers WB0-WB1, one clock buffer C0 and the like.

The input terminals of the static amplifiers STA0, STA1 are, as will be described later, selectively connected to any two out of 8 sets of main IO lines in total constituting the main IO line groups MIOG0, MIOG1 on the side of the memory units MU00, MU01 via the corresponding main IO line selector MSW0 or MSW1 while the dynamic RAM is in a normal read mode or a ×32-bit parallel test mode. The input terminals of the static amplifiers STA2, STA3 are, as will be described later, also selectively connected to any two out of 8 sets of main IO lines in total constituting the main IO line groups MIOG0, MIOG1 on the side of the memory units MU02, MU03 via the corresponding main IO line selector MSW1 or MSW3 while the dynamic RAM is in the normal read mode or the ×32-bit parallel test mode. The static amplifiers STA0-STA3 amplify read signals output from four memory cells in total with the memory units MU00-MU03 thus selected via the corresponding sub-IO lines and the main IO lines up to a predetermined level. The output signals of these static amplifiers are transmitted to a tertiary amplifier 3SA, as will be described later, via common data buses CD0*-CD3* disposed in a channel region CH0 or CH1 and to a test circuit T0, as will be described later, in the ×32-bit parallel mode. The static amplifiers STA0-STA3 need a relatively large operating current and the amplifying operation is performed at high speed.

On the other hand, the dynamic amplifiers D0-D3, as will be described later, include four unit D type latch amplifiers (a second amplifier circuit) and the input terminals of the unit D type latch amplifiers are respectively coupled to the four sets of main IO lines constituting the corresponding main IO line groups MIOG0 or MIOG1. While the dynamic RAM is in the ×128-bit parallel test mode, the dynamic amplifiers D0-D3 amplify read signals output from the 16 memory cells in total with the memory units MU00-MU03 thus selected via the corresponding sub-IO lines and the main IO lines and transmit the amplified signals to the test circuit T0. In the dynamic RAM of this embodiment, each of the unit D type latch amplifiers constituting the dynamic amplifiers D0-D3 includes a so-called open-drain output MOSFET and its output terminal makes wired OR by so-called wired logic. Moreover, each unit D type latch amplifier can be operated at a relatively small current, whereby the power consumption of the dynamic RAM in the ×128-bit parallel test mode is cut down.

As set forth above, the main amplifiers, that is, the static amplifiers, the dynamic amplifiers and the like corresponding to the respective main IO lines are consequently lined up in the direction in which the word lines extend since the main IO lines are disposed in parallel to the bit lines in this embodiment. For this reason, the designing of laying out the main amplifiers is comparatively readily implemented, despite the fact that a relatively large number of main IO lines and main amplifiers are provided in the dynamic RAM of this embodiment and as they are simply disposed in the central part of the semiconductor substrate SUB, that is, in the neighborhood of the peripheral circuit PC, the layout design is attainable with efficiency.

Each of the main amplifier units MAU0-MAU3 is provided with two test circuits T0, T1 commonly provided for the pair of main amplifier groups MAG0, MAG1 and MAG2, MAG3, respectively. These test circuits receive, as will be described later, output signals of the 8 corresponding static amplifiers STA0-STA7 or 8 dynamic amplifiers D0-D7 in total while the dynamic RAM is in the ×32-bit or ×128-bit parallel test mode and performs the operation of comparing and collating read data. The result of comparing and collating the read data that has been obtained from the test circuits T0-T1 are transmitted to the tertiary amplifier 3SA via the common data buses CD0*-CD3* disposed in the channel region CH0 or CH1 before being sent out of the dynamic RAM via a data output buffer DOB.

The peripheral circuit PC includes, as shown in FIG. 6, a plurality of bonding pads coupled to external input or output terminals, a timing generating circuit TG coupled to the bonding pads corresponding to the input or output terminals, an X-address buffer XB, a Y-address buffer YB, a data input buffer DIB, and a data output buffer DOB. Of these parts, the timing generating circuit TG receives a row address strobe signal RASB, a column address strobe signal CASB, a write enable signal WE and an output enable signal OEB which are input as start control signals via external terminals RASB, CASB, WEB and OEB and while forming various kinds of internal control signals, supplies these signals to the respective parts of the dynamic RAM. The timing generating circuit TG also functions as what discriminates between the operation modes of the dynamic RAM, using the combination of logical levels of the start control signals and the predetermined input signals. The dynamic RAM in this embodiment is of a so-called LOC (Lead On Chip) package type and the bonding pads are linearly arranged in the central part of the peripheral circuit PC.

The X-address buffer XB fetches and holds 13-bit X-address signals X0–X12 supplied on a time sharing basis via external terminals A0–A12 according to internal control signals (not shown) and forms predetermined internal address signals X0–X12 on the basis of these X-address signals. The lower 2-bit internal address signals X0, X1 out of those address signals are supplied to an X-predecoder XPD1, so that word line selection timing signals X00B–X03B are alternatively formed accordingly. Moreover, internal address signals X2–X7 are respectively supplied on a 3-bit basis to X-predecoders XPD2, XPD3 and prodecorded signals AX2-0–AX27, AX50–AX57 are alternatively formed accordingly.

Further, the internal address signal X8 is supplied to an array selection circuit ASL and an internal control signal XDGL or XDGR for selectively activating the left or right half of each memory mat is alternatively formed accordingly. Moreover, the secondly 2-bit lower internal address signals X9, X10 are supplied to a mat selection circuit MSL and mat selection signals MS0–MS3 for selectively activating 8 memory mats MAT00L–MAT07L, MAT00R–MAT07R, MAT1-0L–MAT17L or MAT10R–MAT17R in each memory unit at a time are alternatively formed accordingly. The internal address signal X11 is supplied to a unit selection circuit USL and unit selection signals US0–US1 for selectively activating the four memory units MU0-0–MU03 constituting each memory block are alternatively formed accordingly. The internal address signal X12 is supplied to a block selection circuit BSL and block selection signals BS0–BS1 for selectively activating the memory blocks MB0–MB3 are alternatively formed accordingly.

On the other hand, the Y-address buffer YB fetches and holds 10-bit Y-address signals Y0–Y9 supplied on a time sharing basis via external terminals A0–A9 according to internal control signals (not shown) and forms predetermined internal address signals Y0–Y9 on the basis of these Y-address signals. The lower 6-bit internal address signals Y0, Y2 and Y3–Y5 out of those address signals are supplied to a Y-predecoders YPD1, YPD2 with three bits at a time, so that predecoded signals AY00–AY07 and AY30–AY37 are alternatively formed. Moreover, the following 3-bit internal address signals Y7–Y9 with the omission of the internal address signal Y6 are supplied to a Y-predecoder YPD3 and predecoded signals AY70–AY77 are alternatively formed accordingly. Further, the remaining 1-bit internal address signal Y6 and the internal address signal Y7 are supplied to an IO line selection circuit IOSL and IO line selection signals IOS0–IOS3 for selectively connecting corresponding four sets of main IO lines and two static amplifiers are alternatively formed accordingly.

The data input buffer DIB retrieves 8-bit write data supplied via data input/output terminals DIO0–DIO7 and transmits the data via the write buffer WB0–WB1 of the main amplifier units MAU0–MAU3. On the other hand, read data or the result of comparison and collation output from the static amplifiers STA0–STAE of the main amplifier units MAU0–MAU3 or the test circuits T0–T1 via common data buses CD0*–CD7* is amplified by the unit circuits corresponding to the tertiary amplifier 3SA before being sent out of the dynamic RAM from the unit circuits corresponding to the data output buffer DOB via the data input/output terminals DIO0–DIO7.

The peripheral circuit PC is further equipped with a voltage step-down circuit VD. The voltage step-down circuit VD forms a predetermined internal power supply voltage VCL of +2.2 V, for instance, on the basis of an external power supply voltage VCC of +3.3 V, for instance, supplied via an external terminal VCC and as an operating power supply, supplies the voltage to each part of the dynamic RAM.

1.2. Selection method and address allocation in dynamic RAM

Figure 7:
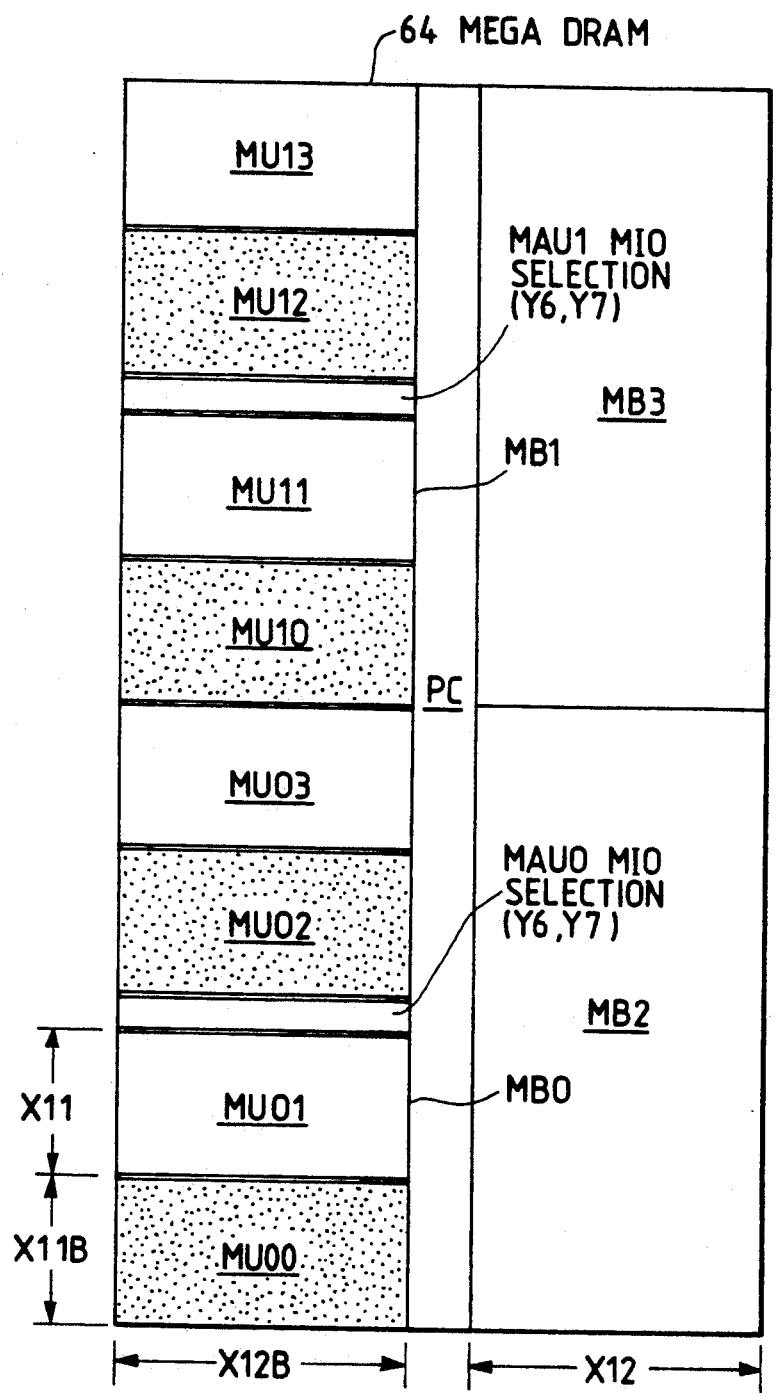
FIG. 7 illustrates an address allocation in the dynamic RAM of FIG. 1.
Figure 8:
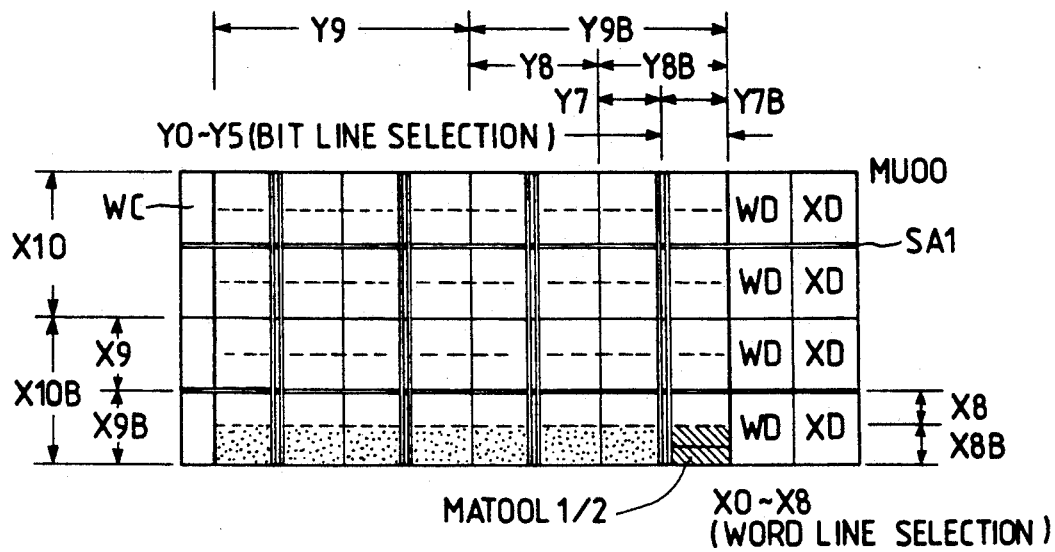
FIG. 8 illustrates a partial address allocation in a normal read or write mode of the dynamic RAM of FIG. 1.
Figure 9:
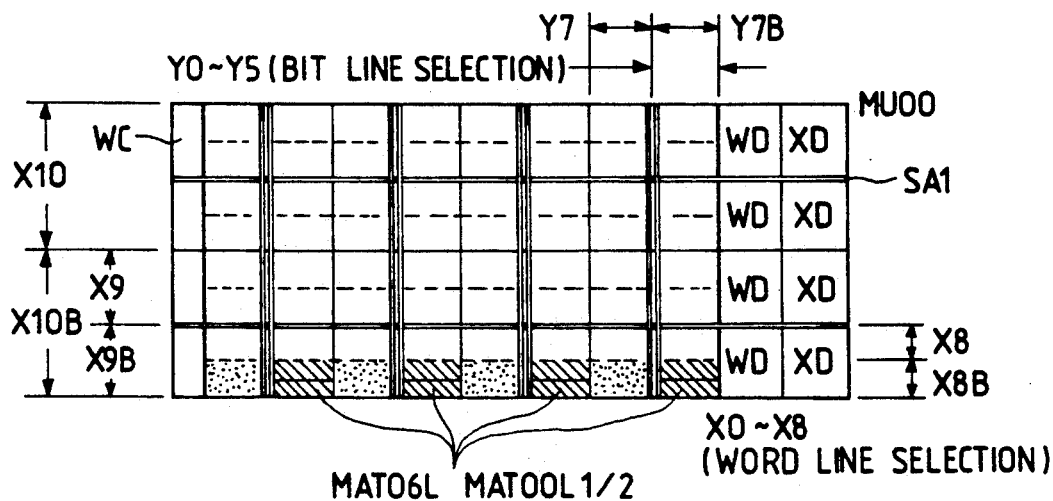
FIG. 9 illustrates a partial address allocation in a ×32-bit parallel test mode of the dynamic RAM of FIG. 1.
Figure 10:
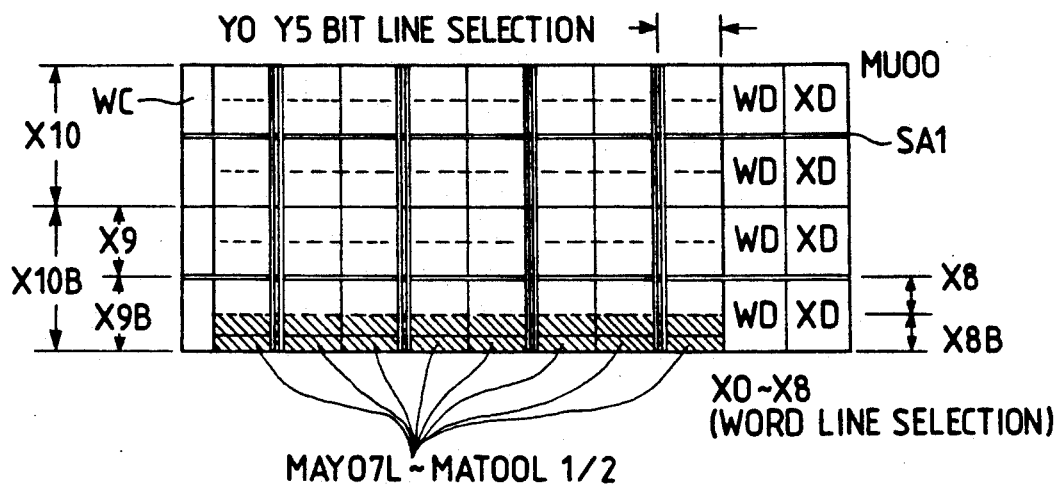
FIG. 10 illustrates a partial address allocation in a ×128-bit parallel test mode of the dynamic RAM of FIG. 1.

FIG. 7 illustrates an address allocation in the dynamic RAM of FIG. 1 in this embodiment. FIG. 8 illustrates an address allocation in a normal read or write mode of the memory unit MU00 in the dynamic RAM of FIG. 1. FIGS. 9 and 10 illustrate address allocations in ×32-bit and ×128-bit-parallel test modes of the dynamic RAM of FIG. 1, respectively. Referring to these drawings, a description will subsequently be given of the outline and features of selection methods and address allocations in the dynamic RAM in this embodiment.

In the dynamic RAM of this embodiment, each of the memory blocks MB0–MB3 has a storage capacity of 16M bits, whereas each of the memory units MU0-0–MU03 constituting each memory block has a storage capacity of 4M bits. Moreover, the groups of 32 memory mats MAT00L–MAT07L, MAT00R–MAT07R, MAT10L–MA17L and MAT10R–MAT17R respectively have a capacity of 128K bits. On the other hand, the dynamic RAM is provided with the 8 data input/output terminals DIO0–DIO7 and is of a so-called 8 bit construction. As a result, the dynamic RAM is said to be of an 8 bits×8M word address construction and totally requires a 23-bit address signal to designate alternatively the address space.

In this embodiment, the dynamic RAM employs a so-called 8K refresh system in which the refresh operation relative to all the memory cells is terminated by repeating the operation 8,192 times and the number of memory cells in a selective state at an memory access once is $\frac{1}{8}$, 192 of 64M bits, that is, 8,192. On the other hand, the number of memory cells coupled to one word line is, as described above, substantially 2,048. However, four word lines simultaneously function in that selective state at the memory access once, irrespective of the operation mode and out of the 8,192 memory cells in total coupled to the word line thus selected, 8 memory cells are set functional in the selective state simultaneously and selectively in the normal mode. Consequently, the address of the 8M word in the dynamic RAM can be designated by 13-bit X-address signals X0–X12 and 10-bit Y-address signals Y0–Y9.

The selection of the address space of the dynamic RAM by the 13-bit X-address signals X0–X12 and the 10-bit Y-address signals Y0–Y9 is made as follows. In the dynamic RAM of this embodiment, two MB0, MB1 or MB2, MB3 out of the four memory blocks are selectively activated first according to the most significant bit X-address signal X12 and subsequently four MU00, MU02 and MU10, MU12 out of the 8 memory units in total included in the two memory blocks thus selected are selectively activated according to the secondly significant bit X-address signal.

When the dynamic RAM is subsequently set functional the normal read or write mode, the memory mats MAT00L–MAT07L, MAT00R–MAT07R, MAT10L–MAT17L or MAT10R–MAT17R in the memory unit MU00 thus activated are selected according to the X-address signals X9, X10 as shown in FIG. 8, whereas according to the X-address signal X8, the X-address decoder XD and the only the left-hand or right-hand half the word line drive circuit WD are activated. According to the 6-bit Y-address signals Y0–Y5 and the 3-bit Y-address signals Y7–Y9, moreover, only the bit line selection signal relative to the memory mat MAT00L is selectively formed and the corresponding read system circuit is activated. At this time, the main IO line selectors MSWO–MSWE, the static amplifiers STAO–STAE and the write buffers WB0–WB7 in the main amplifiers MAU0, MAU1 are selectively held in the operating condition according to the Y-address signals Y8, Y9. In addition, as shown in FIG. 7, the operation of selecting the main IO line is performed according to the Y-address signals Y6, Y7 and 8 sets of main IO lines, that is, two sets each out of the main IO line groups with the memory units MU00, MU02 and MU10, MU12 thus selected, are selected and connected to the corresponding static amplifiers.

While the dynamic RAM is in the ×32-bit parallel test mode, on the other hand, the memory mats MAT00L–MAT07L, MAT00R–MAT07R, MAT10L–MAT17L or MAT10R–MAT17R in the memory unit MU00 thus activated are selected according to the X-address signals X9, X10 as shown in FIG. 9, whereas according to the X-address signal X8, the X-address decoder XD and the only the left-hand or right-hand half the word line drive circuit WD are activated. Moreover, the bit line selection signals relative to the four memory mats MAT00L, MAT02L, MAT04L and MAT06L are simulataneously formed according to the Y-address signals Y0–Y5 and the Y-address signal Y7 and the corresponding read system circuit is activated. At this time, the operation of selecting the main IO line in the main amplifier units MAU0, MAU1 is performed according to the Y-address signals Y6, Y7. In addition, 32 sets of main IO lines in total, that is, two sets each out of the 16 sets of the main IO line groups in total with the memory units MU00, MU02 and MU10, MU12 thus selected, are selected and connected to the corresponding static amplifiers.

While the dynamic RAM is in the ×128-bit parallel test mode, the memory mats MAT00L–MAT07L, MAT00R–MAT07R, MAT10L–MAT17L or MAT10R–MAT17R in the memory unit MU00 thus activated are selected according to the X-address signals X9, X10 as shown in FIG. 10, whereas according to the X-address signal X8, the X-address decoder XD and the only the left-hand or right-hand half the word line drive circuit WD are activated. At this time, the operation of selecting the main IO line in the main amplifiers MAU0, MAU1 is not performed and the 128 sets of main IO lines in the memory units MU00, MU02 and MU10, MU12 are connected to the test circuit T0 or T1 via the 128 unit D type latch amplifiers in total corresponding to the 32 dynamic amplifiers.

1.3. Multibit parallel test mode

The dynamic RAM of this embodiment is provided with two multibit parallel test modes which aim at having function tests made efficiently; namely, a ×32-bit parallel test mode (a first multibit parallel test mode) and a ×128-bit parallel test mode (a second multibit test mode). The ×32-bit parallel test mode is designed to place 8 memory cells, out of the four memory units simultaneously activated, in the selective state and 32-bit data read from these memory cells are compared and collated by the four test circuits on an 8-bit basis, whereas the ×128-bit parallel test mode is designed to place 32 memory cells, out of the four memory units simultaneously activated, in the selective state and 128-bit data read from these memory cells are compared and collated by the four test circuits on a 32-bit basis.

Figure 11:
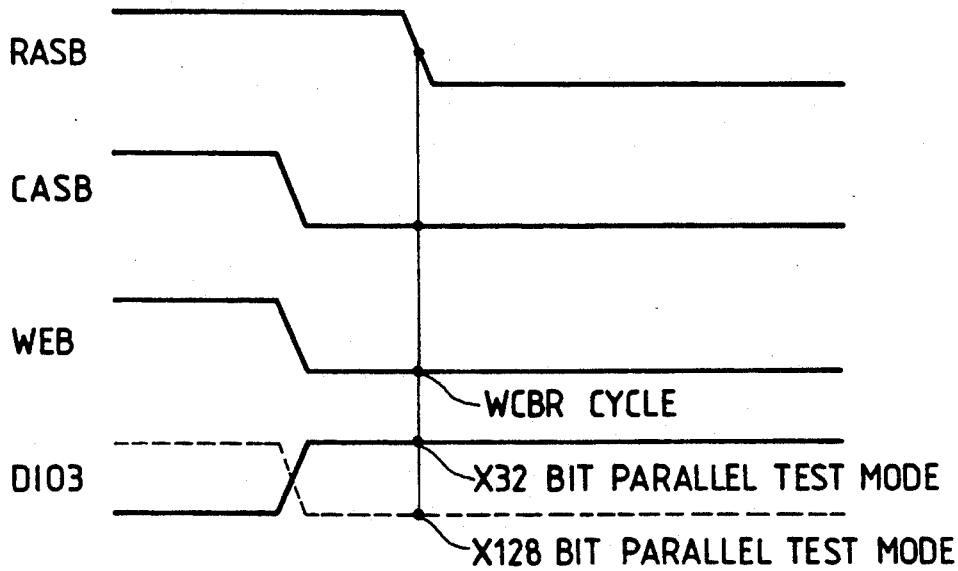
FIG. 11 is a timing chart in the set cycle of the ×32-bit or ×128-bit parallel test mode of dynamic RAM of FIG. 1.

As shown in FIG. 11, the dynamic RAM of this embodiment is said to be in a multibit parallel test mode set cycle when a so-called WCBR cycle is executed, the column address strobe signal CASB and the write enable signal WEB being set at low levels earlier than the row address strobe signal RASB. Either ×32- or ×128-bit parallel test mode is selectively designated in accordance with the logic level of the data input/output terminal DIO3 at the leading edge of the row address strobe signal RASB. After the set cycle is executed, the dynamic RAM becomes functional in the test mode and 32- or 128-bit units are written and read and further the read data are compared and collated.

The result of comparing and collating the read data in the ×32- or ×128-bit parallel test mode is, as will be described later, output from the two data input/output terminals DIO0–DIO1, DIO2–DIO3, DIO4–DIO5 and DIO6–DIO7 with the same contents per test circuit and changed into so-called ternary signals. In other words, a high level is applied to these data input/output terminals when the 8- or 32-bit read data resulting from the comparison and collation made in each test circuit coincide with the total bit logic "1," whereas when the data coincide with the total bit logic "0," a low level is applied thereto. When the logical levels of the read data differ by even one bit, the corresponding two data input/output terminals are set operational in a high impedance state.

The dynamic RAM is released from the test mode when there is executed a so-called CBR or RAS only refresh cycle in which the column address strobe signal CASB is set at low levels earlier than the row address strobe signal RASB and returns to the normal operating mode.

2. Specific construction and features of each part of dynamic RAM

Figure 12:
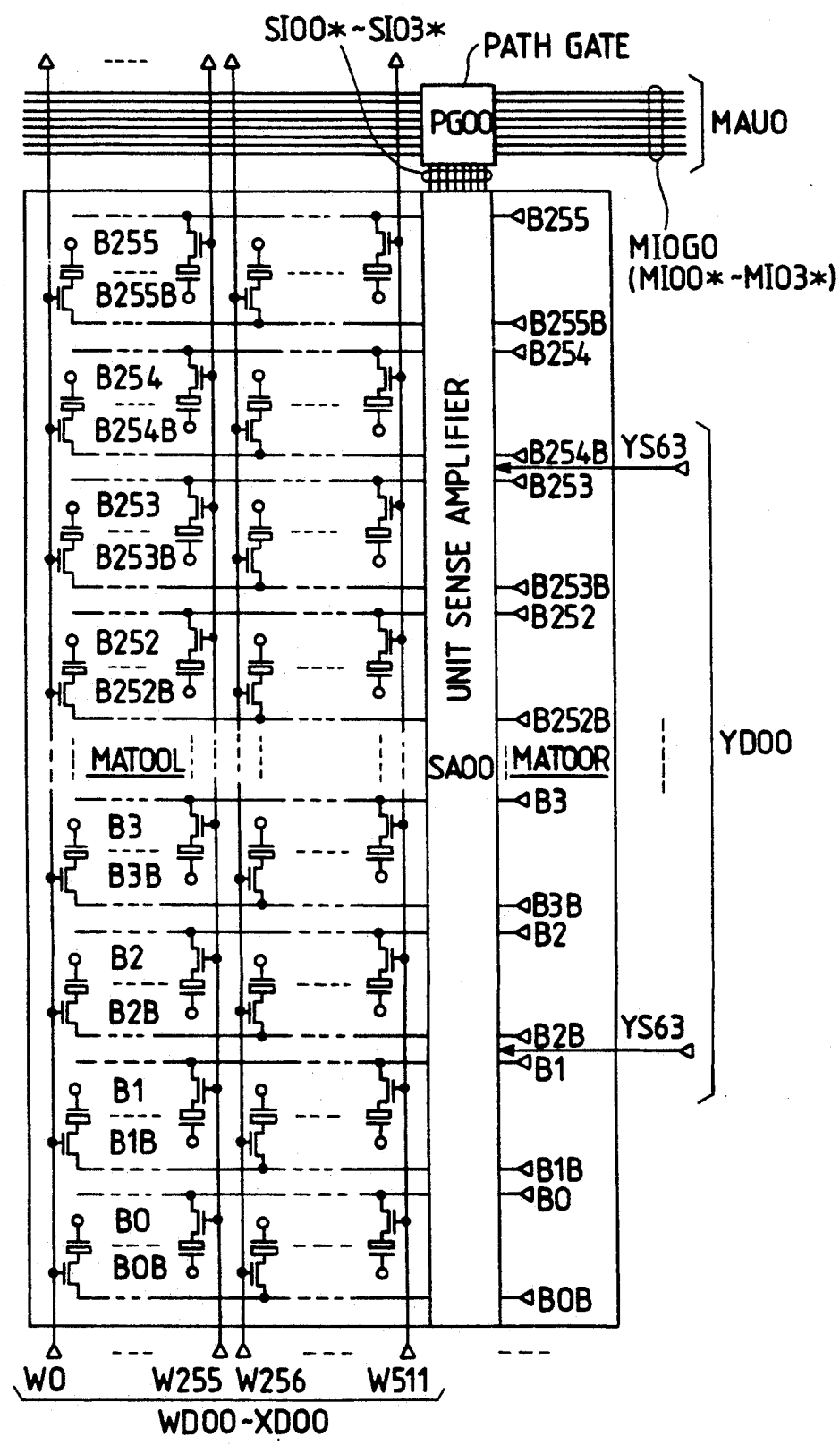
FIG. 12 is a partial circuit diagram of the memory mat in the memory unit of FIG. 3.
Figure 13:
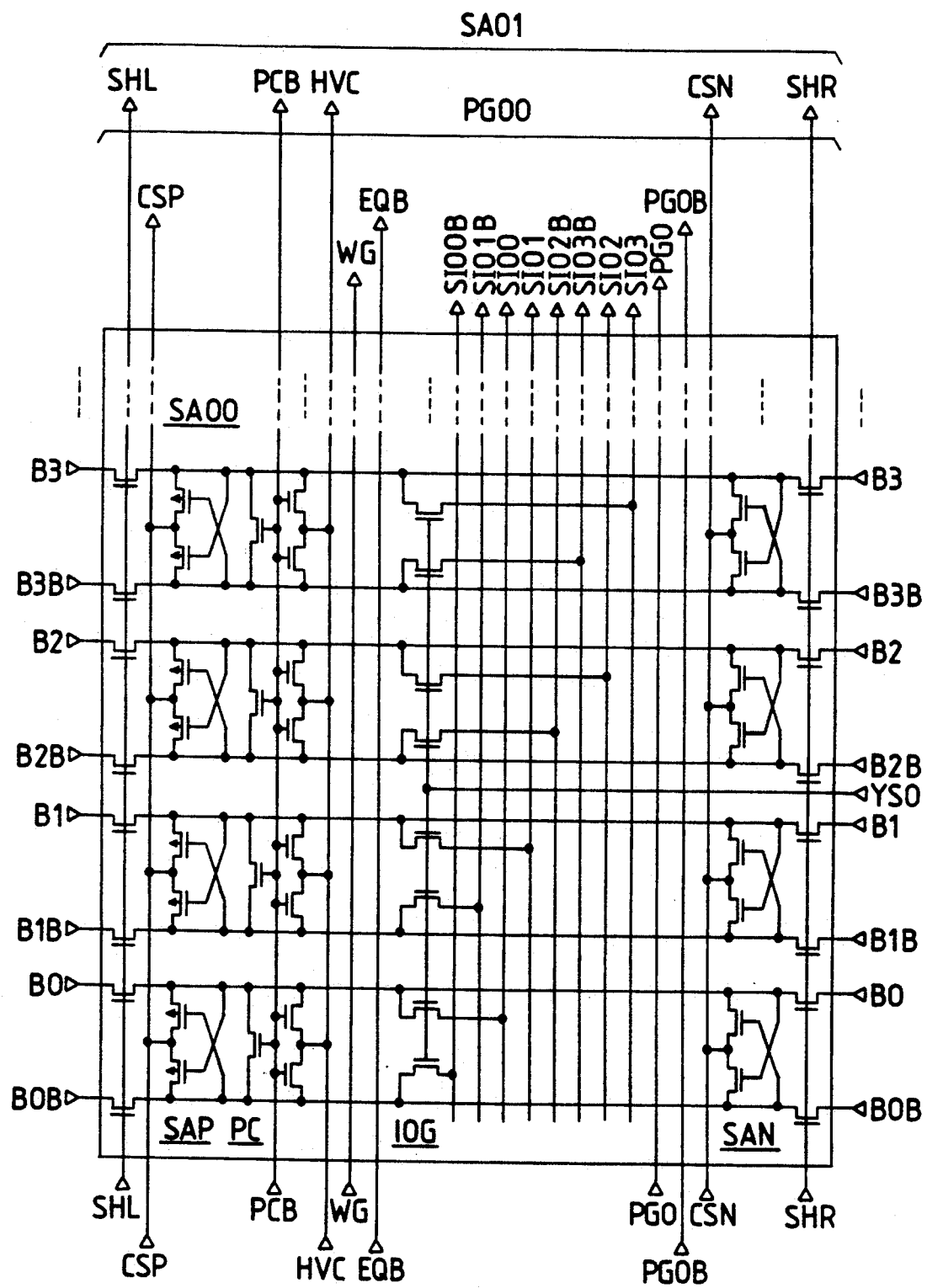
FIG. 13 is a partial circuit diagram of the sense amplifier in the memory unit of FIG. 3.
Figure 14:
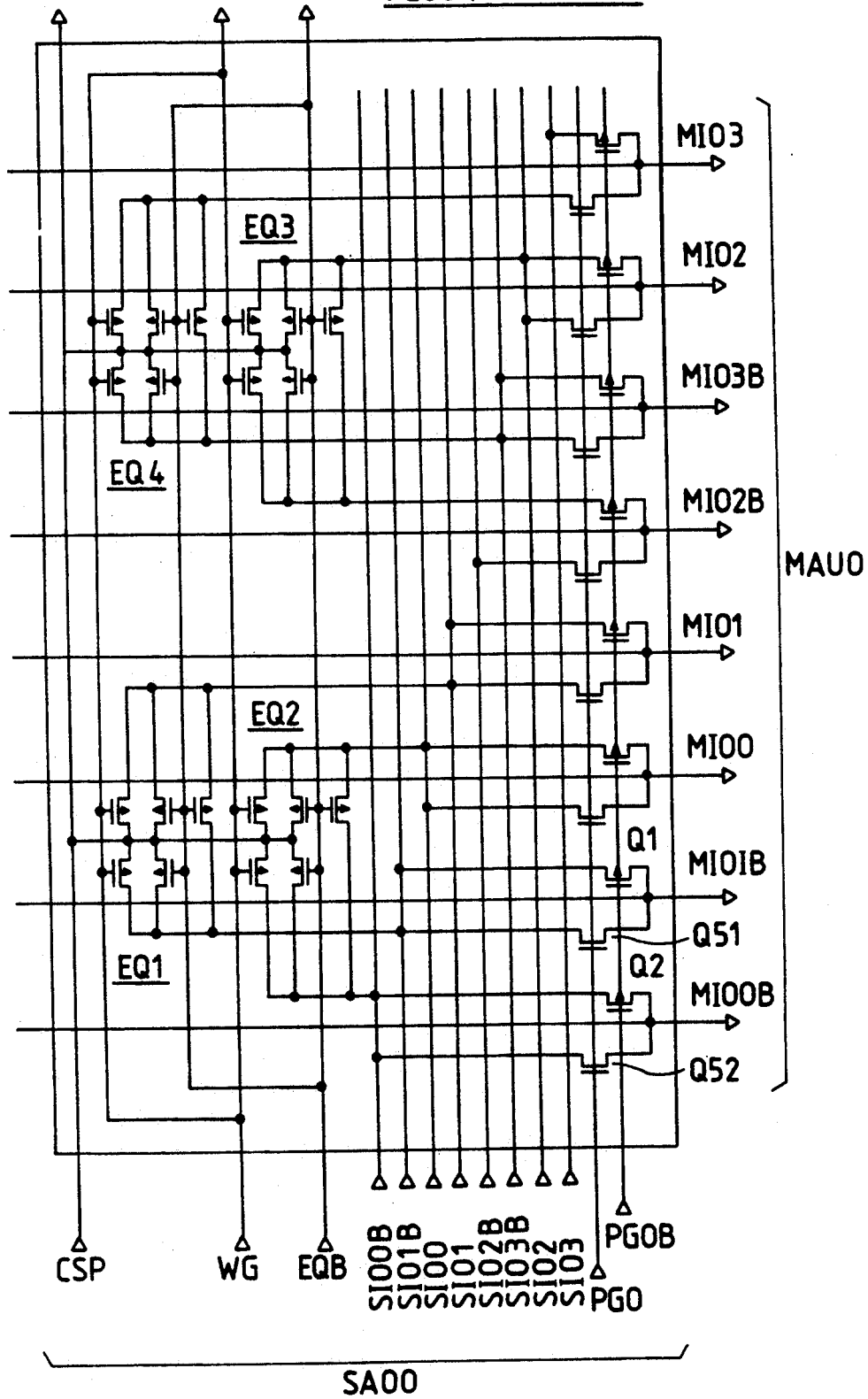
FIG. 14 a partial circuit diagram of a path gate in the memory unit of FIG. 3.
Figure 15:
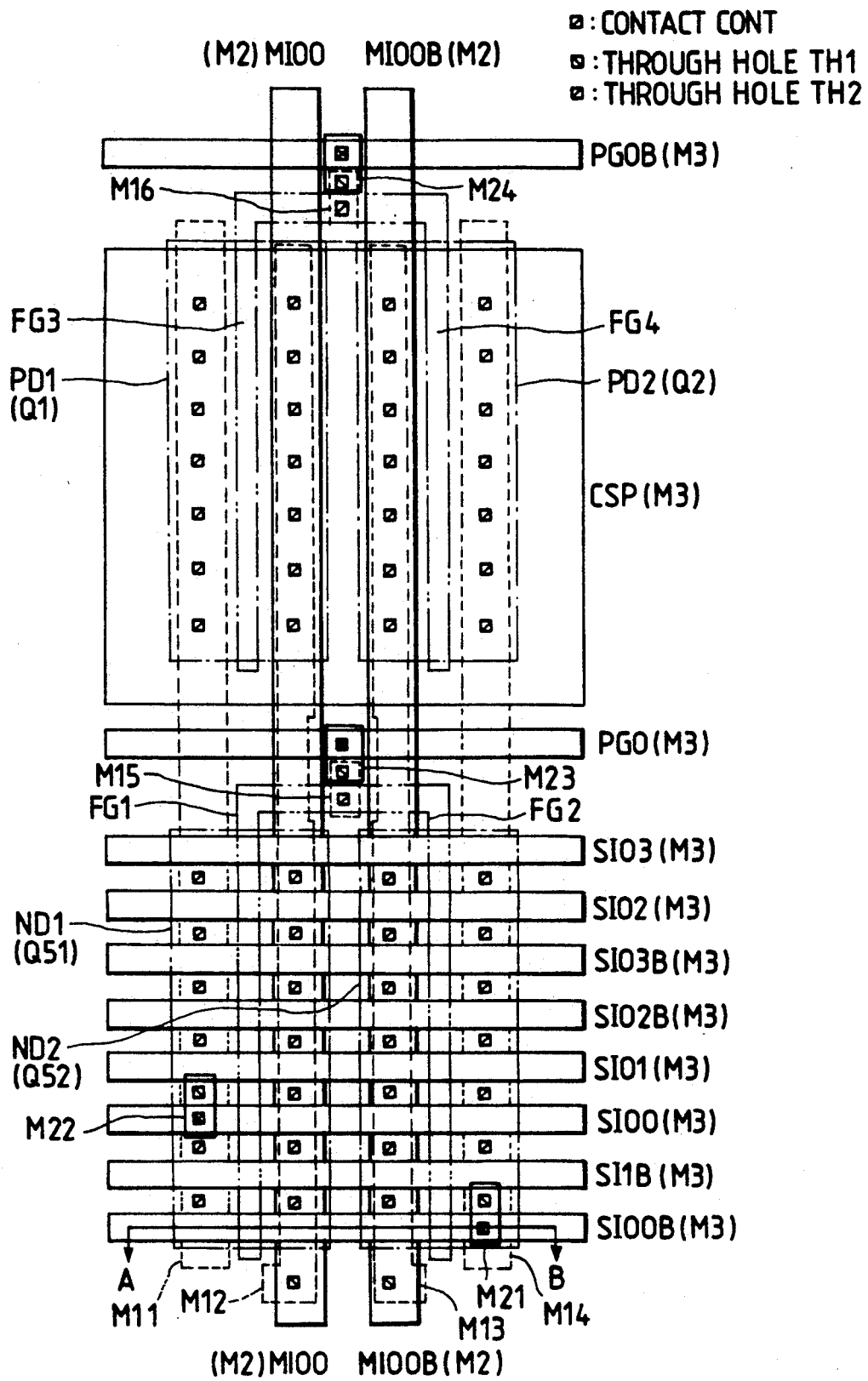
FIG. 15 illustrates the layout of the path gate of FIG. 14.
Figure 16:
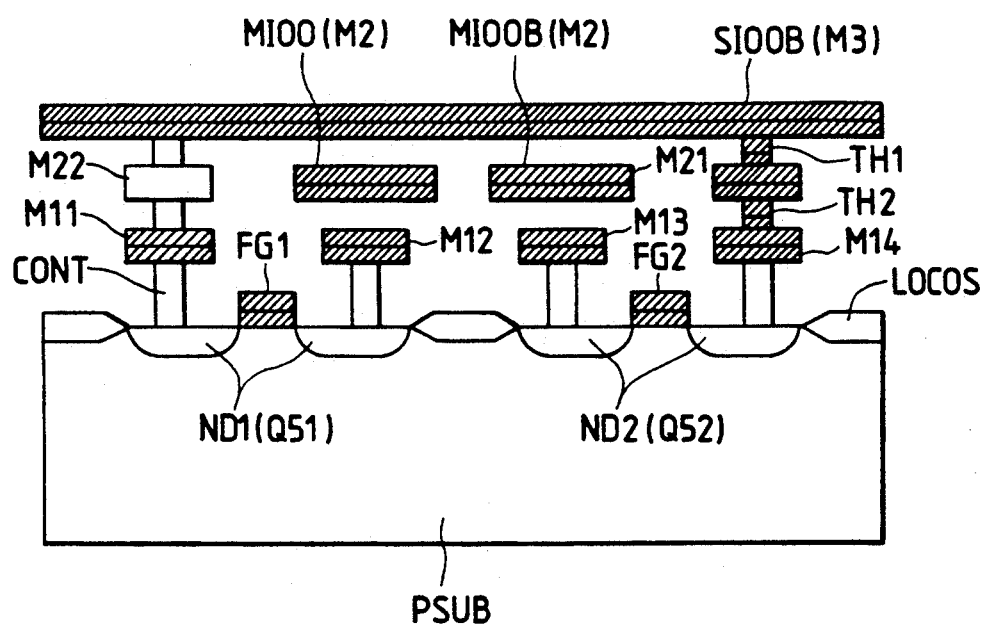
FIG. 16 is a sectional structural view taken on line A-B of the path gate of FIG. 15.

FIGS. 12 and 13 are circuit diagrams of the memory mat MAT00L and the unit sense amplifier SA00 in the dynamic RAM of FIG. 1, respectively. FIG. 14 is a circuit diagram of the path gate PG00 in the dynamic RAM of FIG. 1. FIGS. 15 and 16 are a partial layout and a sectional structural drawing of the path gate PG00, respectively. Further, FIGS. 17, 18, 19, 20 to 22, 23 and 24, 25 and 26, and 27 and 28 are circuit diagrams and block diagrams of the dynamic amplifier D0, the main IO line selector MSW0, the static amplifier STA0, the test circuit T0, the tertiary amplifier 3SA, the data output buffer DOB, the Y-address decoder YD00 in the dynamic RAM of FIG. 1, respectively. Referring to these drawings, the specific construction and features of each part of the dynamic RAM of this embodiment. In these circuit diagrams, MOSFET (Metal Oxide Semiconductor Field Effect Transistor; in this embodiment, MOSFET generally represents a insulated gate field effect transistor) whose channel (back gate) is marked with an arrow is of a P-channel type and distinguished from an N-channel MOSFET without the arrow.

2.1. Memory mat.

As noted above, the dynamic RAM of this embodiment is provided with four memory blocks MB0-MB3 and each memory block is equipped with four memory units MU00-MU03 to MU30-MU33, each having 32 memory mats MAT00L-MAT07L, MAT0-0R-MAT07R, MAT10L-MAT17L and MAT10R-MAT17R. In this embodiment, each of the memory mats constituting each memory unit includes, as represented by the memory mat MAT00L of FIG. 12, 512 parallel word lines W0-W511 in the perpendicular direction and 256 pairs of parallel complementary bit lines B0*-B255* in the horizontal direction. Substantially 512×256 dynamic memory cells comprising data storage capacitors and address selection MOSFETs are disposed at the intersection points of word and complementary bit lines in the form of a grid.

The 512 word lines W0-W511 constituting each memory mat are commonly possessed by the corresponding 8 memory mats MAT00L-MAT07L. Moreover, one end of the word line is coupled to the ground potential via a word line clear MOSFET corresponding to a word line clear circuit WC00, whereas the other end thereof is coupled to the unit circuit corresponding to a word line drive circuit WD00. Therefore, the number of memory cells to be functional in a selective state at the time one word line is set functional in a selective state becomes 256×8, that is 2,048.

On the other hand, the 256 pairs of complementary bit lines B0*-B255* constituting each memory mat are coupled to the respective unit circuits corresponding to the unit sense amplifiers SA00. The dynamic RAM of this embodiment is held in the operating condition under a shared sense system in which the complementary bit lines B0*-B255* to which the pairs of memory mats MAT00R correspond are coupled likewise to the unit sense amplifiers SA00.

2.2 Sense amplifier

As noted above, the dynamic RAM of this embodiment is provided with 32 sense amplifiers SA0, SA1 in total with two of them provided for each memory unit and each sense amplifier is further provided with 16 unit sense amplifiers SA00-SA07 and SA10-SA17. In this embodiment, each of the unit sense amplifiers constituting each sense amplifier is, as represented by the unit sense amplifier SA00, provided with 256 unit circuits correspondingly provided for the complementary bit lines B0*-B255* such as the pair of memory mats MAT00L, MAT00R. Each unit circuit includes, though not restricted, a P-type sense amplifier SAP and an N-type sense amplifier SAN formed with a pair of P-channel MOSFETs or N-channel MOSFETs cross-coupled, a precharge circuit PC formed with three N-channel MOSFET, and an IO switching gate IOG formed with two N-channel MOSFET.

Moreover, the sense amplifier SA00 in the dynamic RAM of this embodiment, which is held in the operating condition under the shared sense system, includes 512 pairs of shared MOSFET in total provided with respect to the complementary bit lines B0*-B255* corresponding to each unit circuit and the memory mat MAT00L or MAT00R. These shared MOSFETs are selectively held ON when the internal control signal SHL or SHR is set at high levels, whereby each unit circuit of the unit sense amplifier SA00 and the complementary bit lines B0*-B255* of the corresponding memory mat MAT00L or MAT00R are selectively connected.

The P-type sense amplifier SAP and the N-type sense amplifier SAN constituting each unit circuit of the unit sense amplifier SA00 are in the operating state when the supply voltage (first supply voltage) of the circuit is supplied to a common source line CSP (a first common data line) and when the ground potential (second supply voltage) of the circuit is supplied to a common source line CSN (a second common data line). The P-type sense amplifier SAP and the N-type sense amplifier SAN in this operating state act as one unit amplifier circuit and amplify the small read signals output via the complementary bit lines B0*-B255* corresponding to the 256 memory cells coupled to the word lines with the corresponding memory mat MAT00L or MAT00R thus selected, thus changing the signals into binary read signals at high or low levels. These binary read signals are written again to the 256 memory cells thus selected and transmitted from the corresponding IO switch gate IOG via the sub-IO line SIO0*-SIO3* and the main IO line MIO0*-MIO3* to the main amplifier unit MAU0. While the dynamic RAM is in a non-selective state, the common source lines CSP, CSN are precharged with constant voltage HVC as an intermediate potential between the supply voltage and the ground potential of the circuit.

Subsequently, an inverted internal control signal PCB is commonly supplied to the three N-channel MOSFET gates constituting the precharge circuit PC of each unit circuit. While the dynamic RAM is in the selective state, the inverted internal control signal PCB is set at low levels and returned to a high level immediately before the dynamic RAM is set functional in non-selective state. The three N-channel MOSFETs constituting the precharge circuit PCB are selectively held ON when the dynamic RAM is released from the selective state and when the inverted internal control signal PCB is returned to a high level and precharge with the intermediate potential HVC the non-inverted and inverted signals of the complementary bit lines B0*-B255* corresponding to the memory mat MAT00L or MAT00R.

On the other hand, the two N-channel MOSFET gates constituting the IO switch gate IOG of each unit circuit are commonly coupled every four sets and corresponding bit selection signals YS0-YS63 are supplied from the Y-address decoder YD00. The bit selection signals YS0-YS63 are, as described above, alternatively set at high levels according to the Y-address signals Y0-Y5 and Y7-Y9 while the dynamic RAM is in the selective state in the normal read or write mode. With the ×32-bit parallel test mode, the bit selection signals YS0-YS63 are simultaneously set at high levels every four bits according to the Y-address signals Y0-Y5 and Y7, whereas with the ×128-bit parallel test mode, they are simultaneously set at high levels every three bits according to the Y-address signals Y0-Y5. Each IO switch gate IOG is selectively held ON when the corresponding bit line selection signals YS0-YS63 are set at high levels and selectively connects the complementary bit lines B0*-B255* corresponding to the non-inverted and inverted input/output nodes corresponding to the unit sense amplifier SA00, that is, the memory mat MAT00L or MAT00R, and the sub-IO lines SIO0*-SIO3*.

The sub-IO lines SIO0*-SIO3* are coupled to the corresponding path gate PG00 at one end. Moreover, the internal control signals SHL, SHR, PCB and the common source lines CSP, CSN and the precharge level supply line HVC are commonly coupled to the other corresponding memory mats MAT01L-MAT07L. Signal lines for transmitting the internal control signals WG, EQB, PG0 and PG0B for controlling the path gate PG00 are disposed in parallel to the word lines in the layout area of the unit amplifier SA00.

2.3. Path gate

As mentioned above, the dynamic RAM of this embodiment is provided with four sets of sub-IO lines SIO0*-SIO3* corresponding to the pair of memory mats holding each unit sense amplifier and disposed in parallel to the word lines W0-W511 and four sets of main IO lines MIO0*-MIO3* corresponding to the 8 memory mats disposed on both sides of each main amplifier unit and disposed in parallel to the complementary bit lines B0*-B255*. The sub-IO lines SIO0*-SIO3* are disposed in the layout area of the corresponding unit sense amplifier SA00 and the main IO lines MIO0*-MIO3* are disposed, though not restricted, closer to the boundary line between two sets of memory mats MAT00L, MAT01L adjacent to each other in the direction in which the word lines extend. The sub-IO lines SIO0*-SIO3* are selectively connected to the main IO lines MIO0*-MIO3* at the corresponding path gate PG00.

In this case, each path gate includes, as represented by the path gate PG00 of FIG. 14, 8 sets of P-channel MOSFETQ1, N-channel MOSFETQ51 to P-channel MOSEFETQ2, N-channel MOSFETQ52 in total which function as switch means and are provided between the non-inverted or inverted signal lines of the sub-IO lines SIO0*-SIO3* and the main IO lines MIO0*-MIO3*. Of these path gates, the corresponding inverted internal control signal PG0B is commonly supplied to the P-channel MOSFETQ1, Q2, whereas the internal control signal PG0 is commonly supplied to the N-channel MOSFETQ51, Q52. The internal control signal PG0* is a so-called switch control signal and selectively made effective according to the X-address signals X9-X11, for instance. The MOSFETQ1, Q2 to Q51, Q52 of the path gate PG00 are selectively held ON while the dynamic RAM is in the selective state and the corresponding internal control signal PG0* is made effective (in this case, the state in which the non-inverted signal is set at high levels and the inverted signal is set at low levels is called an effective state of the internal control signal, whereas the opposite state is called an ineffective state, and the same will apply hereinafter) and selectively connect the corresponding sub-IO lines SIO0*-SIO3* are selectively connected to the main IO lines MIO0*-MIO3*.

The path gate PG00 of this embodiment is further provided with four equalizing circuits EQ1-EQ4 between the non-inverted and inverted signal lines of the sub-IO lines SIO0*-SIO3*. The equalizing circuit includes three P-channel equalizing MOSFETs whose gates are supplied with the inverted internal control signal EQB and two P-channel pull-up MOSFETs whose gates are supplied with the internal control signal WG. The sources of the equalizing MOSFET and the pull-up MOSFET are commonly coupled to the common source line CSP. In this case, the inverted internal control signal EQB is set at low levels while the dynamic RAM is in the non-selective state and set at high levels at predetermined timing while the dynamic RAM is in the selective state. Moreover, the internal control signal WG is normally kept at low levels and set at high levels at predetermined timing while the dynamic RAM is in the selective state in the write mode. Moreover, the common source line CSP is, as noted above, set at the substantially intermediate potential HVC between the supply voltage of the circuit and the ground potential while the dynamic RAM is in the non-selective state and supplied with the supply voltage while the dynamic RAM is in the selective state at the predetermined timing.

While the dynamic RAM is in the non-selective state, the three equalizing MOSFETs constituting the equalizing circuits EQ1-EQ4 of the path gate PG00 are held ON as the inverted internal control signal EQB is set at low levels. The two pull-up MOSFETs are also held ON as the inverted internal control signal WG is set at low levels. As noted previously, the intermediate potential HVC is supplied to the common source line CSP. Therefore, the non-inverted and inverted signal lines of the sub-IO lines SIO0*-SIO3* are simultaneously equalized at the intermediate potential HVC.

While the dynamic RAM is in the selective state, the supply voltage of the circuit is supplied to the common source line CSP at predetermined timing and inverted internal control signal EQB is set at high levels slightly later. Moreover, though the internal control signal WG is kept at low levels while the dynamic RAM is in the read mode, it is set at high levels at the predetermined timing while the dynamic RAM is in the write mode. As a result, the levels of the non-inverted and inverted signal lines of the sub-IO lines SIO0*-SIO3* are raised to the supply voltage of the circuit, that is, a high level at a point of time the supply voltage of the circuit is supplied to the common source line CSP. In the case of the read mode, the levels of the non-inverted and inverted signal lines of the sub-IO lines SIO0*-SIO3* are varied at a predetermined charge share level in accordance with the logical level of the binary read signal established on the complementary bit line at a point of time the complementary bit lines designated by the IO switch gate IOG of the unit sense amplifiers SA00 are connected, whereas in the case of the write mode, they are fully swung according to the write signal supplied from the corresponding write buffer via the main IO line selector.

The dynamic RAM of this embodiment employs a triple metal wiring layer. In the path gate PG00, the sub-IO lines SIO0*–SIO3*, the common source line CSP and the signal lines for transmitting the inverted internal control signal PGOB and the internal control signal PGO are, as shown in FIGS. 15 and 16, formed with a triple metal wiring layer of aluminum M3, for instance. Moreover, the main IO line MIO0* is formed with a double metal wiring layer M2 of tungsten, for instance, and in the lower layer, there are provided first metal wiring layers M11, M14 and M12, M13 of tungsten, for instance, for coupling together non-inverted and inverted signal lines of the sub-IO line SIO0*, N-type diffusion layers ND1, ND2 as drain regions of MOSFETQ51, Q52 and P-type diffusion layers PD1, PD2 as drain regions of MOSFETQ1, Q2. Polysilicon layers FG1, FG2 serving as the gates of MOSFETQ51, Q52 are coupled via the first metal wiring layer M15 and the second metal wiring layer M23 to the internal control signal line PG0. Polysilicon layers FG3, FG4 serving as the gates of MOSFETQ1, Q2 are coupled via the first metal wiring layer M16 and the second metal wiring layer M24 to the inverted internal control signal line PG0B likewise. In this way, the use of the triple metal wiring layer and the provision of the path gate corresponding to the main IO line closer to the boundary line between the two memory mats adjacent to each other in the direction in which the word lines extend, that is, the arrangement of the path gate on the inner side of these memory mats can increase the efficiency of laying out the main IO line, the path gates and relevant signal lines.

2.4. Main amplifier

The dynamic RAM of this embodiment is, as mentioned above, provided with the four main amplifier units MAU0–MAU3 correspondingly provided for the main blocks MB0–MB3 and each main amplifier unit is provided with the four main amplifier groups MAG-0–MAG3. Further, each main amplifier group is provided with the four dynamic amplifiers D0–D3 to DC–DF and the same number of static amplifiers STA-0–STA3 to STAC–STAF.

Figure 17:
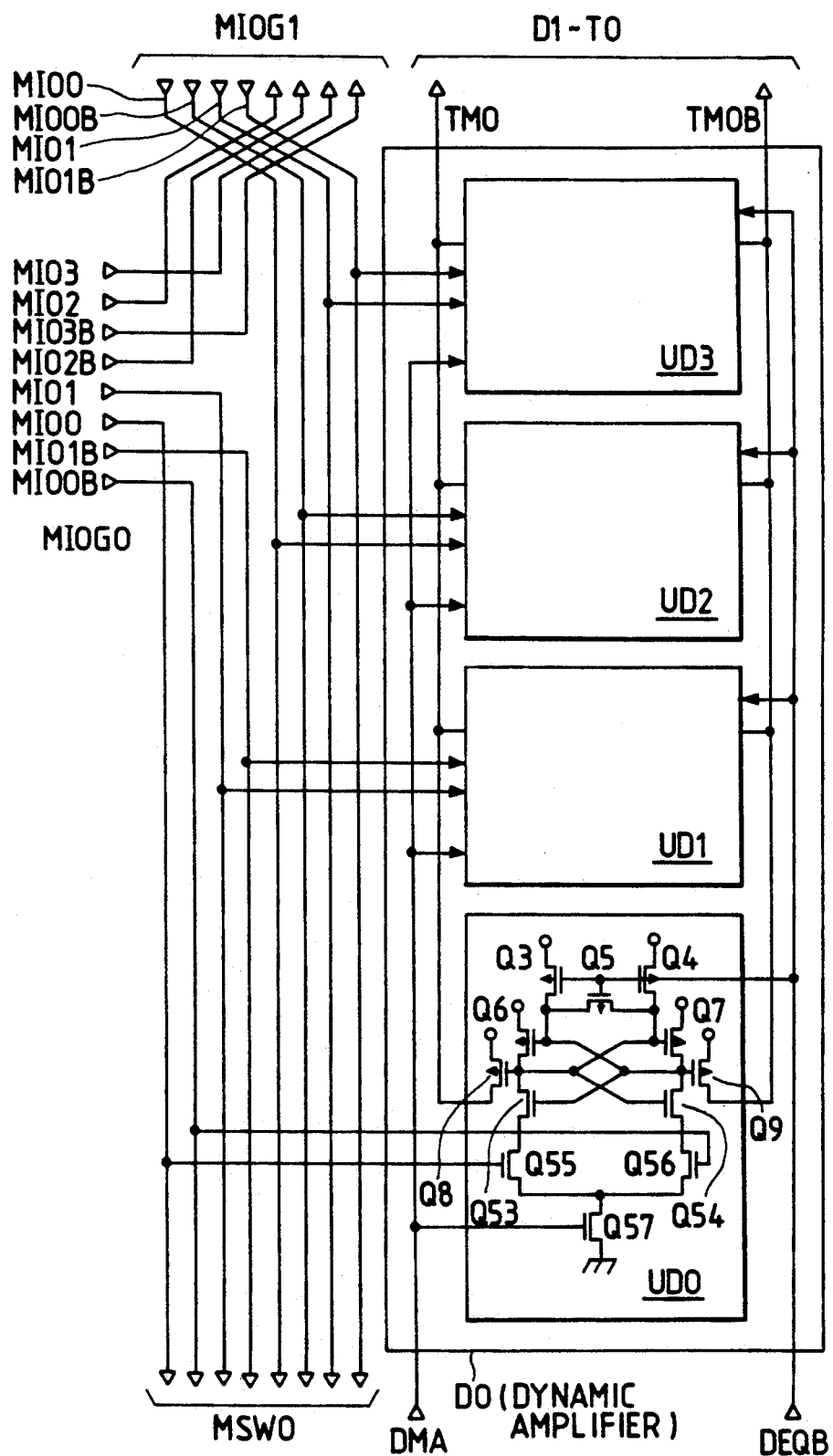
FIG. 17 is a partial circuit diagram of a dynamic amplifier in the main amplifier unit of FIG. 4.

Each of the dynamic amplifiers included in each main amplifier group is, as represented by the dynamic amplifier D0 of FIG. 17, provided with four unit D-type latch amplifers UD0–UD3 formed with so-called dynamic CMOS latch amplifiers. Each of the unit D-type latch amplifiers is, as represented by the unit D-type latch amplifier UD0, basically constructed of a pair of N-channel MOSFETQ55, Q56 indicative of a differential form. The drains of the differential MOSFETQ55, Q56 are coupled to the supply voltage of the circuit via N-channel MOSFETQ53 and P-channel MOSFETQ6 or N-channel MOSFETQ54 and P-channel MOSFETQ7 in the form of a CMOS invertor, whereas their sources commonly coupled are coupled to the ground potential of the circuit via a current source formed of an N-channel MOSFETQ57 whose gate is supplied with an internal control signal DMA. The CMOS invertor comprising MOSFETQ53, Q6 and Q54, Q7 has input and output terminals that are cross-coupled and in the form of a latch. Moreover, an equalizing circuit formed with three P-channel MOSFETQ3–Q5 whose gates are supplied with an inverted internal control signal DEQB is provided between the gates of MOSFETQ6 and Q7 and between these gates and the supply voltage of the circuit. The commonly coupled drains of MOSFETQ53, Q6 are coupled to the gate of an open drain type output P-channel MOSFETQ8, whereas the commonly coupled drains of MOSFETQ54, Q7 are coupled to the gate of an open drain type output P-channel MOSFETQ9. The drains of these output MOSFETQ8, Q9 are coupled to the non-inverted and inverted output terminals of the unit D-type latch amplifier UD0.

On the other hand, the gates of differential MOSFETQ55, Q56 are coupled to the non-inverted and inverted input terminals of each unit D-type latch amplifier. In this embodiment, the non-inverted and inverted input terminals of the unit D-type latch amplifiers UD0–UD3 are coupled with predetermined combinations to any four out of 8 sets of main IO lines constituting main IO line groups MIOG0, MIOG1 adjacent to each other in the direction of word lines. When attention is especially directed to the four unit D-type latch amplifiers forming the dynamic amplifier D0, the non-inverted and inverted input terminals of the unit D-type latch amplifiers UD0, UD1 are respectively coupled to the non-inverted and inverted signal lines of two sets of main IO lines MIO0*, MIO1* constituting the main IO line group MIOG0, whereas the non-inverted and inverted input terminals of the unit D-type latch amplifiers UD2, UD3 are respectively coupled to the non-inverted and inverted signal lines of two sets of main IO lines MIO0*, MIO1* constituting the main IO line group MIOG1. In the dynamic amplifier D1 (not shown) likewise, the non-inverted and inverted input terminals of the unit D-type latch amplifiers UD0, UD1 are respectively coupled to the non-inverted and inverted signal lines of two sets of main IO lines MIO2*, MIO3* constituting the main IO line group MIOG0, whereas the non-inverted and inverted input terminals of the unit D-type latch amplifiers UD2, UD3 are respectively coupled to the non-inverted and inverted signal lines of two sets of main IO lines MIO2*, MIO3* constituting the main IO line group MIOG1. The four sets of main IO lines coupled substantially by replacing two sets at a time between the main IO line groups MIOG0, MIOG1 adjacent to each other are coupled via the dynamic amplifier D0 to the corresponding main IO line selector MSW0.

The non-inverted and inverted output terminals of the four unit D-type latch amplifier UD0–UD3 constituting the dynamic amplifier D0 are directly coupled to a non-inverted output signal line TM0 and an inverted output signal line TM0B in a so-called connection logical form. The non-inverted output signal line TM0 and the inverted output signal line TM0B are commonly coupled to the non-inverted and inverted output terminals of the four unit D-type latch amplifiers UD0–UD3 constituting the adjoining dynamic amplifier D1 before being coupled to the corresponding test circuit T0. Since the test circuit T0 includes, as will be described later, an N-channel precharge MOSFET which is selectively turned on according to a precharge internal control signal DPC provided between the non-inverted output signal line TM0, the inverted output signal line TM0B and the ground potential of the circuit, the non-inverted output signal line TM0 and the inverted output signal line TM0B are preset at low levels like the ground potential of the circuit even while the dynamic RAM is in the non-selective state. The levels of these output signal lines are selectively set as high as the supply voltage of the circuit when any one of the non-inverted or inverted output signals of the 8 unit D-type latch amplifiers included in the corresponding two dynamic amplifiers D0, D1 is set at high levels, thus causing the output MOSFETQ8 or Q9 to be held ON.

In this embodiment, moreover, the P-channel MOSFETQ3-Q9 and the N-channel MOSFETQ53-Q57 constituting the unit D-type latch amplifiers UD0-UD3 of the dynamic amplifiers D0-D1 are made relatively small in size, whereby the operating current of each unit D-type latch amplifier is limited to a relatively small value. As mentioned above, the dynamic amplifiers D0-D1 are used in the ×128-bit parallel test mode and 128 unit D-type latch amplifiers are simultaneously held in the operating condition. As noted above, the peak operating current value of the dynamic RAM in the ×128-bit parallel test mode is restrained by keeping the operating current of the unit D-type latch amplifiers constituting the dynamic amplifier comparatively small and a reduction in power consumption can thus promoted.

Figure 18:
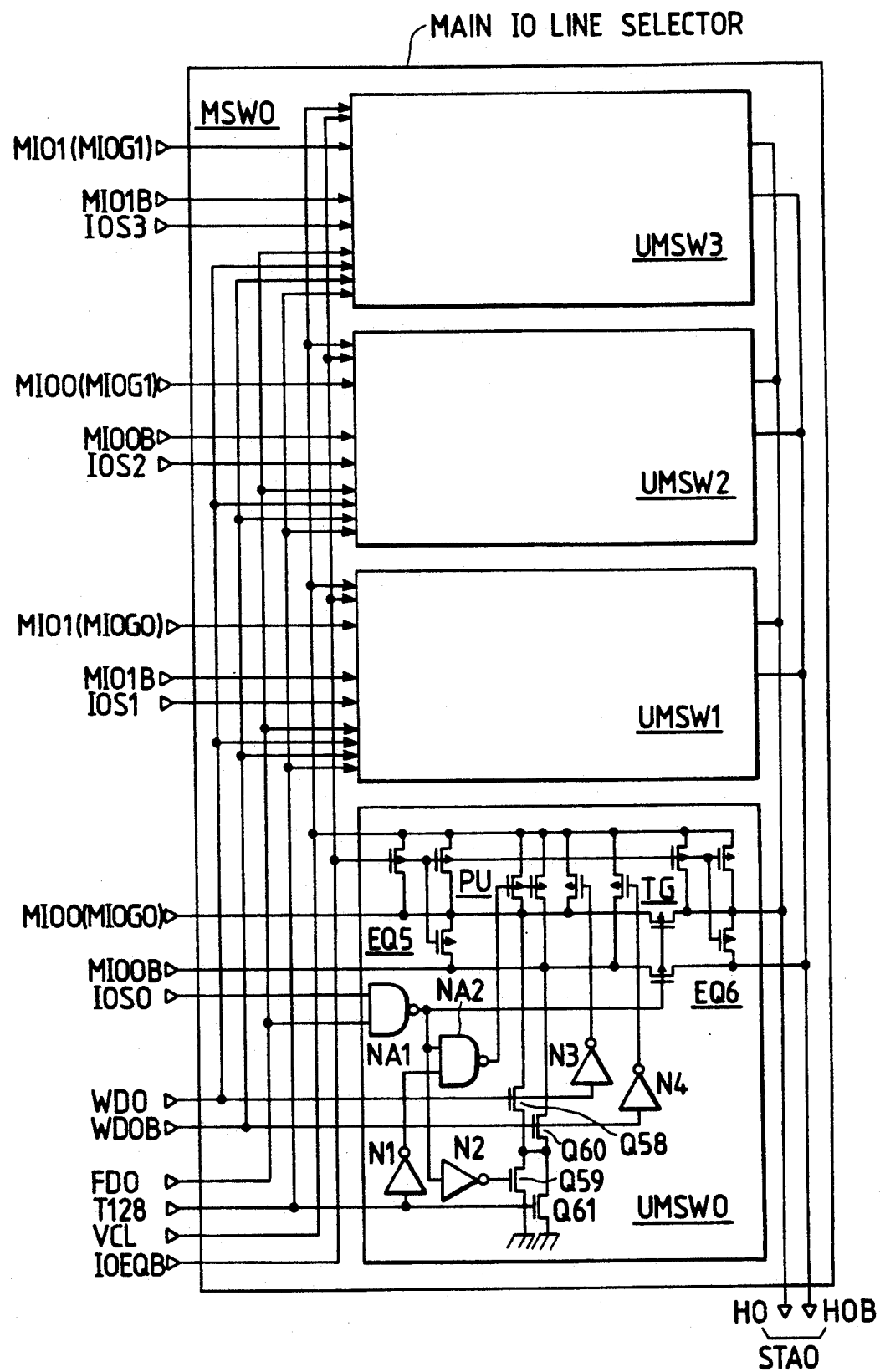
FIG. 18 is a partial circuit diagram of a main IO line selector in the main amplifier unit of FIG. 4.

Subsequently, each of the main IO line selectors is, as represented by the main IO line selector MSW0 of FIG. 18, provided with four unit selectors UMSW0-UMSW3 correspondingly provided for the main IO lines MIO0*, MIO1* of the main IO line groups MIOG0, MIOG1. Each of the unit selectors includes, as represented by the unit selector UMSW0 of FIG. 18, a transmission gate TG formed with a pair of P-channel MOSFETs provided between a non-inverted output signal line H0 and an inverted output signal line H0B common to the non-inverted and inverted signal lines of each main IO line. An output signal of a NAND gate NA1 is commonly supplied to the gates of these P-channel MOSFETs. Corresponding main IO line selection signals IOS0-IOS3 are supplied to an input terminal at one end of the NAND gate NA1, whereas corresponding main amplifier selection signals FD0-FD3 are supplied to an input terminal at the other end thereof. In this case, the main IO line selection signals IOS0-IOS3 are alternatively set at high levels according to the Y-address signals Y6, Y7 at predetermined timing. Moreover, the main amplifier selection signals FD0-FD3 are alternatively set at high levels according to the Y-address signals Y8, Y9 at predetermined timing while the dynamic RAM is in the normal read or write mode and simultaneously set at high levels while the dynamic RAM is in the ×32-bit parallel test mode. In addition, the non-inverted output signal line H0 and the inverted output signal line H0B of the main IO line selector MSW0 are coupled to the non-inverted and inverted input terminals of the static amplifier STA0.

As set forth above, the output signal of the NAND gate NA1 is selectively set at low levels when the corresponding main IO line selection signal IOS0 is set at high levels and when the corresponding main amplifier selection signal FD0 is also set at high levels, whereby the transmission gate TG is held ON. As a result, the main IO line MIO0* or MIO1* of the main IO line group MIOG0 or MIOG1 is selectively connected to the non-inverted output signal line H0 and the inverted output signal line H0B of the main IO line selector MSW0 and further to the static amplifier STA0.

An equalizing circuit EQ5 whose gate is supplied with an inverted internal control signal IOEQB is formed with three P-channel MOSFETs at the preceding stage of the transmission gate TG between the supply voltage of the circuit, that is, the internal supply voltage VCL and the non-inverted and inverted signal lines of the corresponding main IO line MIO0*, whereas at the following stage, an equalizing circuit EQ6 whose gate is supplied with the inverted internal control signal IOEQB is formed with three P-channel MOSFETs between the internal supply voltage VCL and the non-inverted output signal line H0 and the inverted output signal line H0B. The P-channel MOSFETs constituting the equalizing circuit are selectively held ON while the dynamic RAM is in the non-selective state and when the inverted internal control signal IOEQB is set at low levels. Further, the non-inverted and inverted signal lines of the corresponding main IO line MIO0* and the non-inverted output signal line H0 and the inverted output signal line H0B of the main IO line selector MSW0 are set at high levels like the internal supply voltage VCL. The potential of the internal supply voltage VCL is set at the same potential with the high level of the common source line CSP at the time the sense amplifier is driven. Consequently, the level of the common source line CSP is restrained from lowering when the sub-IO line and the main IO line are connected and the read operation of the dynamic RAM is accelerated accordingly.

The unit selector UMSW0 further includes two P-channel type pull-up MOSFETs provided between the internal supply voltage VCL and the non-inverted and inverted signal lines of the corresponding main IO line MIO0* with their gates supplied with the output signal of a NAND gate NA2, a pair of P-channel type MOSFETs whose gates are supplied with the output signal of an invertor N3 or N4, that is, an internal write signal WD0 or the inverted signal of an inverted internal write signal WD0B, and N-channel MOSFETQ58, Q59 and Q60, Q61 provided in series between the non-inverted and inverted signal lines of the main IO line MIO0* and the ground potential of the circuit. The internal write signal WD0 or the inverted internal write signal WD0B are supplied to the gates of MOSFETQ58, Q60 among them. Moreover, the signal of the output signal of the NAND gate NA1 that has been inverted by an invertor N2 is supplied to the gate of MOSFETQ59, whereas an internal control signal T128 is supplied to the gate of MOSFETQ61. In this case, the internal control signal T128 is selectively set at high levels when the dynamic RAM is set functional in the ×128-bit parallel test mode.

The output signal of the NAND gate NA1 is supplied to one input terminal of the NAND gate NA2, whereas the signal of the internal control signal T128 that has been inverted by the invertor 1 is supplied to the other input terminal thereof. The output signal of the NAND gate NA2 is normally kept at low levels and selectively set at high levels while the dynamic RAM is in the selective state in the normal read or write mode or the ×32-bit parallel test mode and when both the corresponding main IO line selection signal IOS0 and the main amplifier selection signal FD0 are set at high levels or while the dynamic RAM is in the selective state in the ×128-bit parallel test mode, whereby the pull-up operation of the non-inverted and inverted signal lines of the main IO line MIO0* is suspended. If the dynamic RAM is in the write mode then, either MOSFETQ59 or Q61 is held ON and MOSFETQ58, Q60 and the P-channel type write MOSFET are selectively held ON according the internal write signal WD0 or the inverted internal write signal WD0B. As a result, the non-inverted and inverted signal lines of the main IO line MIO0* are fully swung to the supply voltage of the circuit or the ground potential and the write operation according to the write signal is performed for the memory cells connected to the main IO line MIO0*.

Figure 19:
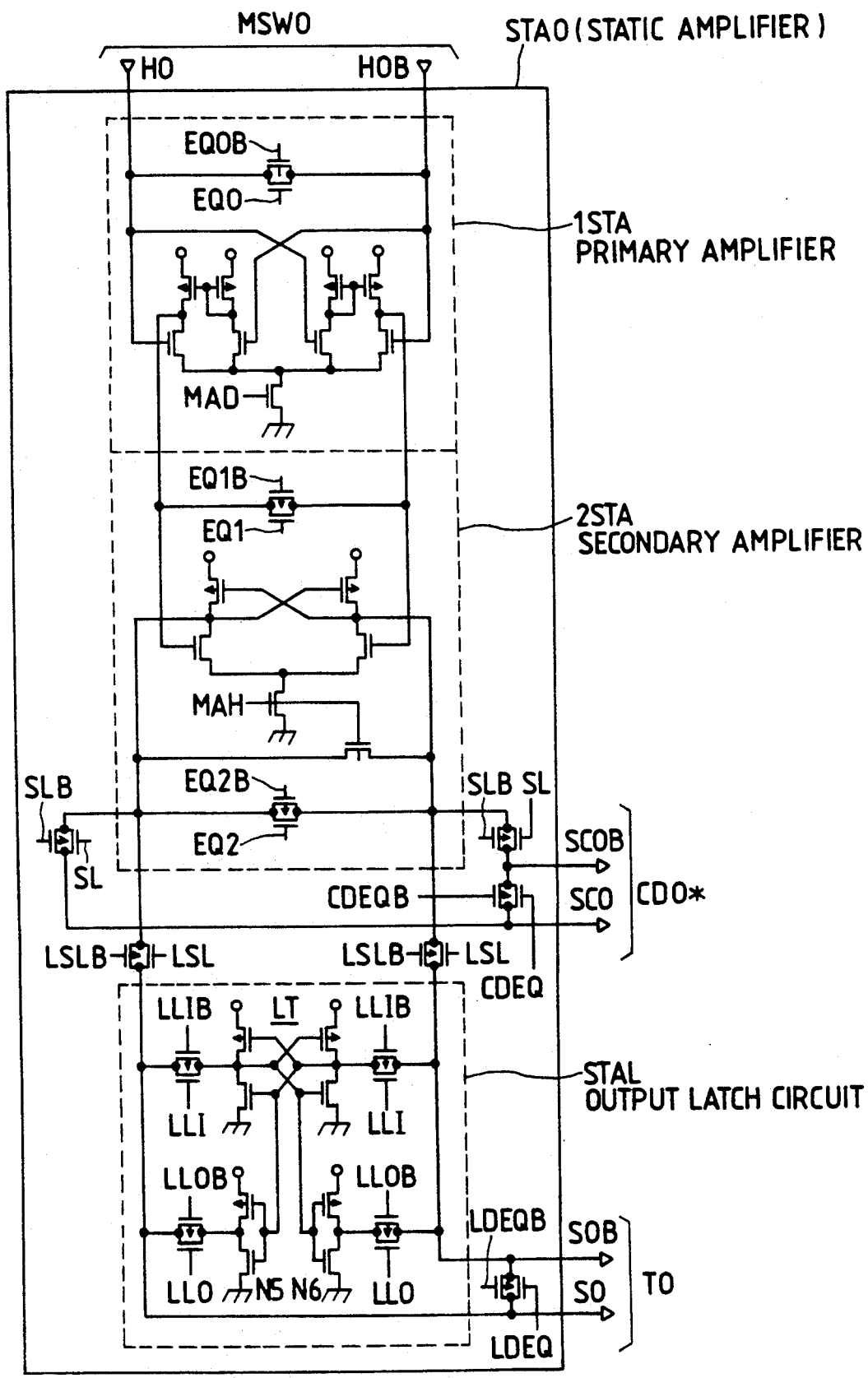
FIG. 19 is a partial circuit diagram of a static amplifier in the main amplifier unit of FIG. 4.
Figure 20:
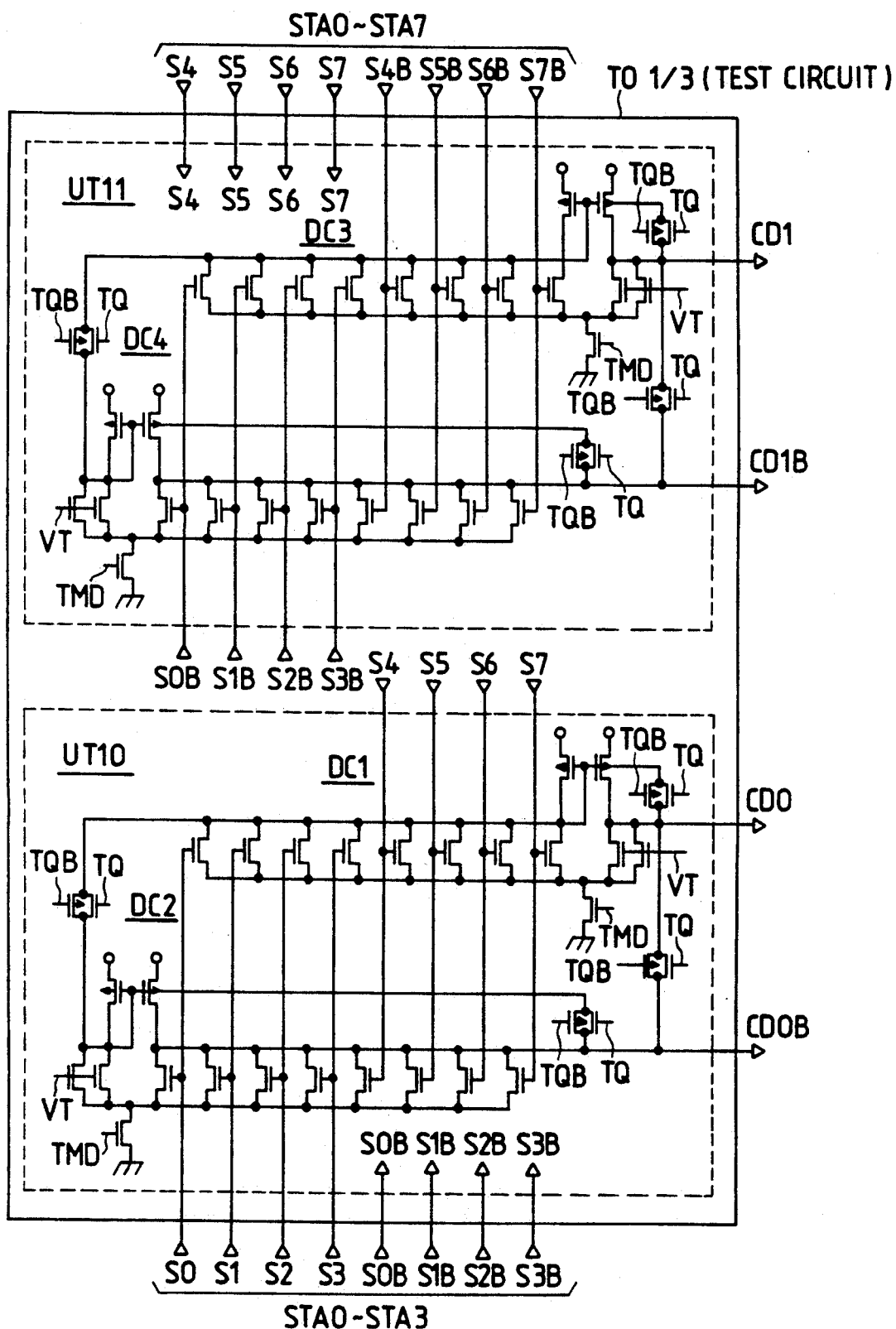
FIG. 20 is a partial circuit diagram of a test circuit in the main amplifier unit of FIG. 4.

Each of the static amplifiers included in each main amplifier group is, as represented by the static amplifier STA0 of FIG. 19, provided with a primary amplifier 1STA whose non-inverted and inverted input terminals are coupled to the non-inverted output signal line HO and the inverted output signal line H0B of the main IO line selector MSW0, and a secondary amplifier 2STA for receiving the non-inverted and inverted output signals of the primary amplifier. Of these amplifiers, the primary amplifier is formed with a so-called CMOS current mirror type differential amplifier circuit and an equalizing MOSFET is provided between the non-inverted and inverted input terminals of the differential amplifier, the equalizing MOSFET being selectively held ON according to an internal control signal EQ0 and an inverted internal control signal EQ0B. The primary amplifier 1STA is selectively held in the operating condition when an internal control signal MAD is set at high levels to amplify the voltage level of the read signal output from the main IO line selector MSW0 while shifting the voltage level thereof via the non-inverted output signal line HO and the inverted output signal line H0B so as to transmit the amplified read signal to the secondary amplifier 2STA.

On the other hand, the secondary amplifier 2STA includes a differential amplifier circuit with a pair of N-channel MOSFETs in a differential form as a basic construction and an equalizing circuit to be selectively held ON according to an internal control signal EQ1 or EQ2 or an inverted internal control signal EQ1B or EQ2B is provided between the non-inverted and inverted input terminals in each MOSFET. The secondary amplifier 2STA is selectively held in the operating condition when the internal control signal MAH is set at high levels so as to amplify the read signal further from the primary amplifier 1STA. In the dynamic RAM of this embodiment, MOSFETs constituting the primary amplifier 1STA and the secondary amplifier 2STA of the static amplifier STA0 is made relatively large in size. As a result, the static amplifier STA0 needs a relatively large operating current and its operating speed is increased accordingly, whereby the cycle time of the dynamic RAM in the normal read mode and the ×32-bit parallel test mode is accelerated.

The non-inverted and inverted output terminals of the secondary 2STA are coupled to the common data bus CD0* via a pair of transmission gates that are selectively held ON according to an internal control signal SL or an inverted internal control signal SLB and further to the non-inverted and inverted output terminals of an output latch circuit STAL via another pair of transmission gates that are selectively held ON according to an internal control signal LSL or an inverted internal control signal LSLB. The non-inverted and inverted output terminals of the output latch circuit STAL are coupled to the non-inverted and inverted input terminals corresponding to the test circuit T0. In this case, the internal control signal SL and the inverted internal control signal SLB are selectively made effective when the dynamic RAM is set functional in the normal read mode, whereas the internal control signal LSL and the inverted internal control signal LSLB are set selectively effected when the dynamic RAM is set functional in the ×32-bit parallel test mode. Consequently, the read signal amplified by the secondary 2STA is directly supplied to the common data bus CD0* while the dynamic RAM is in the normal read mode and supplied to the common data buses CD0*, CD1* after being subjected by the test circuit T0 to comparison and collation while the dynamic RAM is in the ×32-bit parallel test mode.

The output latch circuit STAL includes a latch circuit LT formed with a pair of cross-coupled CMOS invertors and a pair of invertors N5, N6 for receiving the non-inverted and inverted output signals of the latch circuit. The non-inverted and inverted input/output nodes of the latch circuit LT are coupled to the non-inverted and inverted input/output terminals of the output latch circuit STAL via a pair of transmission gates that are selectively held ON according to an internal control signal LLI or an inverted internal control signal LLIB, whereas the output terminals of the invertors N5, N6 are coupled to the non-inverted and inverted input/output terminals of the output latch circuit STAL via a pair of transmission gates that are selectively held ON according to an internal control signal LLO or an inverted internal control signal LLOB. Consequently, the output latch circuit STAL is selectively held in the operating condition when the internal control signals LLI, LLO and the inverted internal control signals LLIB, LLOB are made effective so as to hold and transmit the read signal output from the secondary 2STA.

2.5. Test circuit

As mentioned previously, the dynamic RAM of this embodiment is provided with the four amplifier units MAU0-MAU3 and each amplifier unit is provided with the two test circuits T0, T1. In this embodiment, each of the test circuits provided in each main amplifier unit includes, as represented by the test circuit T0 of FIGS. 20 to 22, two unit test circuits UT10, UT11 for use in the ×32-bit parallel test mode and four precharge circuits DPC0-DPC3 for use in the ×128-bit parallel test mode.

Figure 21:
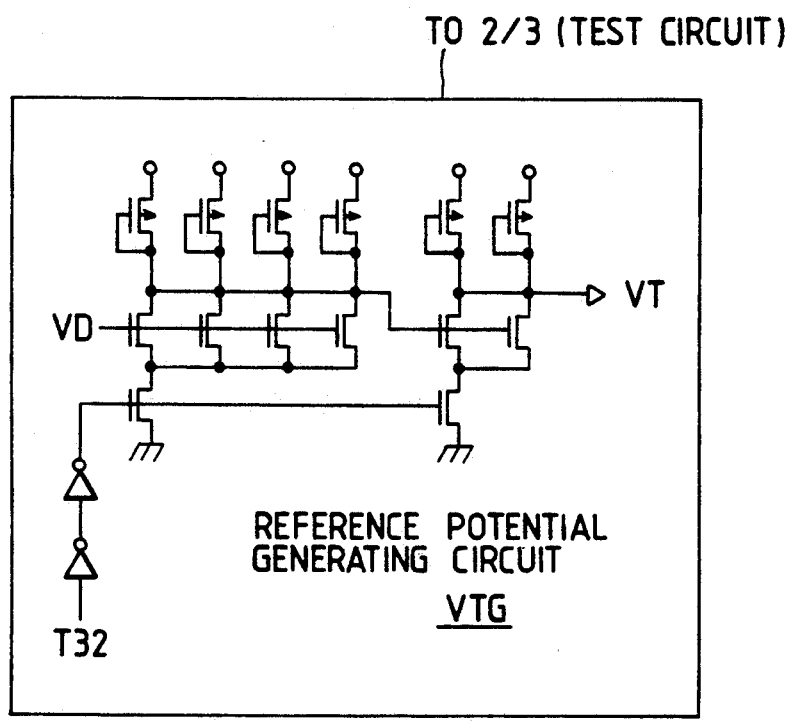
FIG. 21 is another partial circuit diagram of a test circuit in the main amplifier unit of FIG. 4.

In this case, the unit test circuit UT10 provided in the test circuit T0 is provided with two N-channel MOSFETs whose gates are supplied with predetermined reference potential VT and two differential circuits DC1, DC2, each including 8 N-channel type parallel MOSFETs whose gates are supplied with the non-inverted output signals S0-S7 of the output latch circuit STAL of the static amplifiers STA0-STA7 in a differential form with respect to these N-channel MOSFETs. These differential circuits are coupled together via a pair of transmission gates that are selectively held ON across the non-inverted and inverted output terminals according to a non-inverted internal control signal TQ and an inverted internal control signal TQB so as to furnish a latch form. Each differential circuit, which is in the form of a current mirror, further acts as an active load with respect to the differential MOSFET and is selectively held ON according to the non-inverted internal control signal TQ and the inverted internal control signal TQB, thus including a pair of P-channel MOSFETs acting as pull-up MOSFETs. The non-inverted output terminal of the differential circuit DC1 is coupled to the non-inverted signal line CD0 of the common data bus CD0*, whereas the inverted output terminal of the differential circuit DC2 is coupled to the inverted signal line CD0B of the common data bus CD0*. The reference potential VT is formed in a reference potential generating circuit VTG and set at an intermediate level between the high and low levels of the non-inverted output signals S0-S7 of the output latch circuit STAL or the inverted output signals S0B-S7B of the static amplifiers STA0-STA7. The reference potential VT includes, as shown in FIG. 21, parallel MOSFETs equivalent to those twice as many as MOSFETs forming the primary amplifier 1STA and the secondary amplifier 2STA of the static amplifier STA0 and the CMOS amplifier of the output latch circuit STAL, that is, the transmission channel of a read signal and is selectively held in the operating condition according to an internal control signal T32 to be set at high levels in the ×32-bit parallel test mode.

In the same way, the unit test circuit UT11 provided in the test circuit T0 is provided with two N-channel MOSFETs whose gates are supplied with the predetermined reference potential VT and two differential circuits DC3, DC4, each including 8 N-channel type parallel MOSFETs whose gates are supplied with the inverted output signals S0B-S7B of the output latch circuit STAL of the static amplifiers STA0-STA7 in a differential form with respect to these N-channel MOSFETs. These differential circuits are coupled together via the pair of transmission gates that are selectively held ON across the non-inverted and inverted output terminals according to the non-inverted internal control signal TQ and the inverted internal control signal TQB so as to furnish a latch form. Each differential circuit, which is in the form of a current mirror, further acts as an active load with respect to the differential MOSFET and is selectively held ON according to the non-inverted internal control signal TQ and the inverted internal control signal TQB, thus including the pair of P-channel MOSFETs acting as pull-up MOSFETs. The non-inverted output terminal of the differential circuit DC3 is coupled to the non-inverted signal line CD1 of the common data bus DC1*, whereas the inverted output terminal of the differential circuit DC4 is coupled to the inverted signal line CD1B of the common data bus CD1*. The reference potential VT is set at an intermediate level between the high and low levels of the non-inverted and inverted output signals of the output latch circuit STAL of the static amplifiers STA0-STA7.

As is obvious from the description above, the level of the non-inverted output signal of the differential circuit DC1 of the unit test circuit UT10, that is, the non-inverted signal line CD0 of the common data bus CD0* is selectively set low when the non-inverted output signals S0-S7 of the output latch circuit STAL of the corresponding 8 static amplifiers STA0-STA7 are all kept at low levels, that is, when the data read from the 8 memory cells selected from the memory units MU0-0-MU03 in the ×32-bit parallel test mode are all logic "0", whereas the level of the inverted output signal of the differential circuit DC1, that is, the inverted signal line CD0B of the common data bus DC0* is inversely selectively set at high levels under the same condition. On the other hand, the level of the non-inverted output signal of the differential circuit DC3 of the unit test circuit UT11, that is, the non-inverted signal line CD1 of the common data bus CD1* is selectively set low when the non-inverted output signals S0B-S7B of the output latch circuit STAL of the corresponding 8 static amplifiers STA0-STA7 are all kept at low levels, that is, when the data read from the 8 memory cells selected from the memory units MU00-MU03 in the ×32-bit parallel test mode are all logic "1", whereas the level of the inverted output signal of the differential circuit DC4, that is, the inverted signal line CD1B of the common data bus CD1* is inversely selectively set at high levels under the same condition.

More specifically, when the data read from the 8 memory cells selected from the memory units MU0-0-MU03 in the ×32-bit parallel test mode are all logic "0," the complementary output signal of the unit test circuit UT10 is logic "0" and the complementary output signal of the unit test circuit UT11 is logic "1." When the data thus read are all logic "1," moreover, the complementary output signal of the unit test circuit UT10 is inversely logic "1" and the complementary output signal of the unit test circuit UT11 is logic "0." When the read data do not coincide in terms of all bits, the complementary output signals of the unit test circuits UT10, UT11 are set at logic "1." As a result, it is possible to decide the result of comparing and collating 32-bit read data carried out on a 8-bit unit basis in the test circuit T0 by monitoring the levels of the non-inverted and inverted signal lines of the two sets of common data buses CD0*, CD1*. Needless to say, the result of comparing and collating the data read by the test circuit T1 of the main amplifier unit MAU0 is output via the common data buses CD2*, CD3*, whereas the result of comparing and collating the data read by the test circuits T0, T1 of the main amplifier unit MAU1 is output via common data buses CD4*, CD5* and CD6*, CD7*. The result of comparing and collating the data read by the test circuits T0, T1 of the main amplifier units MAU2, MAU3 is output via the corresponding two sets of common data buses CD0*, CD1* and CD6*, CD7*, on condition that the internal address signal X12* is logic "1."

Figure 22:
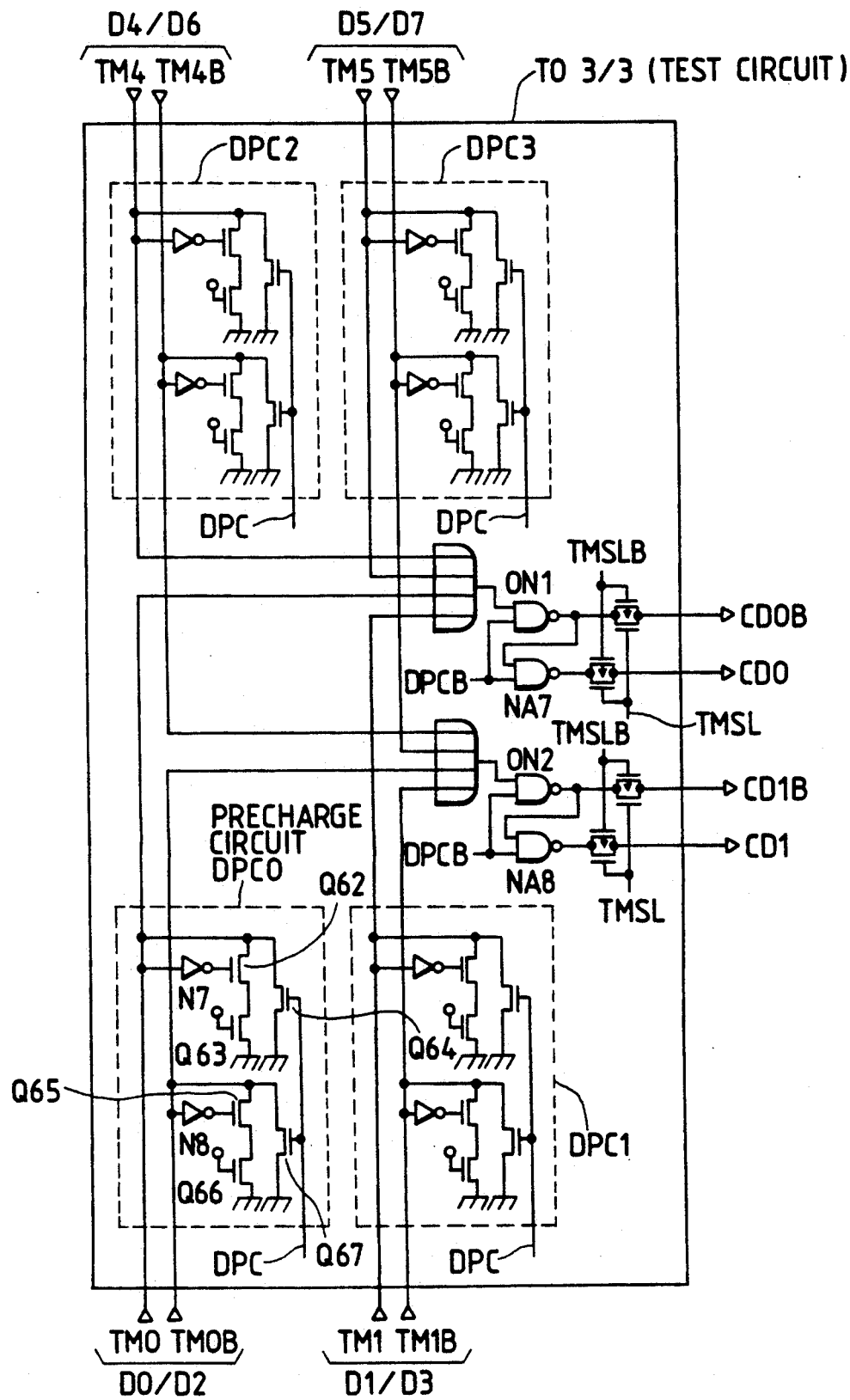
FIG. 22 is still another partial circuit diagram of a test circuit in the main amplifier unit of FIG. 4.

Each of the precharge circuits DPC0-DPC3 of the test circuit T0 includes, as represented by the precharge circuit DPC0 of FIG. 22, N-channel MOSFETQ62, Q63 to Q65, Q66 provided between the non-inverted output signal lines TM0, TM1 and TM4, TM5 and the inverted output signal lines TM0B, TM1B and TM4B, TM5B coupled to the non-inverted and inverted output terminals of the dynamic amplifiers D0-D7 on the basis of the connection logic and the ground potential of the circuit, and N-channel type precharge MOSFETQ64 or Q67 provided in parallel to those MOSFETs. The gates of MOSFETQ63, Q65 among those MOSFETs are supplied with an inverted signal such as the corresponding non-inverted output signal TM0 or inverted output signal TMPB from an invertor N7 or N8. Moreover, the gates of MOSFETQ63, Q66 are coupled to the supply voltage of the circuit and the internal control signal DPC is supplied to the precharge MOSFETQ64, Q67. In this case, the internal control signal DPC is set at high levels in line with the equalizing timing of the main IO line while the dynamic RAM is in the ×128-bit parallel test mode and set at low levels at a point of time the data is established.

Consequently, the precharge MOSEFTQ64, Q67 of the precharge circuits DPC0-DPC3 are held ON immediately before the read signal of the memory cell thus selected is established while the dynamic RAM is in the ×128-bit parallel test mode and preset the corresponding non-inverted output signal lines TM0, TM1 and TM4, TM5 or the inverted output signal lines TM0B, TM1B and TM4B, TM5B at low levels like the ground potential of the circuit. The low level of these non-inverted and inverted output signal lines are selectively changed to a high level like the supply voltage of the circuit when the corresponding dynamic amplifiers D0-D7 are held in the operating condition and when the output MOSEFTQ8 or Q9 is held ON.

The test circuit includes an OR NAND gate ON1 whose first-fourth OR input terminals are coupled to the non-inverted output terminals of the precharge circuits DPC0-DPC3, that is, the non-inverted output signal lines TM0, TM1 and TM4, TM5, and an OR NAND gate ON2 whose first-fourth OR input terminals are coupled to the inverted output terminals of the precharge circuits DPC0-DPC3, that is, the inverted output signal lines TM0B, TM1B and TM4B, TM5B. An inverted internal control signal DPCB is commonly supplied to the NAND input terminals of these OR NAND gates. In this case, the inverted internal control signal DPCB, which is the inverted signal of the internal control signal DPC, is set at high levels at a point of them the read data of the memory cell thus selected is established.

The output signal of the OR NAND gate ON1 is supplied to the inverted signal line CD0B of the common data bus CD0* via a transmission gate selectively held in the operating condition according to an internal control signal TMSL* and to one input terminal of an NAND gate NA7. The inverted internal control signal DPCB is supplied to the other input terminal of the NAND gate NA7 and the output signal thereof is supplied to the non-inverted signal line CD0 of the common data bus CD0* via another transmission gate selectively held in the operating condition according to the internal control signal TMSL*. Similarly, the output signal of the OR NAND gate ON2 is supplied to the inverted signal line CD1B of the common data bus CD1* via a transmission gate selectively held in the operating condition according to an internal control signal TMSL* and to one input terminal of an NAND gate NA8. The inverted internal control signal DPCB is supplied to the other input terminal of the NAND gate NA8 and the output signal thereof is supplied to the non-inverted signal line CD1 of the common data bus CD1* via another transmission gate selectively held in the operating condition according to the internal control signal TMSL*. The internal control signal TMSL* is selectively made effective at predetermined timing while the dynamic RAM is in the ×128-bit parallel test mode.

Consequently, while the dynamic RAM is in the ×128-bit parallel test mode, a high level like the supply voltage of the circuit is selectively applied to the inverted signal line CD0B of the common data bus CD0* on condition that the non-inverted output signal lines TM0, TM1 and TM4, TM5 of the dynamic amplifiers D0-D2, D1-D3 and D4-D6, D5-D7 simultaneously remain at low levels, that is, 32 read data of the memory cell are totally logic "0." A high level like the supply voltage of the circuit is selectively applied to the inverted signal line CD1B of the common data bus CD1* on condition that the non-inverted output signal lines TM0B, TM1B and TM4B, TM5B of these dynamic amplifiers simultaneously remain at low levels, that is, 32 read data of the memory cell are totally logic "1." At this time, the complementary signals of the corresponding inverted signal lines CD0*, CD1* are applied to the non-inverted signal lines CD0, CD1 of the common data buses CD0*, CD1*.

In other words, it is possible to decide the result of comparing and collating 128-bit read data carried out on a 32-bit unit basis in each test circuit by monitoring the levels of the non-inverted and inverted signal lines of the two sets of common data buses CD0*, CD1* even in the ×128-bit parallel test mode as in the ×32-bit parallel test mode. Since the operating of comparing and collating the read data in the ×128-bit parallel test mode is performed at relatively low speed, the results obtained are, unlike the normal read mode and the ×32-bit parallel test mode which require high speed, transmitted at a so-called CMOS level with the supply voltage of the circuit at high levels and the ground potential of the circuit at low levels.

2.6. Tertiary amplifier

The dynamic RAM of this embodiment is, as mentioned above, provided with the four main amplifier units MAU0-MAU3 correspondingly provided for the main blocks MB0-MB3 and the output terminals of the static amplifiers and the test circuits provided in these main amplifier units are coupled with predetermined combinations to the corresponding four sets of common data buses CD0*-CD3* or CD4*-CD7*. In other words, the output terminals of the static amplifiers and the test circuits provided in the main amplifier units MAU0, MAU2 are coupled to the common data buses CD0*-CD3* and these main amplifier units are selectively activated according to the X-address signal X12. Similarly, the output terminals of the static amplifiers and the test circuits provided in the main amplifier units MAU1, MAU3 are coupled to the common data buses CD4*-CD7* and these main amplifier units are selectively activated according to the X-address signal X12. The common data buses CD0*-CD7* are coupled to unit tertiary amplifiers corresponding to the tertiary amplifier 3SA.

Figure 23:
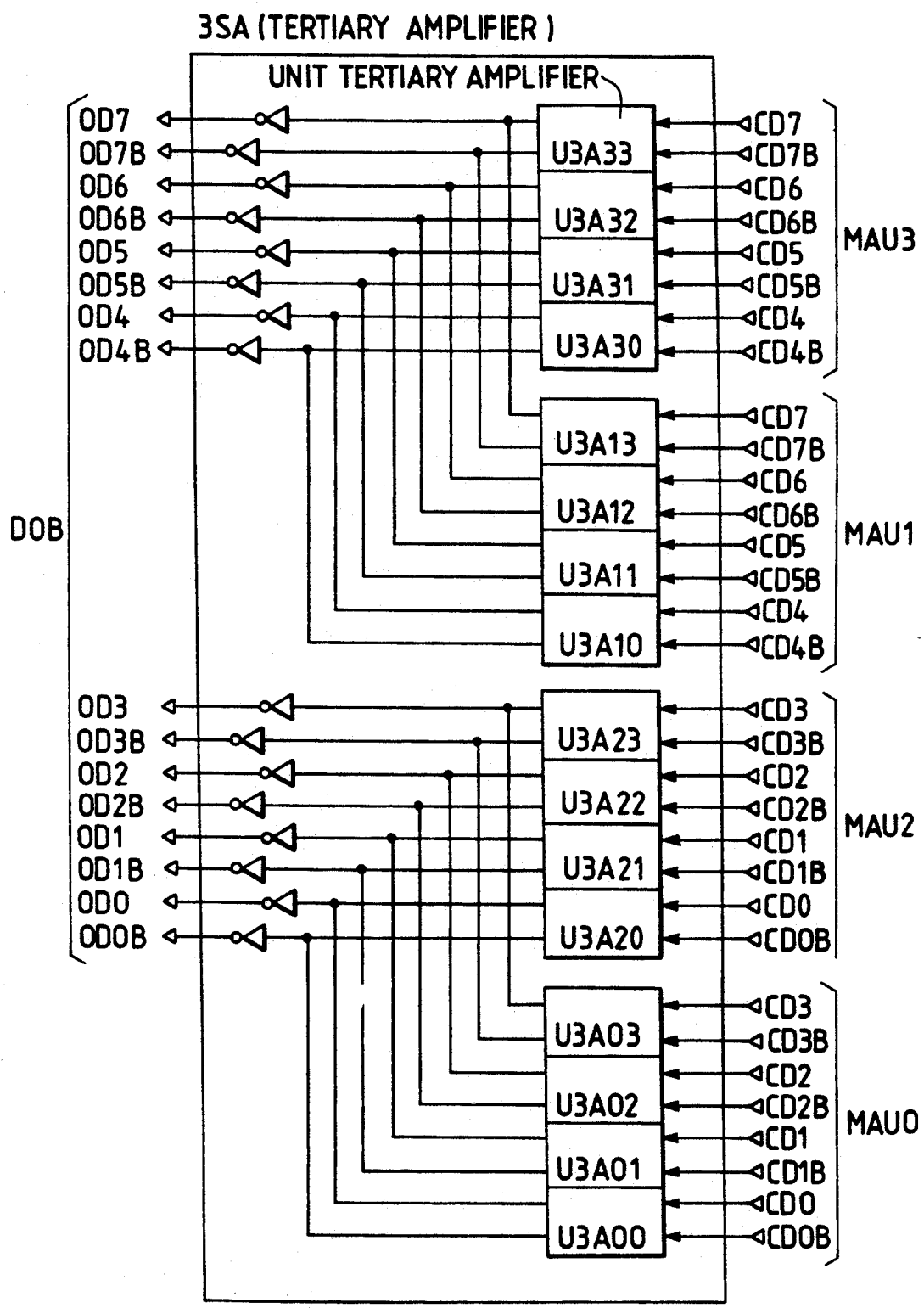
FIG. 23 is a block diagram of a tertiary amplifier in the peripheral circuit of FIG. 6.
Figure 24:
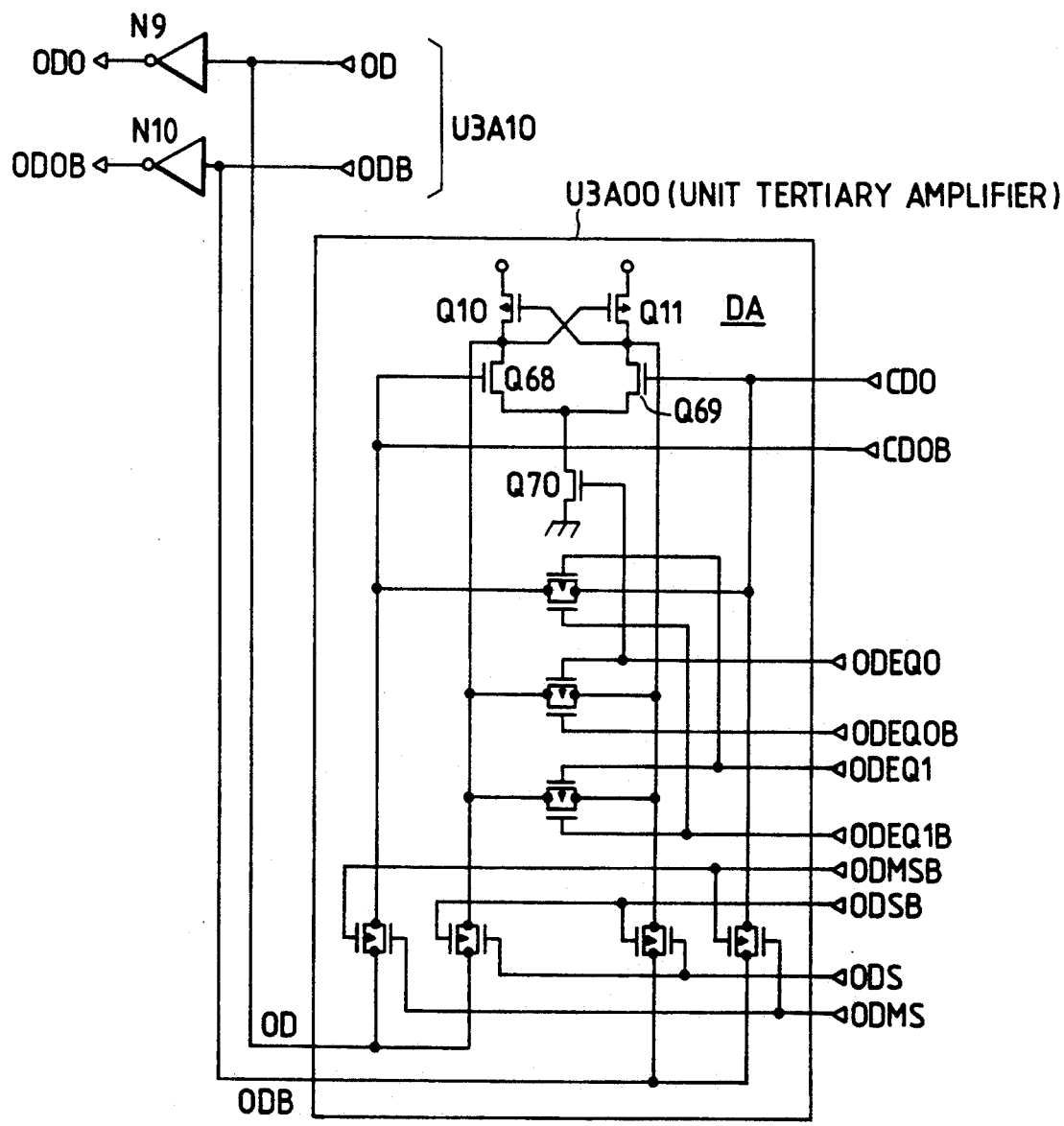
FIG. 24 is a partial circuit diagram of a unit tertiary amplifier in the tertiary amplifier of FIG. 23.

The tertiary amplifier 3SA is, as shown in FIG. 23, provided with 16 unit tertiary amplifiers U3A0-0-U3A03 to U3A30-U3A33 of which four of them correspond to each of the main amplifier units MAU0-MAU3. The non-inverted and inverted input terminals of the unit tertiary amplifiers U3A00-U3A03 are respectively coupled to the non-inverted or inverted signal lines of the common data buses CD0*-CD3* on the main amplifier unit MAU0 side and the non-inverted and inverted input terminals of the unit tertiary amplifiers U3A10-U3A13 are respectively coupled to the non-inverted or inverted signal lines of the common data buses CD4*-CD7* on the main amplifier unit MAU1 side. Similarly, the non-inverted and inverted input terminals of the unit tertiary amplifiers U3A20-U3A23 are respectively coupled to the non-inverted or inverted signal lines of the common data buses CD0*-CD3* on the main amplifier unit MAU2 side and the non-inverted and inverted input terminals of the unit tertiary amplifiers U3A30-U3A33 are respectively coupled to the non-inverted or inverted signal lines of the common data buses CD4*-CD7* on the main amplifier unit MAU3 side.

The non-inverted and inverted output terminals of the unit tertiary amplifiers U3A00-U3A20-U3A23 are commonly coupled together and further coupled via the corresponding invertors to the complementary input terminals of the data output buffer DOB as internal output data lines OD0*-OD3*. Similarly, the non-inverted and inverted output terminals of the unit tertiary amplifiers U3A10-U3A13 to U3A30-U3A33 are commonly coupled together and further coupled via the corresponding invertors to the complementary input terminals of the data output buffer DOB as internal output data lines OD4*-OD7*.

Each of the unit tertiary amplifiers constituting the tertiary amplifier 3SA includes, as represented by the unit tertiary amplifier U3A00, a differential amplifier circuit DA centering around a pair of N-channel MOSFETQ68, Q69 in a differential form. The drains of the differential MOSEFTQ68, Q69 are coupled via a pair of P-channel type cross-coupled loads MOSEFTQ10, Q11 to the supply voltage of the circuit and the commonly coupled sources are coupled via an N-channel MOSFETQ70 for receiving a non-inverted internal control signal ODEQ0 to the ground potential of the circuit. The gates of the differential MOSEFTQ68, Q69 are respectively coupled to the non-inverted and inverted input terminals of the unit tertiary amplifier U3A00, that is, the non-inverted and inverted signal lines of the corresponding common data bus CD0*. Between the non-inverted and inverted signal lines of the common data bus CD0* is an equalizing MOSFET which is selectively held ON according to an internal control signal ODEQ1*. Moreover, the complimentary output node of the differential amplifier circuit DA, that is, the drains of the differential MOSEFTQ68, Q69 are coupled to the non-inverted output terminal OD and inverted output terminal ODB of the unit tertiary amplifier U3A00 via a pair of transmission gate selectively held in the operating condition according to an internal control signal ODS* and shorted via two sets of equalizing MOSFETs selectively held in the operating condition according to an internal control signal ODEQ0* or the internal control signal ODEQ1*. The non-inverted and inverted input terminals of the unit tertiary amplifier U3A00 are cross-coupled to the non-inverted and inverted output terminals further via a pair of transmission gates which are selectively held in the operating condition according to AN internal control signal ODMS*.

In this case, internal control signals ODEQ0*, ODEQ1* and ODS* are selectively made effective according to an X-address signal X12 and at predetermined timing while the dynamic RAM is in the normal read mode or the ×32-bit parallel test mode. Moreover, an internal control signal ODMS* is selectively made effective according to the X-address signal X12 and at predetermined timing while the dynamic RAM is in the ×128-bit parallel test mode.

While the dynamic RAM is in the normal read mode or the ×32-bit parallel test mode, the non-inverted internal control signal ODEQ0 is set at high levels in the unit tertiary amplifier U3A00 to cause the MOSEFTQ70 to be held ON, whereby the differential amplifier circuit DA is held in the operating condition. For this reason, the result of comparing and collating the read signals or data output via the common data bus CD0* is further amplified by the differential amplifier circuit DA before being transmitted via invertors N9, N10 to the unit circuit corresponding to the data output buffer DOB. While the dynamic RAM is in the ×128-bit parallel test mode, on the other hand, the result of comparing and collating the data read by the test circuits T0, T1 is transmitted at the above-mentioned CMOS level. Consequently, the differential amplifier circuit DA remains in the unoperated condition in the unit tertiary amplifier U3A00 and the result of comparing and collating the read data output via the common data bus CD0* is directly inversely applied to the non-inverted and inverted output terminals of the unit tertiary amplifier U3A00 and transmitted to the unit circuit corresponding to the data output buffer DOB via invertors N9, N10.

2.7. Data output buffer

Figure 25:
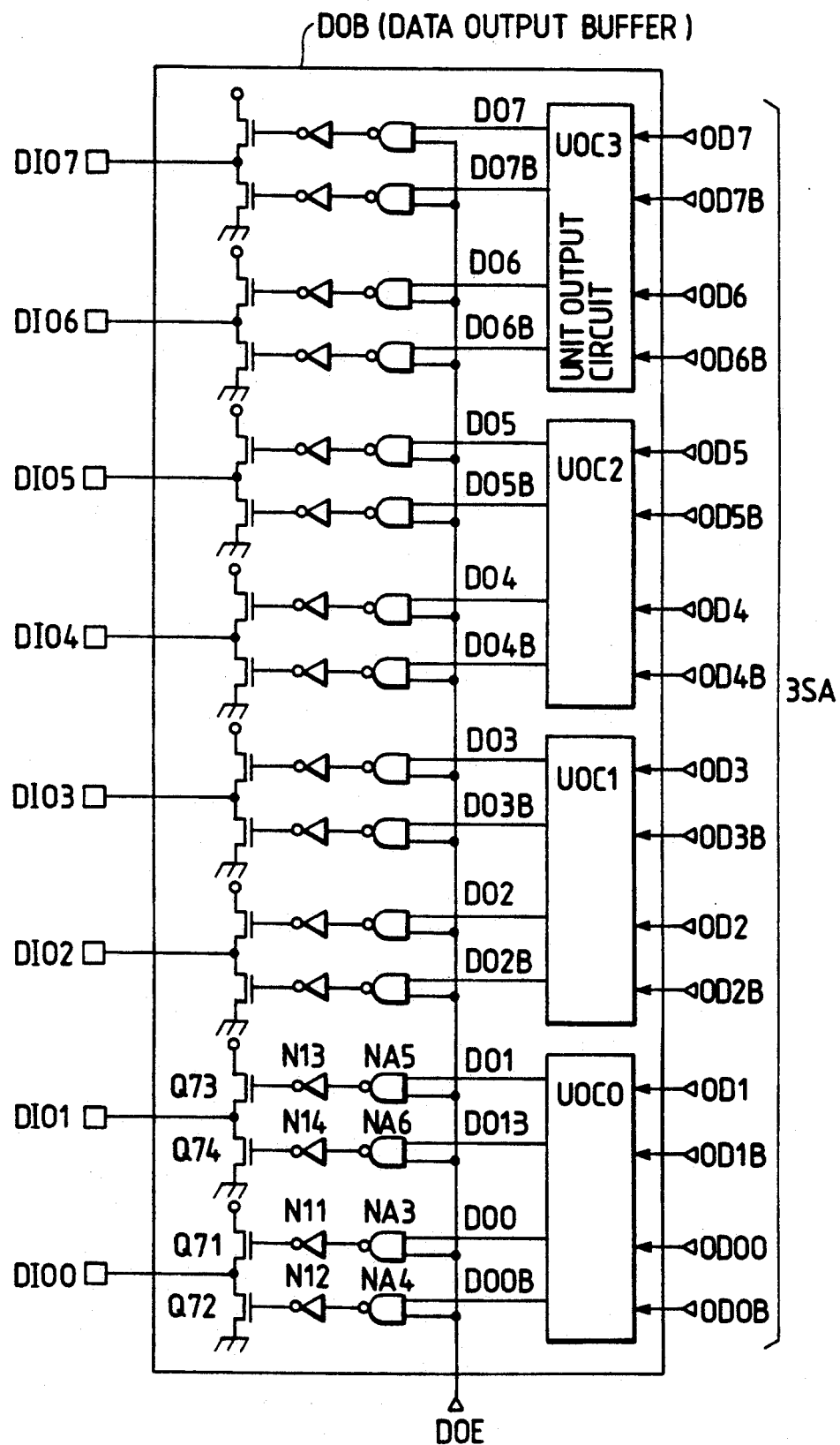
FIG. 25 is a block diagram of a data output buffer in the peripheral circuit of FIG. 6.

The data output buffer DOB is, as shown in FIG. 25, provided with four unit output circuits UOC0-UOC3 provided every two sets of internal output data lines OD0*-OD7*. Two sets of complementary input terminals of the unit output circuits are coupled to the corresponding internal output data lines OD0*, OD1* to OD6*, OD7* and two sets of complementary output terminals DO0*, DO1* to DO6*, DO7* are coupled to one-side input terminals of corresponding NAND gates NA3, NA4 to NA5, NA6. An internal control signal DOE is commonly supplied to the other-side NAND gates NA3-NA6. Moreover, the output signals of these NAND gates are supplied via invertors N11, N12 to N13, N14 to the gates of N-channel type output MOSFETQ71, Q72 to Q73, Q74. The drains and sources of the output MOSFETQ71, Q72 to Q73, Q74 are commonly coupled together and also respectively coupled to corresponding data input/output terminals DIO0-DIO7.

Figure 26:
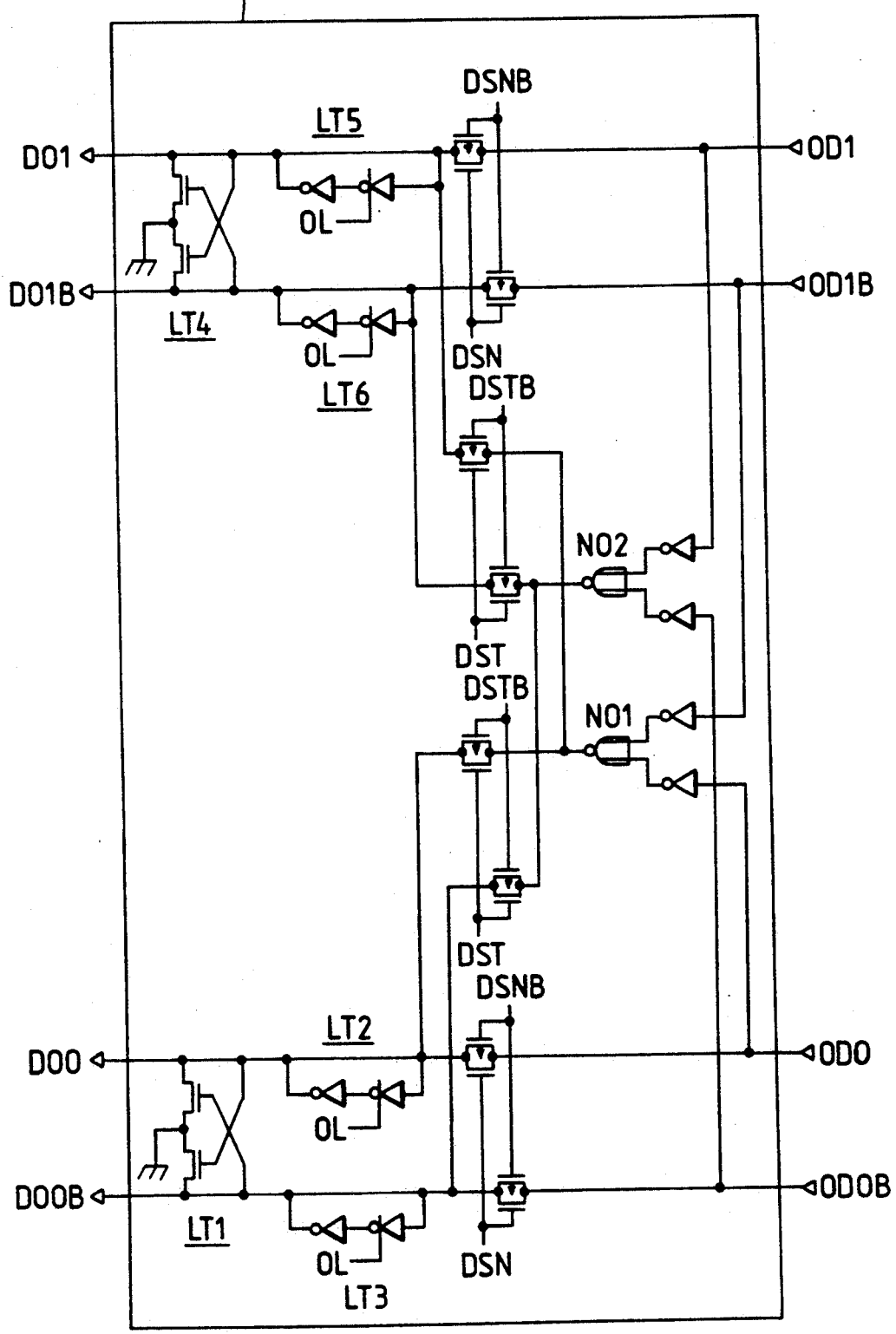
FIG. 26 is a partial circuit diagram of a unit output circuit in the data output buffer of FIG. 25.

Each of the unit output circuits constituting the data output buffer DOB includes, as represented by the unit output circuit UOC0 of FIG. 26, two sets of latch circuits LT2, LT3 to LT5, LT6 coupled to the non-inverted and inverted signal lines of the corresponding internal output data line OD0* or OD1* via a pair of transmission gates whose input/output nodes are selectively held ON according to an internal control signal DSN*, and latch circuits LT1, LT4 having a pair of cross-coupled N-channel MOSFETs and receiving the output signals of the latch circuits LT2, LT3 or LT5, LT6. Each of the latch circuits LT2, LT3 to LT5, LT6 is constructed so that clock invertors are cross-coupled, the clock invertor being selectively set functional in a transmission state by the CMOS invertor according to an internal control signal OL. The input/output nodes of the latch circuits LT2, LT3 to LT5, LT6 are respectively coupled to the non-inverted output terminal DO0, DO1 and the inverted output terminals DO0B, DO1B of a unit output circuit layer OC0 and further coupled to the one-side input terminals of the NAND gates NA3, NA4 to NA4, NA6.

The unit output circuit UOC0 further includes a NOR gate NO1 coupled to the input/output nodes of the latch circuits LT2, LT5 via a pair of transmission gates whose output terminals are selectively held ON according to an internal control signal DST* and a NOR gate NO2 coupled to the input/output nodes of the latch circuits LT3, LT6 via a pair of transmission gates whose output terminals are selectively held ON according to the internal control signal DST*. One input terminal of the NOR gate NO1 is coupled via the invertor to the non-inverted signal line OD0 of the internal output data line OD0* and the other input terminal is coupled via the invertor to the inverted signal line OD1B of the internal output data line OD1*. On the other hand, one input terminal of the NOR gate NO2 is coupled via the invertor to the non-inverted signal line OD0B of the internal output data line OD0* and the other input terminal is coupled via the invertor to the inverted signal line OD1 of the internal output data line OD1*. In this case, the internal control signal DSN* is made effective at predetermined timing while the dynamic RAM is in the normal read mode, whereas the internal control signal DST* is made effective at predetermined timing while the dynamic RAM is in the ×32-bit or ×128-bit parallel test mode. Moreover, the internal control signal OL is set at high levels at a point of time the result of comparing and collating the read signals or data is established while the dynamic RAM is in the normal read mode or ×32-bit or ×128-bit parallel test mode.

While the dynamic RAM is in the normal read mode, the two sets of transmission gates for receiving the internal control signal DSN* function in the transmission state in the unit output circuit UOC0. Consequently, the read signals output from the tertiary amplifier 3SA via the internal output data lines OD0* or OD1* are directly retrieved by the corresponding latch circuits LT2, LT3 to LT5, LT6. When the internal control signal DOE is set at high levels, these read signals are transmitted to the gates of the corresponding outputs MOSFETQ71-Q74 and sent out of the dynamic RAM via the data input/output terminals DIO0-DIO7.

While the dynamic RAM is in the ×32-bit or ×128-bit parallel test mode, the two sets of transmission gates for receiving the internal control signal DST* are set operational in the transmission state in the unit output circuit UOC0. Consequently, the result of comparing and collating the read data output from the tertiary amplifier 3SA via the internal output data lines OD0* or OD1* are transmitted via the corresponding invertor to NOR gates NO1, NO2. As noted above, while the dynamic RAM is in the ×32-bit or ×128-bit parallel test mode, the result of comparing and collating the data read by the test circuits T0, T1 is transmitted as a ternary signal via the corresponding two sets of common data buses CD0*, CD1*. While the dynamic RAM is in the ×32-bit parallel test mode, the non-inverted signal line CD0 of one corresponding common data bus CD0* and the inverted signal line CD1B of the other common data bus CD1* are set at low levels on condition that the read data of the corresponding 8 memory cells thus selected are all logic "0," and the inverted signal line CD0B of one corresponding common data bus CD0* and the non-inverted signal line CD1 of the other common data bus CD1* are set at low levels on condition that the read data are all logic "1." When the read data of the corresponding 8 memory cells thus selected differ by even one bit, the inverted signal lines CD0B, CD1B of the common data buses CD0*, CD1* are simultaneously set at low levels.

On the other hand, while the dynamic RAM is in the ×128-bit parallel test mode, the non-inverted signal line CD0 of one corresponding common data bus CD0* is set at low levels on condition that the read data of the corresponding 32-bit memory cells thus selected are all logic "0," and the non-inverted signal line CD1 of the other common data bus CD1* is set at low levels on condition that the read data are all logic "1." When the logical levels of the read data differ by even one bit, the non-inverted signal lines CD0, CD1 of the common data buses CD0*, CD1* are simultaneously set at low levels. In the 128-bit parallel test mode, the complementary signal of the non-inverted signal line CD0 or CD1 is applied to the inverted signal lines CD0B, CD1B of the common data buses CD0*, CD1*.

When the read data of the corresponding 8 or 32 memory cells thus selected are all logic "0" in each multibit parallel test mode, the output signals of the NOR gate NO1, that is, the non-inverted output signals DO0, DO1 of the unit output circuit UOC0 are set at low levels, whereas the output signals of the NOR gate NO2, that is, the inverted output signals DO0B, DO1B of the unit output circuit UOC0 are set at high levels. As a result, the low level like the ground potential of the circuit is applied to the data input/output terminal DIO0, DIO1. When the read data of the corresponding 8 or 32 memory cells thus selected are all logic "1", the output signals of the NOR gate NO1 are set at high levels, whereas the output signals of the NOR gate NO2 are set at low levels. Therefore, a high level lower by the threshold voltage of the outputs MOSFETQ71, Q73 than the supply voltage of the circuit is applied to the data input/output terminals DIO0, DIO1. If, however, the logical level of the read data of the corresponding 8 or 32 memory cells thus selected differ by even one bit, the output signals of the NOR gates NO1, NO2 are simultaneously set at low levels. Consequently, the outputs MOSFETQ71-Q73 are held OFF and the data input/output terminals DIO0, DIO1 are equally in a high impedance state.

In the ×32- and 128-bit parallel test modes of the dynamic RAM of this embodiment, the result of comparing and collating the read data of 32 or 128 memory cells in total simultaneously selected from two memory blocks MB0, MB1 or MB2, MB3 can be assessed with 8- or 32-bit units at ternary levels by monitoring the logical level of the output data from the data input/output terminals DIO0-DIO7 every two bits at a time. Consequently, it becomes possible to reduce the number of manhours for testing a dynamic RAM having a relatively large storage capacity like 64 megabits. While the dynamic RAM is in the normal read mode, the read data of the 8 memory cells in total simultaneously selected from the memory blocks MB0, MB1 or MB2, MB3 are needless to say output on an 8 bit basis via the corresponding data input/output terminals DIO0-DIO7.

2.8. Y-address decoder

Figure 27:
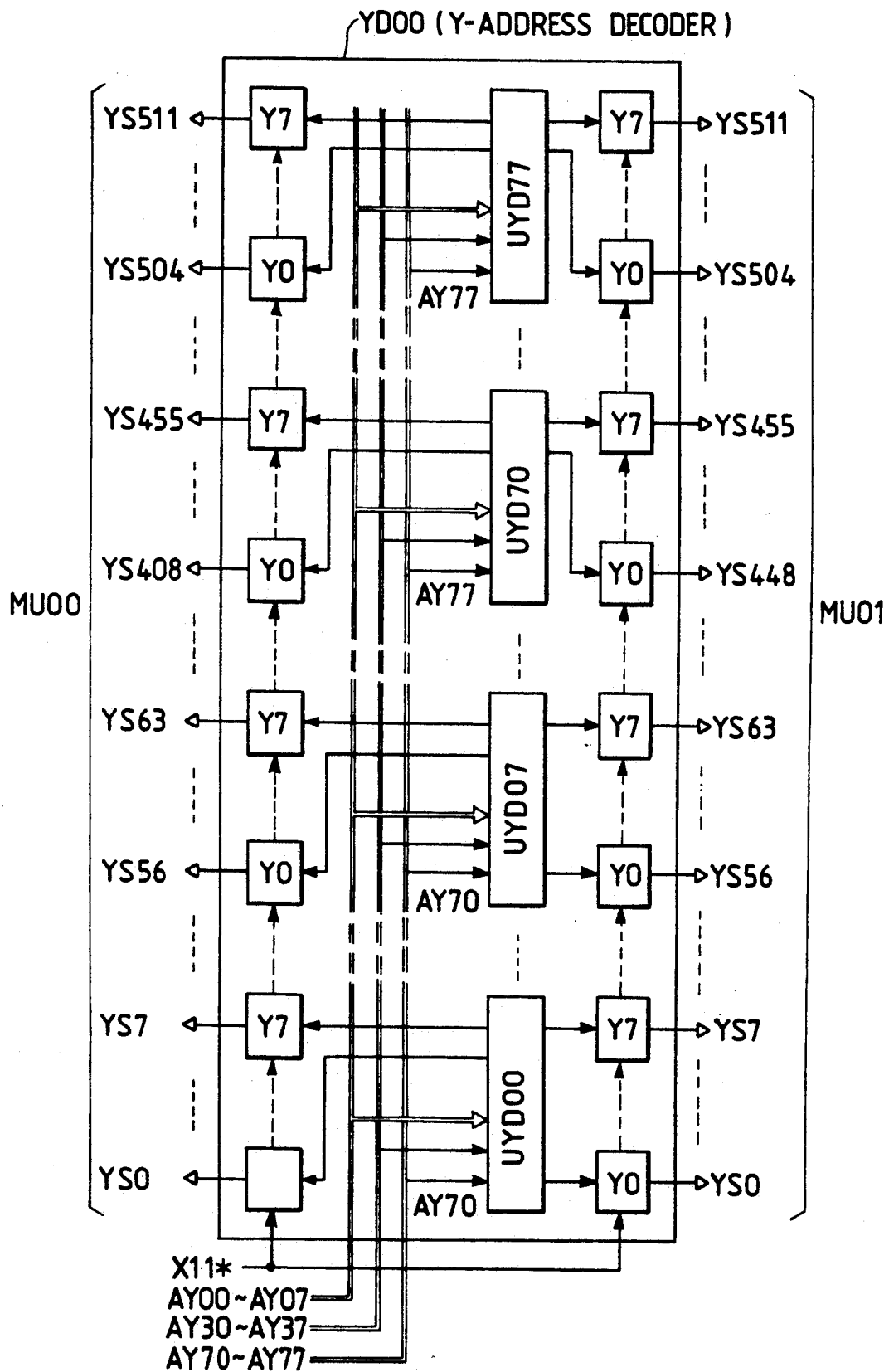
FIG. 27 is a block diagram of a Y-address decoder in the memory block of FIG. 3.

The dynamic RAM of this embodiment is provided with 8 Y-address decoders YD00-YD01 to YD30-YD31 in total with two of them for each of the memory blocks MB0-MB3 correspondingly. Each of the Y-address decoders is, as represented by the Y-address decoder YD00 of FIG. 27, provided with 64 unit Y-address decoders UYD00-UYD07 to UYD70-UYD77 with 8 of them for each of the memory mats of the main amplifier units MAU0, MAU1, and 1,024 bit line selection circuits Y0-Y7 with 16 of them for each of the unit Y-address decoders correspondingly. Predecode signals AY00-AY07, AY30-AY37 and AY70-AY77 are selectively supplied from Y-predecoders YPD1-YPD3 to the unit Y-address decoders UYD00-UYD07 with predetermined combinations. In addition, output signals corresponding to the unit Y-address decoders UYD00-UYD07 to UYD70-UYD77 are supplied to the respective bit selection circuits Y0-Y7 and an internal address signal X11* is commonly supplied thereto.

Figure 28:
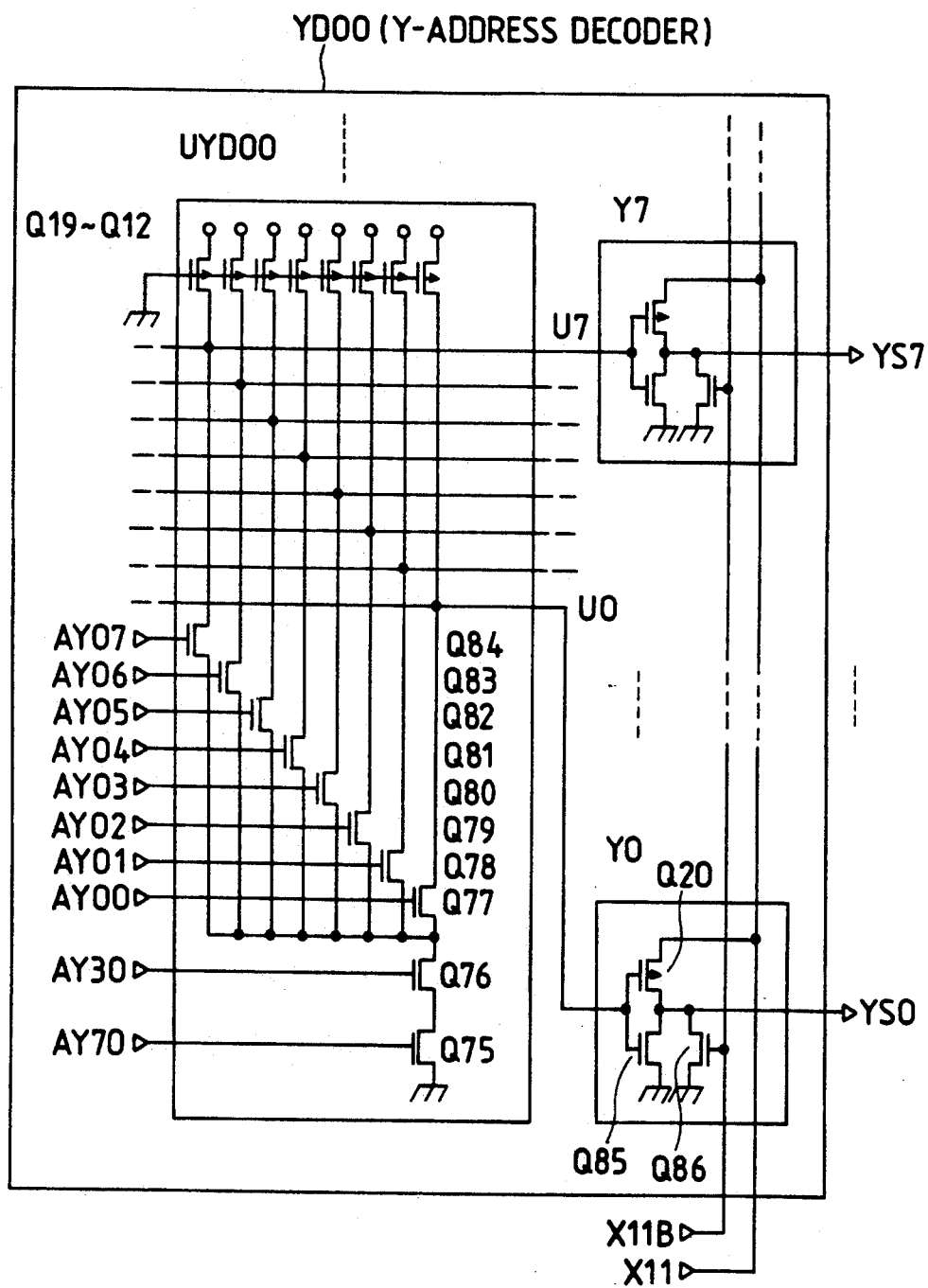
FIG. 28 is a partial circuit diagram of a unit Y-address decoder in the Y-address decoder of FIG. 27.

Each of the unit Y-address decoders constituting the Y-address decoder YD00 includes, as represented by the unit Y-address decoder UYD00 of FIG. 28, 8 P-channel MOSEFTQ12-Q19 and 10 N-channel MOSFETQ7 -Q84 in a series form. Of these MOSFETs, MOSEFTQ12-Q19 are constantly held ON as their gates are coupled to the ground potential of the circuit. Moreover, the gates of MOSEFTQ77-Q84 are sequentially supplied with the predecode signals AY00-AY07, whereas the gates of MOSEFTQ76, Q75 are respectively supplied with the corresponding predecode signals AY30, AY70. Needless to say, the predecode signals AY30-AY37 are sequentially alternately supplied to the gates of 8 unit Y-address decoders UYD00-UYD07 to UYD70-UYD77 of the MOSEFTQ76 correspondingly provided for the respective memory mats and the predecode signals AY70-AY77 are commonly supplied to the gates of respective unit Y-address decoders UYD00-UYD07 to UYD70-UYD77 of the MOSEFTQ75. The drains of MOSEFTQ12, Q77 to Q19, Q84 commonly coupled together are made output nodes U0-U7 of the unit Y-address decoder UYD00 and commonly coupled to the two input terminals correspondingly to those among the bit selection circuits Y0-Y7.

As a result, the output node U0 of the unit Y-address decoder UYD00 is set at high levels like the supply voltage of the normal circuit and while the predecode signals AY00, AY30 to AY70 simultaneously remain at high levels, selectively set at low levels like the ground potential of the circuit. Moreover, the output node U7 of the unit Y-address decoder UYD00 is selectively set at low levels when the predecode signals AY07, AY30 to AY70 are simultaneously set at high levels. Similarly, the output nodes U0-U7 of the unit Y-address decoder UYD07, for instance, are selectively set at low levels when the corresponding predecode signals AY00-AY07, AY37 and AY70 are simultaneously set at high levels and the output nodes U0-U7 of the unit Y-address decoders UYD70-UYD77, for instance, are selectively set at low levels when the corresponding predecode signals AY00-AY07, AY30-AY37 and AY77 are simultaneously set at high levels.

The output signal U0 of the unit Y-address decoder UYD00 is supplied to the P-channel MOSEFTQ20 and the gate of the N-channel MOSFET85 of the bit line selection circuit Y0. The source of MOSEFTQ20 is commonly coupled to an inverted internal address line X11B on the memory unit MU00 side and to a non-inverted internal address signal line X11 on the memory unit MU01 side. The drains of MOSEFTQ20 and Q85 that are commonly coupled together are coupled via N-channel MOSFETQ86 to the ground potential of the circuit and also to the corresponding bit selection signals YS0-YS7 respectively. The gate of MOSEFTQ86 is commonly coupled to the non-inverted internal address signal line X11 on the memory unit MU00 side and also to the inverted internal address signal line X11B on the memory unit MU01 side. As a result, the low levels of the output signals of the unit Y-address decoder UYD00 are inversely transmitted via the selectively corresponding bit line selection circuits Y0-Y7 to make high-level bit line selection YS0-YS7 on condition that, for instance, the X-address signal X11 is logic "0" on the memory unit MU00 side and otherwise logic "1" on the memory unit MU01 side.

In this embodiment, the predecode signals AY70-AY77 are alternatively set at high levels according to the Y-address signals Y7-Y9 while the dynamic RAM is in the normal read or write mode. Moreover, four bits are simultaneously set at high levels according to the Y-address signal Y7 while the dynamic RAM is in the ×32-bit parallel test mode and 8 bits are simultaneously set at high level, irrespective of the Y-address signals Y7-Y9, while the dynamic RAM is in the ×128-bit parallel test mode. As a result, one out of the 8 activated memory mats of the activated memory unit is alternatively connected to the write or read system circuit in the normal read or write mode. Moreover, four memory mats are selectively connected to the write or read system circuit in the ×32-bit parallel test mode and all of the 8 activated memory mats are connected to the write or read system circuit in the ×128-bit parallel test mode. The system of selecting the column series of the dynamic RAM is thus achieved.

3. Summary and features of each operating mode of dynamic RAM

Figure 29:
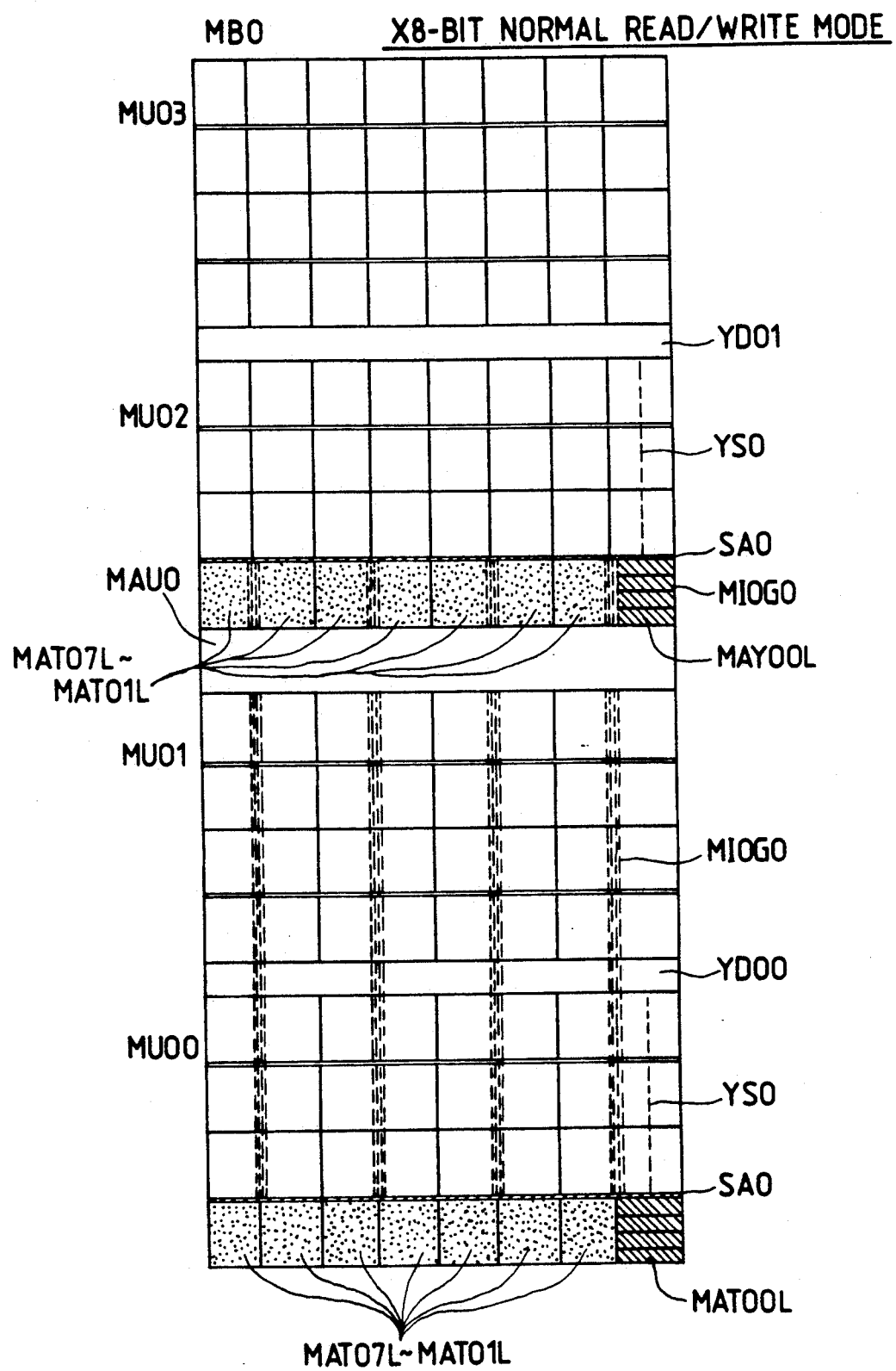
FIG. 29 is a connection diagram in the normal write or read mode of the memory block in the dynamic RAM of FIG. 1.
Figure 30:
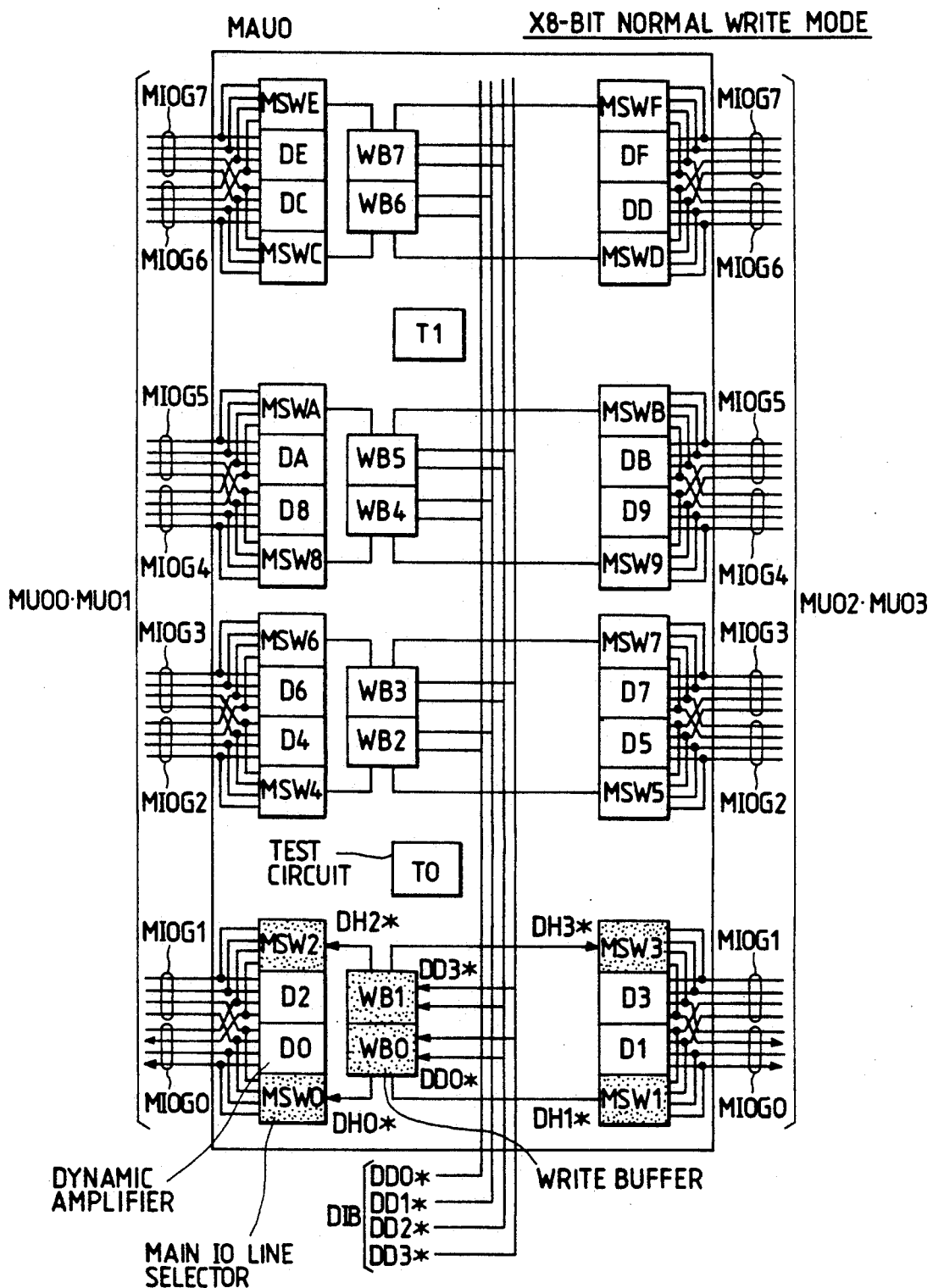
FIG. 30 is a connection diagram in the normal write mode of the main amplifier unit in the dynamic RAM of FIG. 1.
Figure 31:
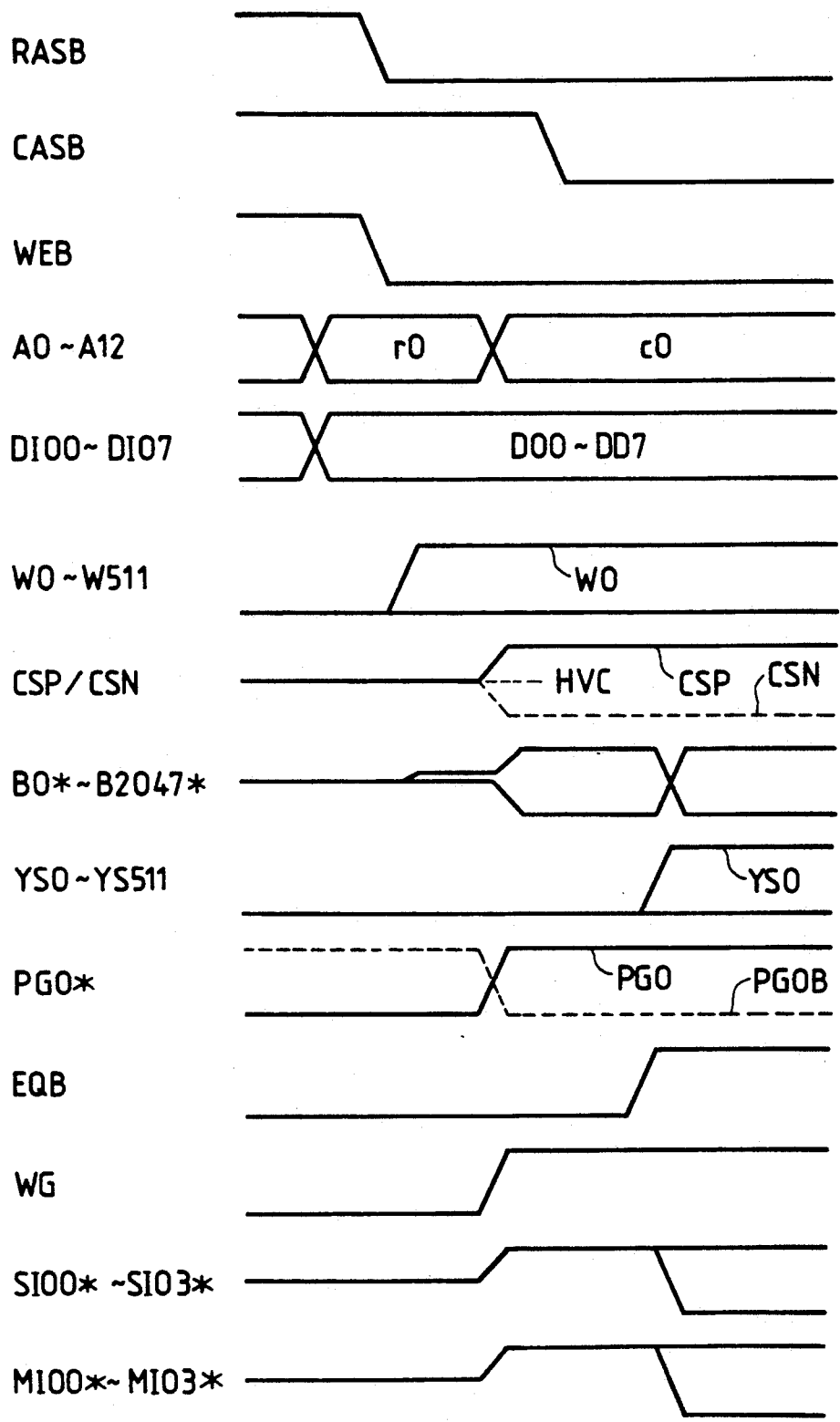
FIG. 31 is a signal waveform chart in the normal write mode of the dynamic RAM of FIG. 1.
Figure 32:
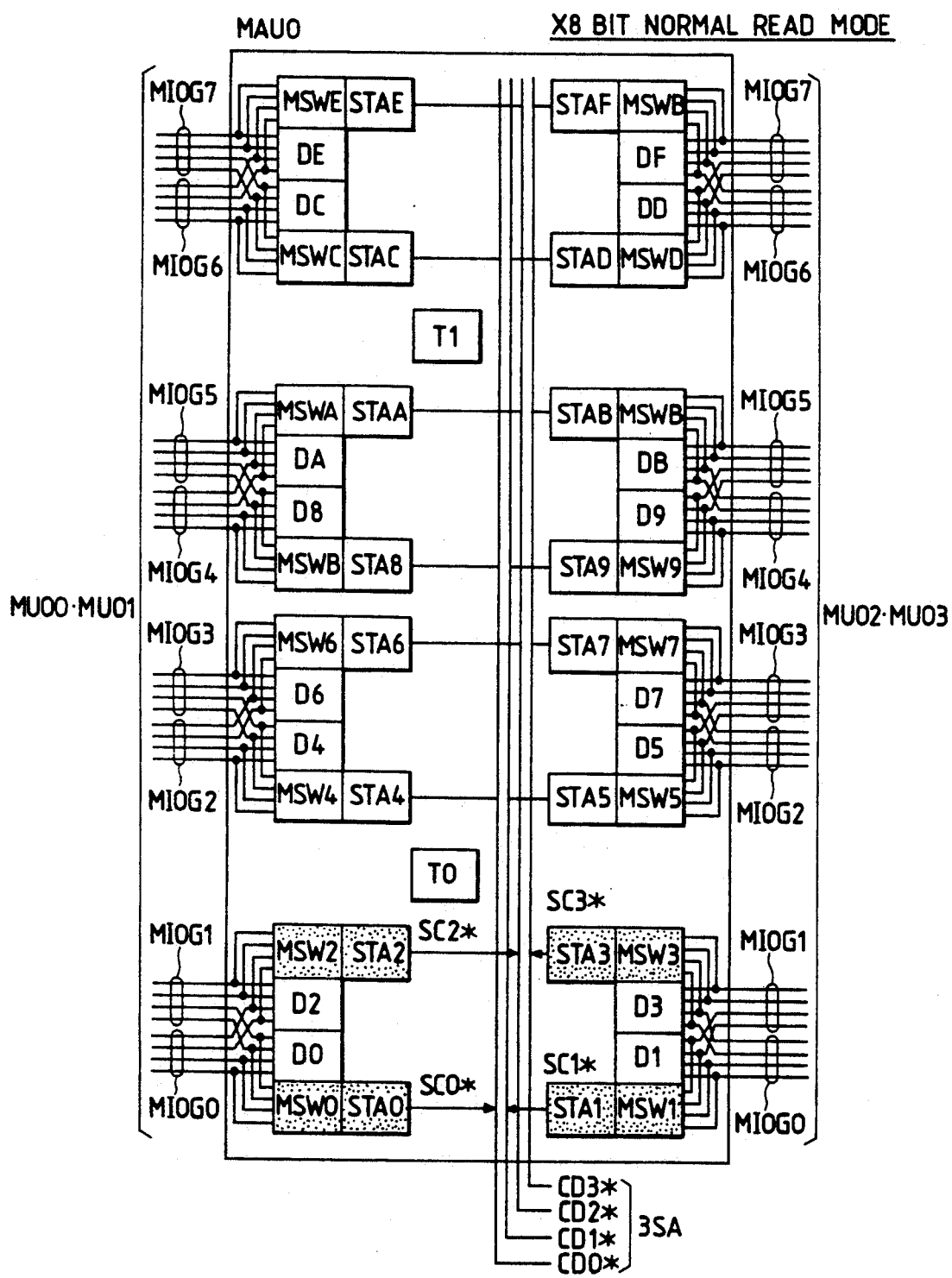
FIG. 32 is a connection diagram in the normal read mode of the main amplifier unit in the dynamic RAM of FIG. 1.
Figure 33:
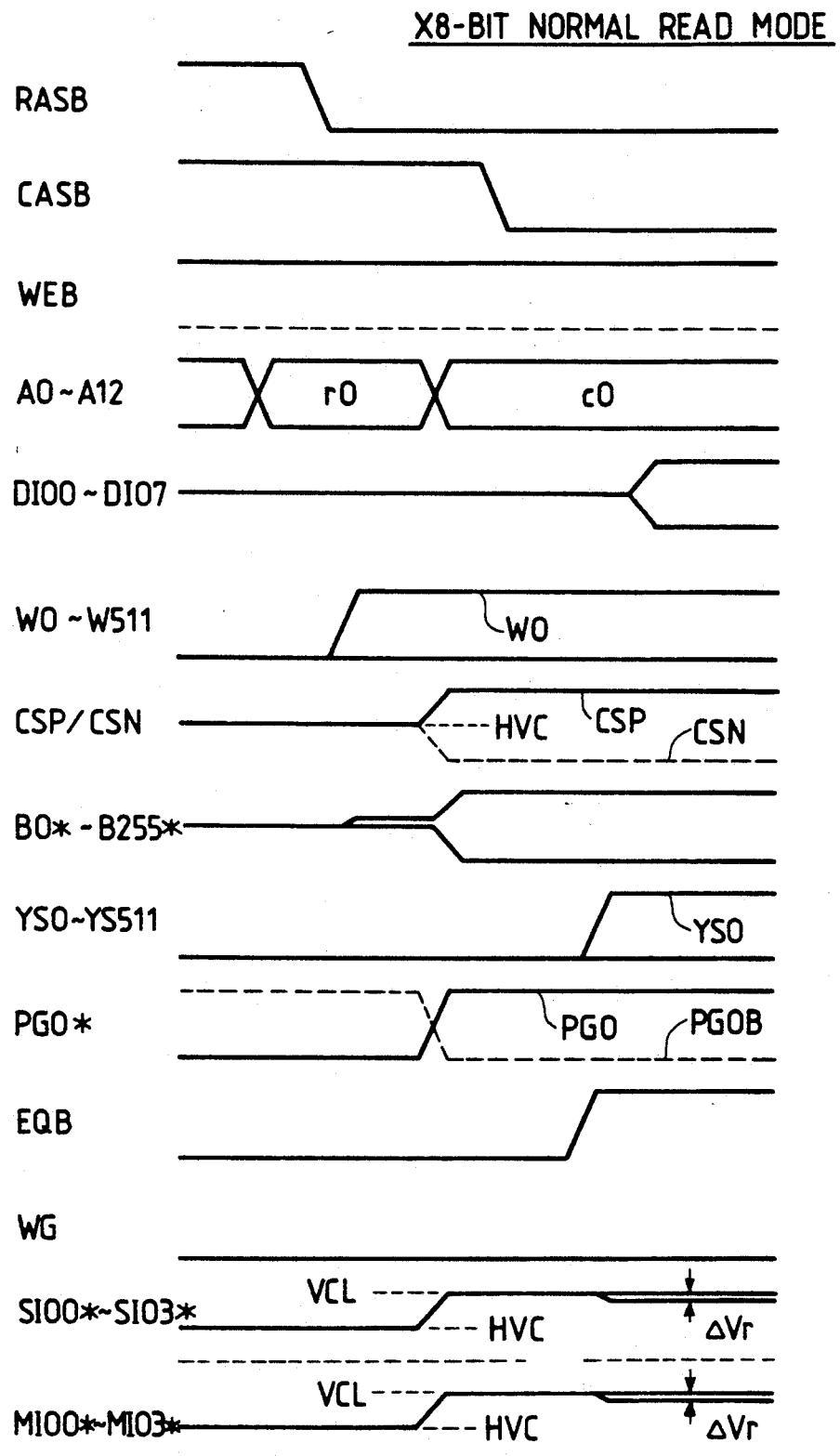
FIG. 33 is a signal waveform chart in the normal read mode of the dynamic RAM of FIG. 1.
Figure 34:
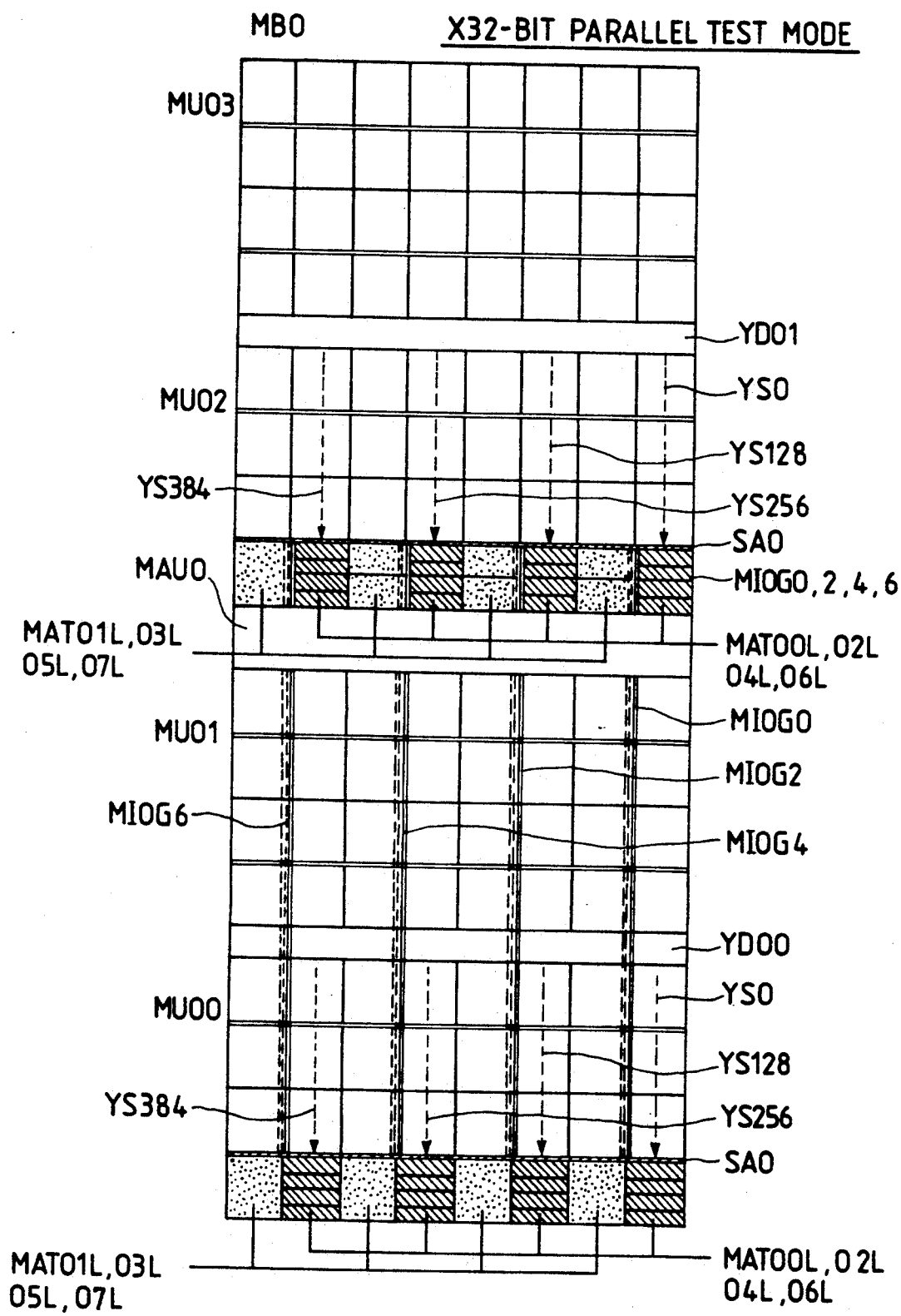
FIG. 34 is a connection diagram in the ×32-bit parallel test mode of the memory block in the dynamic RAM of FIG. 1.
Figure 35:
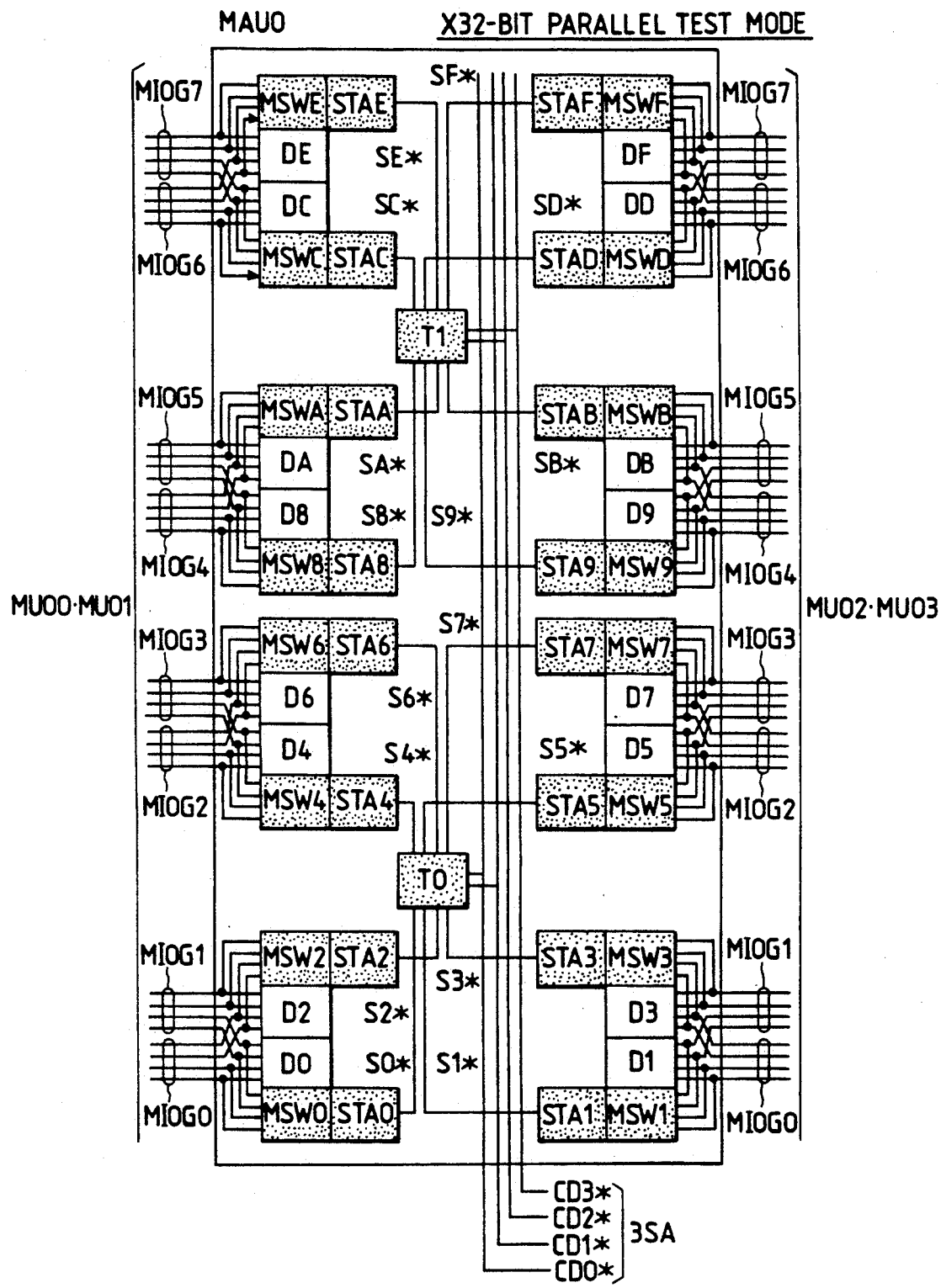
FIG. 35 is a connection diagram in the ×32-bit parallel test mode of the main amplifier unit in the dynamic RAM of FIG. 1.
Figure 36:
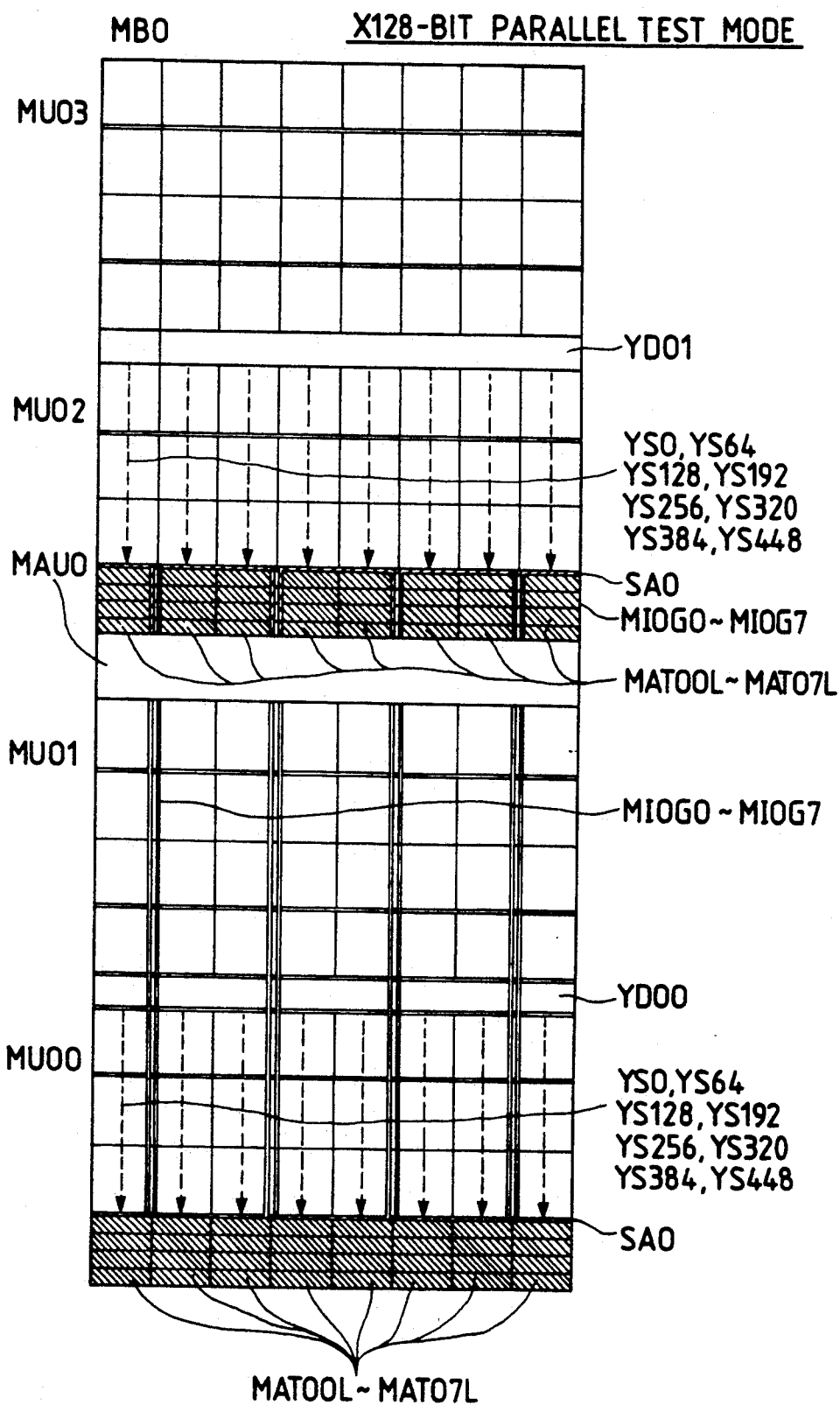
FIG. 36 is a connection diagram in the ×128-bit parallel test mode of the memory block in the dynamic RAM of FIG. 1.
Figure 37:
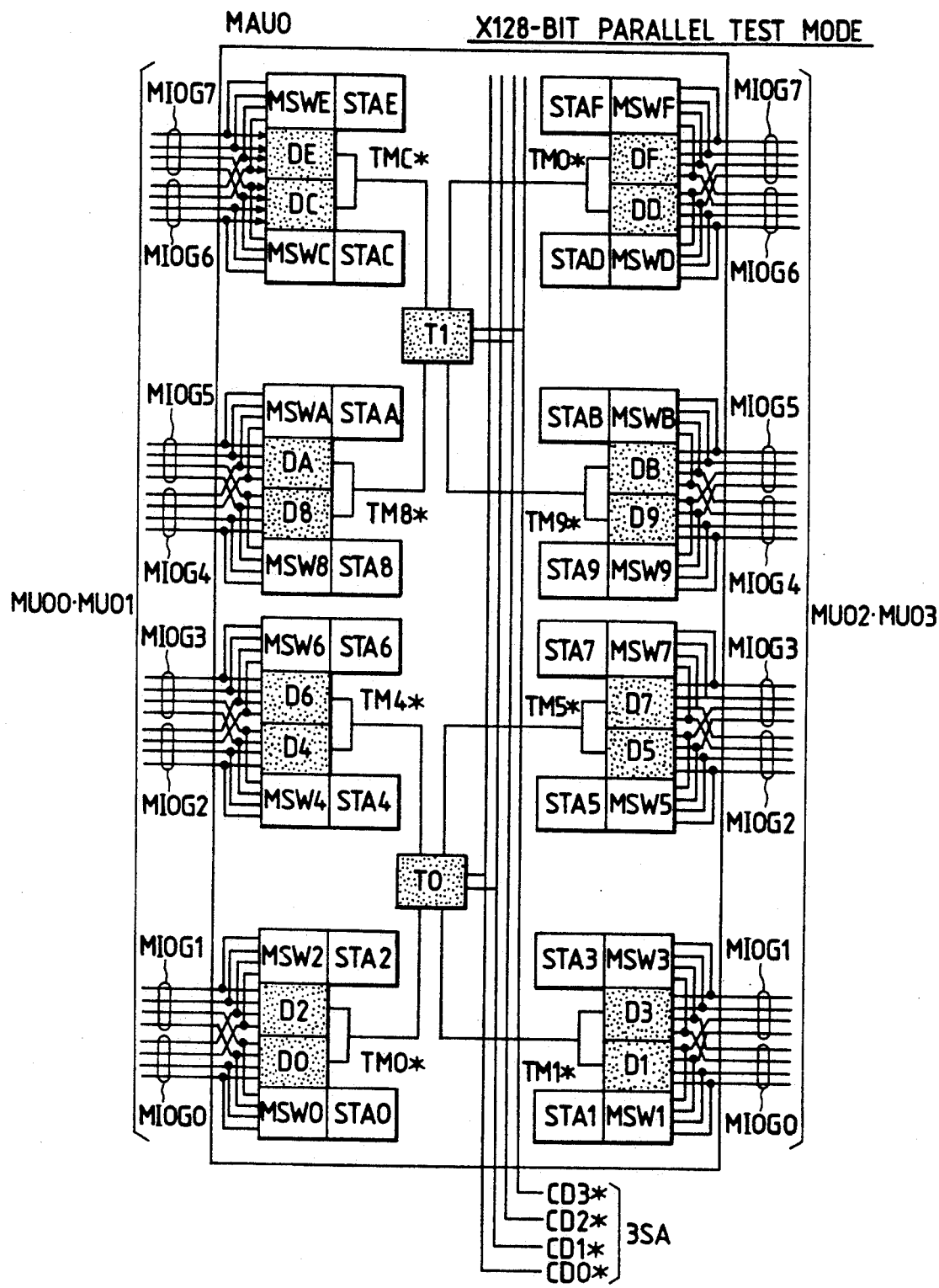
FIG. 37 is a connection diagram in the 128 bits parallel test mode of the main amplifier unit in the dynamic RAM of FIG. 1.

FIG. 29 is a connection diagram in the normal write or read mode of the memory block MB0 in the dynamic RAM of FIG. 1. FIGS. 30 and 31 are a connection diagram and a signal waveform chart in the normal write mode of the main amplifier unit MAU0 in the dynamic RAM of FIG. 1. FIGS. 32 and 33 are a connection diagram and a signal waveform chart in the normal read mode. FIGS. 34 and 35 are connection diagrams in the ×32-bit parallel test mode of the memory block MB0 and the main amplifier unit MAU0 in the dynamic RAM of FIG. 1. FIGS. 36 and 37 are connection diagrams in the ×128-bit parallel test mode. Referring to these drawings, a description will subsequently given of the pigeonholed profile and features of each operating mode of a dynamic RAM embodying the present invention. Although reference will be made to mainly the memory block MB0 and the main amplifier unit MAU0 by way of example, the remaining memory blocks MB1-MB3 and those main amplifier units MAU1-MAU3 are left to the reader to understand by analogy.

3.1 Normal write mode

The dynamic RAM is, as shown in FIG. 31, set functional in the write mode when the column address strobe signal CASB and the write enable signal WEB are set at low levels as the row address strobe signal RASB is set at low levels. At this time, the 13-bit X-address signals X0-X12 are supplied to the address input terminals A0-A12 in synchronization with the row strobe signal RASB in such a combination that the leading row address r0 is specified, for instance, is specified and the 10-bit Y-address signals Y0-Y9 are supplied thereto in synchronization with the column strobe signal CASB in such a combination that the leading column address c0 is specified. Then 8-bit write data DD0-DD7 are supplied to the data input/output terminals IO0-DI07 and these write data are transmitted from the data input buffer DIB via the input data buses DD0*-DD7* to the main amplifier units MAU0-MAU3.

In the dynamic RAM, the word lines W0 included in the 8 memory mats MAT00L-MAT07L of the two memory units MU00, MU02 in the memory blocks MB0, MB1, for instance, are set functional in the selective state as illustrated in FIG. 29 in response to the fall of the row address strobe signal RASB. Consequently, these memory mats and the memory units are selectively activated and the memory blocks MB0, MB1 are also activated.

In the dynamic RAM, the internal control signal WG is, as shown in FIG. 31, set at high levels at predetermined timing and the levels of the common source lines CPS, CSN are varied from the intermediate potential HVC to the supply voltage or ground potential of the circuit little later. Further, the internal control signal PG0* for connecting the sub-IO lines SIO0*-SIO3* corresponding to the activated memory mats MAT00L-MAT07L of the memory units MU00, MU02 to the main IO lines MIO0*-MIO3* is selectively made effective. In these memory mats, infinitesimal read signals are applied from a total of 2,048 memory cells connected to the selected word lines WO to the bit lines B0*-B2047* in conformity with the data held therein. In the sense amplifier SA0 of each memory unit, moreover, the shared MOSEFTs on the left-hand side are simultaneously held ON and connected to the unit circuits corresponding to the sense amplifier SA0 corresponding to the bit lines B0*-B2047* of the memory mats MAT00L-MAT07L. Before being changed to high- or low-level binary read signals, the infinitesimal read signals applied to the bit lines B0*-B2047* are amplified by the unit amplifier circuits corresponding to each sense amplifier SA0 when the supply voltage and the ground potential of the circuit are supplied to the common source lines CSP, CSN.

When the internal control signal PG0* is made effective in the path gates PG00-PG07 of the memory units MU00, MU02, the switches MOSEFTQ1, Q2 to Q51, Q52 are held ON. As illustrated in FIG. 29, the sub-IO lines SIO0*-SIO3* correspondingly provided for the memory mats MAT00L-MAT07L of the main amplifier unit MAU0, MAU2 memory units MU00, MU02 is connected to the main IO lines MIO0*-MIO3* and further to the main IO line selectors MSW0-MSWF corresponding to the main amplifier unit MAU0. Moreover, the pull-up MOSEFTs provided in the equalizing circuits EQ1-EQ4 of each path gate are held OFF when the internal control signal WG is set at high levels so as to prohibit the pull-up operation of the sub-IO lines during the following write operation.

When the sub-IO lines and the main IO lines are connected, the common source line CSP is set at high levels and the equalizing MOSEFTs provided in the equalizing circuits EQ1-EQ4 of the corresponding path gates are held ON, whereby the sub-IO lines SIO0*-SIO3* are charged at high levels like the supply voltage of the circuit, whereas the main IO lines MIO0*-MIO3* are also charged at high levels when the equalizing circuit EQ5 of the corresponding main IO line selector. The power consumption of the dynamic RAM can thus be minimized to the extent that it is ignorable by holding the sub-IO and main IO lines connected and the operation of raising the amplifying operation of the sense amplifier can be hastened as the level of the common source line CSP is restrained from lowering by connecting the sub-IO and main IO lines commonly.

Subsequently, the internal control signal EQB is set at high levels and the bit line selection signal YS0 is alternatively set at high levels according to the Y-address signals Y0-Y5 to Y7-Y9. Therefore, four sets of the complementary bit lines designated by the memory mats MAT00L of the memory units MU00, MU02 are selected and coupled to the main amplifier unit MAU0 via the corresponding sub-IO lines SIO0*-SIO3* and the main IO lines MIO0*-MIO3*. As shown by slant lines of FIG. 29, the memory mats MATOOL of the memory units MU00, MU02 are set functional in the selective state and four memory cells out of them are set functional in the selective state.

As illustrated in FIG. 30, two write buffer WB0, WB1 and four main IO line selectors MSW0-MSW3 in the main amplifier unit MAU0 are held in the operating condition. Then two sets of main IO lines MIO0*, MIO2* on the memory unit MU00 side and two sets of main IO lines MIO0*, MIO2* on the memory unit MU02 side are selected by the main IO line selectors MSW0-MSW3 according to the Y-address signal Y6, Y7. As a result, four out of the 8 memory cells selected in the memory mats MAT00L of the memory units MU00, MU02 are further selected and connected via the corresponding main IO line selectors MSW0-MSW3 to the write buffers WB0, WB1.

In the main amplifier unit MAU0, 2-bit write data supplied via the input data buses DD0*, DD1* are transmitted via the write buffer WB0 to the main IO line selectors MSW0, MSW1 and further written to the selected two sets of memory cells of the memory mats MAT00L of the memory unit MU00 via the selected two sets of main IO lines MIO0*, MIO2* and that of sub-IO lines SIO0*, SIO2* and the corresponding two sets of complementary bit lines B0*, B2*. Similarly, 2-bit write data supplied via the input data buses DD2*, DD3* are transmitted via the write buffer WB1 to the main IO line selectors MSW2, MSW3 and further written to the selected two sets of memory cells of the memory mats MAT00L of the memory unit MU02 via the selected two sets of main IO lines MIO0*, MIO2* and that of sub-IO lines SIO0*, SIO2* and the corresponding two sets of complementary bit lines B0*, B2*. The write operations noted above are also performed in the main amplifier unit MAU1 and the memory block MB1, whereby the operation of writing 8-bit write data with respect to a total of 8 memory cells is implemented in parallel. Although a description has been given of an early write mode regarding the write operation above, the write operation in a delay write mode is left to the reader to understand by analogy likewise.

3.2. Normal read mode

The dynamic RAM is, as shown in FIG. 33, set functional in the read mode when the write enable signal WEB are set at high levels as the row address strobe signal RASB is set at low levels. What makes the read mode different from the above-mentioned write mode will additionally be described.

In the dynamic RAM, the word lines WO included in the memory mats MAT00L-MAT07L of the memory units MU00, MU02 are selectively held in the operating condition in response to the rise of the row address strobe signal RASB and infinitesimal read signals are applied from the 2,048 memory cells coupled to the work lines WO to the corresponding bit lines B0*-B2047* according to the data thus held. Before being changed to high- or low-level binary read signals, these infinitesimal read signals are amplified by the unit amplifier circuits corresponding to the sense amplifier SA0 when the supply voltage and the ground potential of the circuit are supplied to the common source lines CSP, CSN. At the path gates PG00-PG07 of the memory units MU00, MU02, the 64 sets of sub-IO lines SIO0*-SIO3* in total corresponding to the memory mats MAT00L-MAt07L are connected to the main IO lines MIO0*-MIO3* constituting the main IO line groups MIOG0-MIOG7 and when the internal control signal WG is set at low levels, the equalizing circuits EQ1--EQ4 of each path gate allow the sub-IO lines SIO0*-SIO3* to continue the pull-up operation.

Subsequently, the internal control signal EQB is set at high levels and the bit line selection signal is set at high levels slightly later. Consequently, the corresponding four sets of complementary bit lines B0*-B3* are selected from the memory mats MAT00L of the memory unit MU00, MU02 and connected to the main amplifier unit MAU0 via the corresponding sub-IO lines SIO0-

*-SIO3* and the main IO lines MIO0*-MIO3*. Therefore, predetermined read signals ΔVr are obtainable on the non-inverted and inverted signal lines of the sub-IO and main IO lines as shown in FIG. 33, the read signals being produced by precharging the binary read signals established on the four sets of complementary bit lines B0*-B3* in proportion to the ratio of the parasitic capacity of each complementary bit line to that of the sub-IO and main IO lines.

In the main amplifier unit MAU0, on the other hand, the four main IO line selectors MSW0-MSW3 and the static amplifiers STA0-STA3 are held in the operating condition at this time as shown in FIG. 32. Then the two sets of main IO lines MIO0*, MIO2* constituting the main IO line group MIOG0 on the memory unit MU00 side and the two sets of main IO lines MIO0*, MIO2* constituting the main IO line group MIOG0 on the memory unit MU02 side are connected to the corresponding to the static amplifiers STA0-STA3. As a result, the read signals ΔVr transmitted via the main IO lines MIO0*, MIO2* are amplified by the corresponding static amplifiers STA0-STA3 and applied to the common data buses CD0*-CD3* as the output signals SC0*-SC3*. These read signals together with other read signals output from the main amplifier unit MAU1 via the common data buses CD4*-CD7* are further amplified by the unit tertiary amplifier corresponding to the tertiary amplifier 3SA before being sent out of the dynamic RAM via the data input/output terminal DIO0-DIO7.

3.3. ×32-bit parallel test mode

The dynamic RAM of this embodiment is set functional in the ×32-bit parallel test mode when the WCBR cycle is executed and when the data input/output terminal DIO3 is set at high levels. The dynamic RAM keeps holding this test mode until the CBR or RAS only refresh cycle is subsequently executed and executes all the writ or read cycles during that time with 32 bits as a unit.

In the ×32-bit parallel test mode of the dynamic RAM, the memory units MU00, MU02 of the memory blocks MB0, MB1, for instance, are activated as shown in FIG. 34 and the 8 memory mats MAT00L-MAT07L, for instance, of each memory unit are also activated. At this time, bit line selection signals YS0, YS128, YS256 and YS384 that are selectively set at high levels according to the internal address signal Y7 are supplied from the Y-address decoder YD00 or YD01 to the sense amplifiers SA0 of the memory units MU00, MU02. Consequently, 16 sets of complementary bit lines in total corresponding to the memory mats MAT00L, MAT02L, MAT04L and MAT06L are selected and connected to the main amplifier unit MAU0 via the corresponding sub-IO lines SIO0*-SIO3* and the main IO lines MIO0*-MIO3* constituting the main IO line groups MIOG0, MIOG2, MIOG4 and MIOG6.

In the main amplifier unit MAU0, 16 main IO line selectors MSW0-MSWF and the static amplifiers STA0-STAF are simultaneously held in the operating condition as illustrated in FIG. 35. Then the 16 sets of main IO lines MIO0*, MIO0* and MIO2* in total with two sets as a combination are selected by the these main IO line selectors from the main IO line groups MIOG0, MIOG2, MIOG4 and MIOG6 on the sides of the memory units MU00, MU02 and connected to the corresponding static amplifiers STA0-STAF. The output signals of the static amplifiers STA0-STAF are compared and collated by the test circuits T0, T1 on an 8-bit basis and before being transmitted to the tertiary amplifier 3SA, the results thus obtained are applied as ternary level signals to the common data buses CD0*, CD1* and CD2*, CD3* as mentioned above. The test operation above is performed in the main amplifier unit MAU1 of the memory block MB1 likewise, whereby 32 bits of read data are exactly compared and collated. The write operation in the ×32-bit parallel test mode is also performed on a 32-bit basis by simultaneously holding the 8 write buffers WB0-WB7 provided in the main amplifier units MAUO, MAU1 in the operating condition.

3.4. ×128-bit parallel test mode

The dynamic RAM is set functional in the ×128-bit parallel test mode when the WCBR cycle is executed and when the data input/output terminal DIO3 is set at low levels. The dynamic RAM keeps holding this test mode until the CBR or RAS only refresh cycle is subsequently executed and executes all the writ or read cycles during that time with 128 bits as a unit.

In the ×128-bit parallel test mode of the dynamic RAM, the memory units MU00, MU02 of the memory blocks MB0, MB1, for instance, are activated as shown in FIG. 36 and the 8 memory mats MAT00L-MAT07L, for instance, of each memory unit are also activated. At this time, bit line selection signals YS0, YS64, YS128, YS192, YS256, YS320, YS384 and YS448 at high levels are simultaneously supplied from the Y-address decoder YD00 or YD01 to the sense amplifiers SA0 of the memory units MU00, MU02. Consequently, the corresponding 4 sets of 32 sets of complementary bit lines are selected from the memory mats MAT00L-MAT07L and connected to the main amplifier unit MAU0 via the corresponding sub-IO lines SIO0*-SIO3* and the main IO lines MIO0*-MIO3* constituting the main IO line groups MIOG0-MIOG7.

In the main amplifier unit MAU0, the 16 dynamic amplifiers DO-DF are simultaneously held in the operating condition as illustrated in FIG. 37. The read signals transmitted from the selected memory cells of the memory units MU00, MU02 via the four sets of main IO lines MIO0*-MIO3* constituting the respective main IO line groups are amplified by the corresponding dynamic amplifiers DO-DF, compared and collated by the connection logic with the adjoining two dynamic amplifiers as a unit, that is, on a 8-bit basis, the resulting signals as internal signals being transmitted to the test circuits T0, T1. Then these signals are compared and collated by the test circuits on a 32-bit basis and before being transmitted to the tertiary amplifier 3SA, the results thus obtained are applied as ternary level signals to the common data buses CD0*, CD1* and CD2*, CD3*. The test operation above is performed in the main amplifier unit MAU1 of the memory block MB1 likewise, whereby 128 bits of read data are exactly compared and collated.

The dynamic amplifiers used in this ×128-bit parallel test mode are formed with the CMOS latch amplifiers, which are capable of performing the amplifying operation at a relatively small operating current. For this reason, though the dynamic RAM in the ×128-bit parallel test mode is not operated at higher speed but operated with relatively small current consumption in comparison with a number of parallel bits, so that the peak current value is reducible accordingly. Moreover, the write operation in the ×128-bit parallel test mode is performed on a 128-bit basis by simultaneously holding the 8 write buffers WB0–WB7 provided in the main amplifier unit MAU0, MAU1 in the operating condition and further concurrently holding the write circuits of the main IO line selectors MSW0–MSWF in the operating condition.

As set forth in the embodiment above, the following effects can be achieved by applying the present invention to a semiconductor memory such as a large capacity dynamic RAM having a parallel test mode.

(1) The memory array is divided into the plurality of memory mats in directions in which the word lines and the bit lines extend and there are provided the sub-IO lines in parallel to the word lines corresponding to these memory mats, the bit lines of the corresponding memory mats being connected to the respective sub-IO lines. The main lines are arranged in parallel to the bit lines in common with the plurality of memory mats arranged in the direction in which the bit lines extend and the sub-IO lines are selectively connected to the main lines. This arrangment has the effect of making the number of parallel bits in the test mode expandable without being restricted by the number of sub-IO line to be correspondingly provided for the memory mats, that is, without increasing the number of sub-IO lines to be correspondingly provided for the memory mats.

(2) The itemized feature (1) above has the effect of making it possible to reduce the function of a large capacity dynamic RAM with efficiency.

(3) The itemized feature (1) above has the effect of making it possible to reduce the chip area of the dynamic RAM having the parallel bit test mode since the desired layout area on the periphery of the sense amplifier including the sub-IO line can be reduced.

(4) The itemized feature (1) above has the effect of making it possible to speed the cycle time of the dynamic RAM having a parallel test mode since not only the wiring length of the sub-I0 line but also the parasitic capacity thereof can be reduced.

(5) The itemized feature (1) above has the effect of making it possible to design the layout of the central part of a substrate of a LOC package since the main amplifier unit correspondingly provided for the main IO line can be laid out between the memory mats, the memory units or the memory blocks in parallel to the direction in which the word line extend.

(6) The itemized features (1) to (5) above have the effect of making it possible to design the layout of the sense amplifiers and the path gates by arranging the path gate for connecting the main IO line, the sub-IO line and main IO line on the boundary line side of the two memory mats adjacent to each other in the direction of the word line.

(7) The itemized features (1) to (6) above have the effect of making it possible to reduce current consumption in the ×128-bit parallel test mode and to suppress its peak value while maintaining the high-speed operation of the normal read mode and the ×32-bit parallel test mode by forming the main amplifier used in the normal read mode or the ×32-bit parallel test mode having relatively less parallel bits with the static current mirror amplifier which needs a relatively large operating current and by forming the main amplifier used in the ×128-bit parallel test mode having relatively more parallel bits with the dynamic CMOS latch amplifier which needs only a relatively small operating current.

(8) The itemized features (1) to (7) above have the effect of making it possible to stabilize the read operation of the dynamic RAM while making layout design with efficiency by providing the equalizing circuit corresponding each sub-IO line and by supplying the equalizing level via the common source line on the high potential side.

(9) The itemized feature (8) above has the effect of making it possible to speed the read operation of the dynamic RAM since the level of the common source line on the high potential side can be prevented from lowering at the time of connecting the sub-IO line and the main IO line by providing the equalizing circuit corresponding to the main IO line and by setting the equalizing level to the high level of the common source line on the high potential side.

(10) The itemized features (1) to (9) above have the effect of making it possible to reduce the number of manhours for testing while increasing the speed of dynamic RAM and reducing cost and power consumption.

Figure 38:
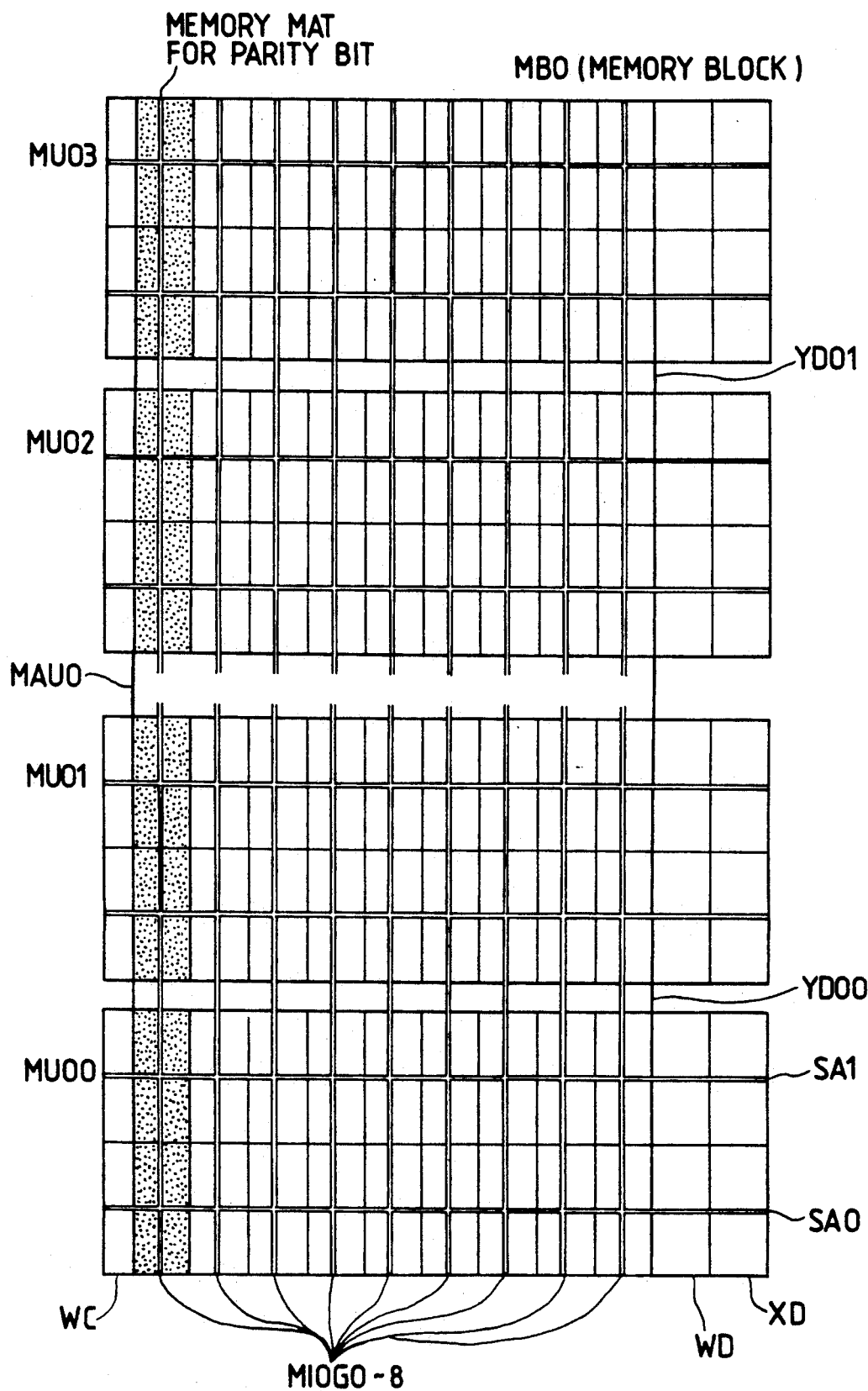
FIG. 38 is a layout drawing of another memory block in the dynamic RAM of FIG. 1.

A description has specifically been given of the exemplary embodiment of the present invention made by the present inventors. However, the present invention is not limited to the above-described embodiment and it is believed obvious that various changes and modifications may be made therein without departing from the spirit and scope thereof. In FIG. 1, for instance, the dynamic RAM may be provided with any given number of memory blocks and this is also the case with the memory units and main amplifier units provided in each memory block. A specific method of laying out these memory blocks, memory units and main amplifier units is not restricted by this embodiment. In FIGS. 2 and 3, the memory units MU00–MU03 may be provided with any given number of memory mats and any given number of main IO lines may also be provided for each corresponding memory mat. Although the main IO line is laid out close to the boundary line of two memory mats adjacent to each other in this embodiment, it may be arranged in the central part of the corresponding memory mat. As the bit configuration of the dynamic RAM can be set with the plurality of memory mats in the direction in which the bit lines extend as a unit in this case by making the selective operations of the main IO lines constituting each main IO line group independent of each other, a × 9-bit dynamic RAM including a parity bit as shown in FIG. 38, for instance, may readily be materialized.

In FIGS. 4 and 5, the number of main IO line selectors, static amplifiers, dynamic amplifiers and write buffers to be provided in each main amplifier unit is optional and so are the combinations of these circuit in each operation made or the test mode. As mentioned above, the selection of the main IO lines constituting each main IO line group may independently be made every main IO group and the specific layout method in the main amplifier unit can also be implemented in various forms. In FIG. 6, the arrangement of the peripheral circuit PC of the dynamic RAM is not restricted by this embodiment and any combination of address signals as well as any method of decoding them may be employed. Moreover, any bit configuration may be employed in the dynamic RAM and the bit configuration may be switched to, for instance, × 1-bit, × 4-bit and × 8-bit based on a common base chip. The polarity, the absolute value and the like of the supply voltage of the dynamic RAM may be embodied in various manners and the supply method is also optional.

In FIGS. 7 to 10, specific address allocation for the dynamic RAM is not restricted by this embodiment. Further, the refresh period of the dynamic RAM may be of a 4K refresh system and the bit allocation of the X- and Y-address signals may be set optionally, depending on the refresh system. In FIG. 11, the input signal for selectively setting the × 32-bit or × 128-bit parallel test mode may be applied from any other data input/output terminal or an external terminal other than the data input/output terminal. The multibit parallel test mode prepared for the dynamic RAM may be either × 32-bit or × 128-bit parallel test mode and any number of parallel bits may also be set.

In FIGS. 12 and 13, the number of word lines and complementary bit lines constituting each memory mat is optional and so is the selection method. Moreover, it is not prerequisite to employ the shared sense system for the sense amplifier SA0 and the specific circuit arrangement for the memory mat and the sense amplifier is also not restricted by this embodiment. In FIGS. 14 to 16, the specific circuit arrangement for the path gate PG00 and the layout method may be implemented in various forms. Moreover, the signal wiring of the dynamic RAM may be formed with a double or a greater-than-quadruple metal wiring layer and any wiring material may be used for these metal wiring layers.

In FIGS. 17 to 28, the block configuration of the dynamic amplifier and the unit D-type latch amplifier, the main IO line selector, the static amplifier, the test circuit, the tertiary amplifier, the data output buffer and the Y-address decode, the circuit arrangements and the output method of test results are variable in form. In FIGS. 29 to 37, moreover, the connection methods in each operating made and the test mode are optional. The combination of the start control signal and the internal control signal and the timing conditions are not restricted by these embodiments.

Although a description has mainly been given of the application of the present invention made by the present inventors to the dynamic RAM with the field of utilization as a background, the present invention is not limited to that use but applicable to various memory integrated circuits including multiport memories, image memories, static RAMs and the like, and logic integrated circuits such as gate array integrated circuits for mounting these memory integrated circuits with the dynamic RAM as a basis in configuration. The present invention is widely applicable to semiconductor memories at least provided with common data lines and parallel test modes and to digital integrated circuit devices including such semiconductor memories.

The memory array of the dynamic RAM provided with the parallel test mode is divided into the plurality of memory mats in the directions in which the word lines and the bit lines extend. There are provided the first common data lines which correspond to these memory mats and are disposed in parallel to the word lines, the bit lines of the corresponding memory mats being connected to the first common data lines. There are also provided the second common data lines which are disposed in parallel to the bit lines and are common to the plurality of memory mats arranged in the direction in which the bit lines extend, the designated first common data lines being selectively connected to the second common data lines. There are further provided the first main amplifier comprising the static current mirror amplifiers and necessitating a relative large operating current and the second main amplifier comprising the dynamic CMOS latch amplifiers and necessitating a relatively small operating current. These main amplifiers are put to proper use in accordance with the operating mode involved, whereby the desired number of bits in the test mode can be set without being restricted by the number of first common data lines. Therefore, the number of parallel bits in the multibit parallel test mode of the dynamic RAM is expandable while an increase in the chip area and power consumption is restrain. As a result, the number of manhours for testing the dynamic RAM is reducible while a reduction in not only cost but also power consumption is pursued.

What is claimed is:

1. A semiconductor memory comprising:
a plurality of memory mats each of which includes a plurality of word and bit lines disposed crosswise with respect to one another;
first common data lines each of which is provided to each memory mat so as to be disposed in parallel to corresponding word lines in the corresponding memory mat and each of which is selectively connected to a designated one of bit lines in the corresponding memory mat; and
a second common data line disposed in parallel to the bit lines of the memory mats and selectively connected to a designated one of the first common data lines.

2. A semiconductor memory according to claim 1, wherein a plurality of said memory mats are arranged in the direction in which the word lines extend such that the word lines are common to said plurality of memory mats, and wherein said second common data lines are provided in common with a plurality of memory mats arranged in the direction in which the bit lines extend.

3. A semiconductor memory according to claim 2, wherein a switch means which is selectively held ON according to a predetermined switch control signal is provided at an intersection point of said first and second common data lines.

4. A semiconductor memory according to claim 3, wherein each of said switch means comprises a pair of P-channel and N-channel MOSFETs in a parallel form.

5. A semiconductor memory according to claim 4, wherein said semiconductor memory is a dynamic RAM using a shared sense amplifier system, wherein two adjoining ones out of the plurality of memory mats arranged in the direction in which the bit lines extend commonly possess a sense amplifier, and wherein said second common data line and said switch means correspondingly provided for two adjoining ones out of the plurality of memory mats arranged in the direction in which the word lines extend are disposed close to a boundary line between the corresponding two memory mats.

6. A semiconductor memory according to claim 5, wherein each of said first and second common data lines comprises a plurality of common data line sets, and wherein said semiconductor memory is provided with a plurality of memory arrays, each being divided into said plurality of memory mats.

7. A semiconductor memory according to claim 6, wherein said semiconductor memory is provided with a plurality of main amplifiers disposed in a row in the direction in which the word lines are provided for each of a plurality of said second common data lines or correspondingly provided for the plurality of second common data lines.

8. A semiconductor memory according to claim 7, wherein each of said main amplifiers includes a first amplifier circuit whose operating current is relatively large and a second amplifier circuit whose operating current is relatively small.

9. A semiconductor memory according to claim 8, wherein said first amplifier circuit comprises a static current mirror amplifier, and wherein said second amplifier circuit comprises a dynamic CMOS latch amplifier having an output terminal is capable of connection logic coupling.

10. A semiconductor memory according to claim 9, wherein an input terminal of said first amplifier circuit is selectively connected to a plurality of corresponding second common data lines and to a plurality of adjoining second common data lines, and wherein an input terminal of said second amplifier circuit is constantly connected to said corresponding second common data lines.

11. A semiconductor memory according to claim 10, wherein said semiconductor memory is provided with a first multibit parallel test mode for comparing and collating multibit read data by simultaneously activating a plurality of said first amplifier circuits, and a second multibit parallel test mode for comparing and collating multibit read data by simultaneously activating a plurality of said second amplifier circuits.

12. A semiconductor memory according to claim 11, wherein the number of read data bits compared and collated in said second multibit parallel test mode is 2 power times the number of read data bits compared and collated in said first multibit parallel test mode.

13. A semiconductor memory according to claim 12, wherein said first and second multibit parallel test modes are selectively designated when a predetermined combination of logical levels of a start control signal and a predetermined input signal is established.

14. A semiconductor memory according to claim 13, wherein said semiconductor memory is provided with test circuits for effecting comparison and collation upon receipt of an output signal of a predetermined number of said first and second amplifier circuits in said first and second multibit parallel test modes.

15. A semiconductor memory according to claim 14, wherein the set number of first amplifier circuits is selectively activated at a time in the normal read mode.

16. A semiconductor memory according to claim 15, wherein the number of read data bits in the normal read mode is a multiple of 9 and includes a parity bit to be added bit by bit every 8 substantially effective storage data bits.

17. A semiconductor memory according to claim 16, wherein said semiconductor memory is provided with a plurality of metal wiring layers, and wherein the metal wiring layer forming said second common data line is formed under the metal wiring layer forming said first common data line.

18. A semiconductor memory according to claim 17, wherein said semiconductor memory is provided with pull-up and equalizing MOSFET correspondingly provided for said first common data line.

19. A semiconductor memory according to claim 18, wherein said semiconductor memory is provided with sense amplifiers to be selectively activated when a first or a second supply voltage is selectively supplied to a first or a second common source line, and wherein sources of said pull-up and equalizing MOSFET are coupled to said first common source line.

20. A semiconductor memory according to claim 19, wherein said pull-up MOSFET is selectively held OFF in the write mode.

21. A semiconductor memory according to claim 20, wherein said semiconductor memory is provided with equalizing MOSFET correspondingly provided for said second common data lines.

22. A semiconductor memory according to claim 21, wherein a source of said equalizing MOSFET is coupled to said first power supply and wherein the equalizing level of said second common data line is set at a level substantially equal to the high level of said first common source line.

23. A dynamic random access memory provided with a multibit parallel test mode for comparing and collating multibit read data in said semiconductor memory comprising:
a plurality of memory mats each of which includes a plurality of word and bit lines disposed crosswise with respect to one another;
first common data lines each of which is provided to each memory mat so as to be disposed in parallel to corresponding word lines in the corresponding memory mat and each of which is selectively connected to a designated one of bit lines in the corresponding memory mat; and
a second common data line disposed in parallel to the bit lines of the memory mats and selectively connected to a designated one of the first common data lines,
whereby the number of parallel bits in the multibit parallel test mode is expandable without being restricted by the number of first common data lines corresponding to each memory mat.

* * * * *